United States Patent [19]

Faustini

[11] 4,167,789
[45] Sep. 11, 1979

[54] ASYNCHRONOUS CIRCUIT AND SYSTEM

[75] Inventor: Carlo Faustini, Silver Spring, Md.

[73] Assignee: The Aiken Fund, Inc., Towson, Md.

[21] Appl. No.: 622,389

[22] Filed: Oct. 14, 1975

Related U.S. Application Data

[60] Division of Ser. No. 336,176, Feb. 27, 1973, abandoned, which is a division of Ser. No. 22,991, Mar. 26, 1970, Pat. No. 3,757,231, which is a continuation-in-part of Ser. No. 816,573, Apr. 16, 1969, abandoned.

[51] Int. Cl.² .............................................. G06F 1/00
[52] U.S. Cl. .................................................... 364/900
[58] Field of Search .................................... 340/172.5; 364/900 MS File

[56] References Cited
U.S. PATENT DOCUMENTS 3,166,737  1/1965  Sparacio ........................ 340/172.5
3,460,098  8/1969  DeBlauw ........................ 340/172.5

*Primary Examiner*—Raulfe B. Zache
*Attorney, Agent, or Firm*—Rose & Edell

[57] ABSTRACT

An asynchronous logic circuit is provided having three stable states, namely two information states and a neutral state. Information is transferred between cascaded such circuits wholly under the control of such circuits and at a rate determined by the delay times through various gates. Feedback is employed between each circuit so that for any two given circuits the transfer logic is IN→NI, I representing an information state and N representing the neutral state. Reversible cascaded chains are discussed as well as parallel feed-in and feed-out of information, and fan-in, fan-out and recirculating loops of information. The cascaded circuits (nets) employ interface circuits comprising in most instances a specified part of the basic net circuit.

12 Claims, 30 Drawing Figures

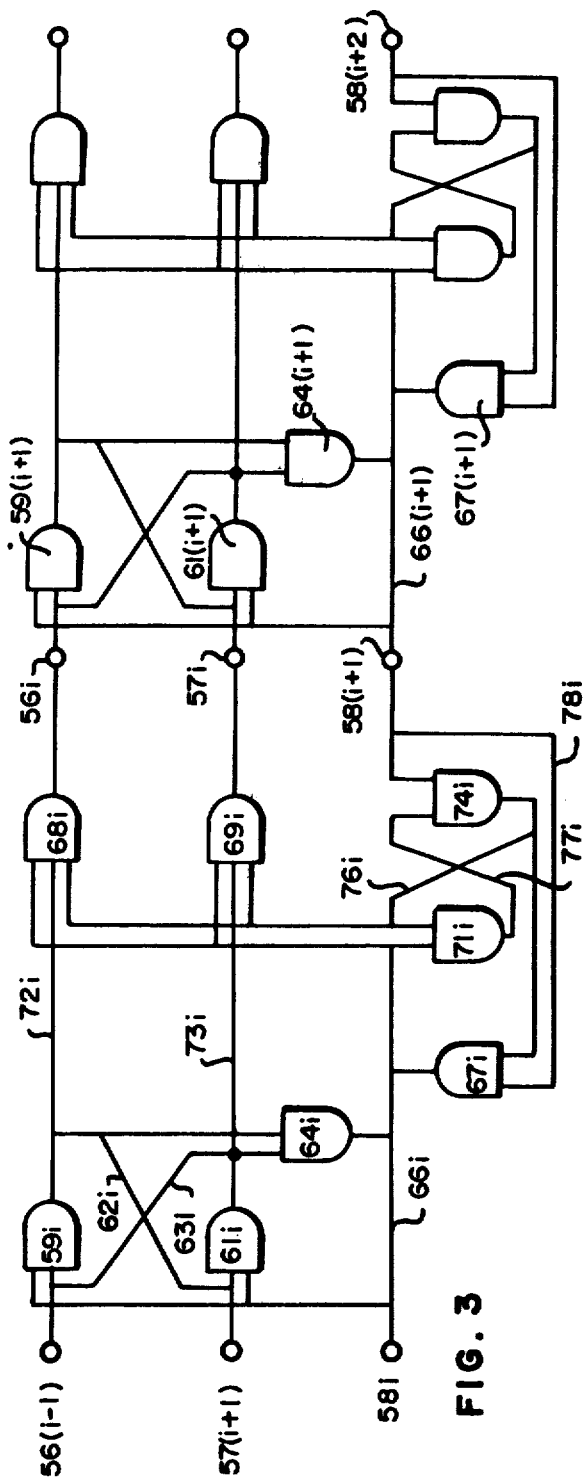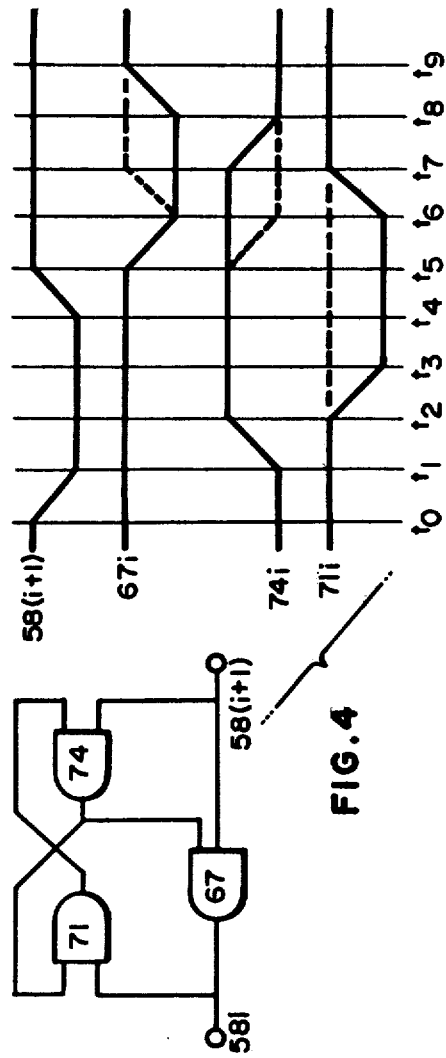
FIG. 3
FIG. 4

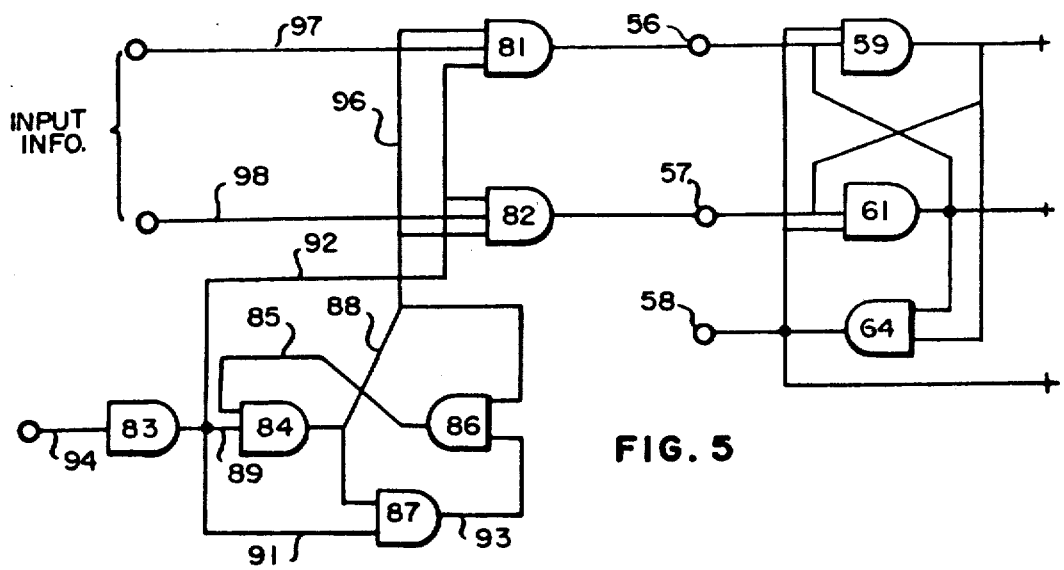
FIG. 5
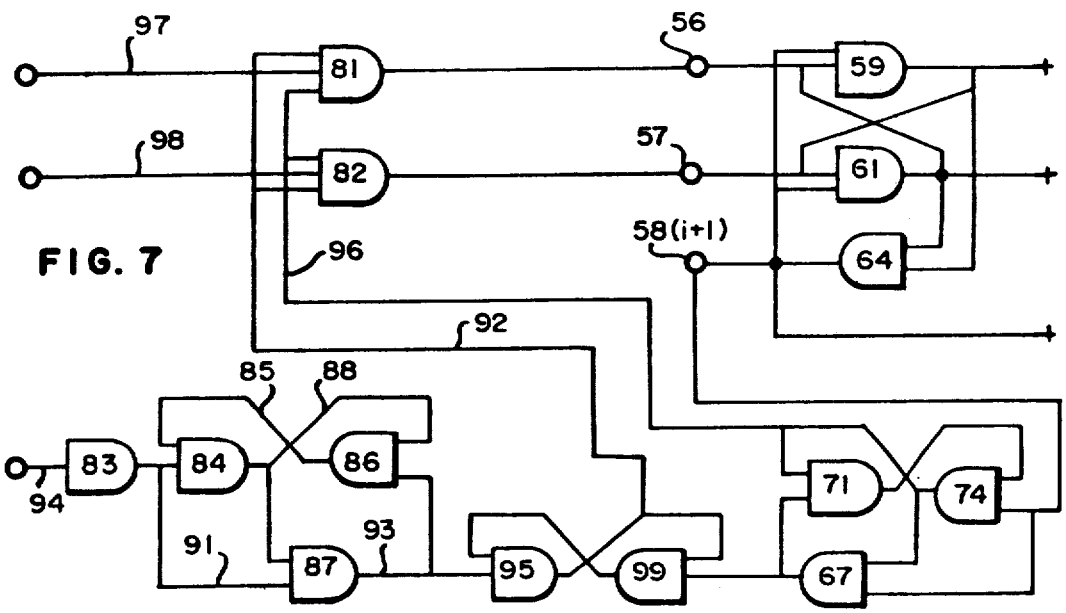
FIG. 7
FIG. 6
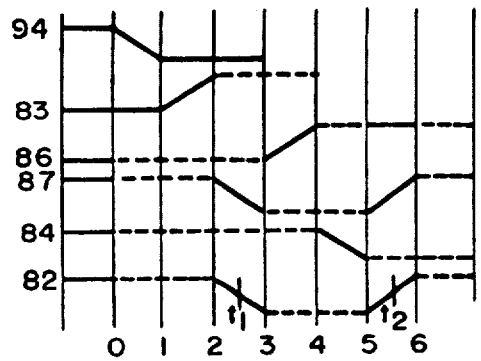

ASYNCHRONOUS CIRCUIT AND SYSTEM

CROSS REFERENCE

This is a division of application Ser. No. 336,176, filed Feb. 27, 1973 now abandoned; which is a division of application Ser. No. 22,991, filed Mar. 26, 1970, now U.S. Pat. No. 3,757,231; which was a continuation-in-part of application Ser. No. 816,573, filed Apr. 16, 1969, now abandoned.

BACKGROUND OF THE INVENTION

The present invention relates generally to asynchronous circuits and logic and more particularly to an asynchronous circuit employing a plurality of logic gates interconnected such as to insure a high degree of reliability in transfer and storage of digital information, and further relates to a family of logic systems employing said circuits; which systems may be readily interfaced with one or more external synchronous or asynchronous systems either in the parallel or serial mode of operation.

Asynchronous circuits and systems have been the subject of considerable investigation in recent years due to the theoretical increase in speed of operation which can be achieved with such circuits. The results of such investigations have been the subject of several publications and at least one patent. The results of previous work in this field by the present inventor formed the subject matter of his Master's Thesis at the University of Pennsylvania, August, 1964, entitled "Practical Asynchronous Circuits". One of the circuits disclosed in said Thesis is reproduced in FIG. 2 of the drawings accompanying this application and is described in detail relative to said Figure. As will become apparent from the description of FIG. 2, that circuit suffers from many of the defects and problems encountered in the work of others in this field, some of this work being described immediately below.

U.S. Pat. No. 3,378,776 to Goldberg et al describes a prior art asynchronous system wherein logic circuits are employed to transmit and store binary information. In this system, (hereinafter referred to as the "anti-parallel" system) there is provided a plurality of cascaded storage stages including storage elements and control circuits for controlling transfer of information from one stage to another in response to a gate pulse applied to the last stage of the cascade and transmitted on a stage-by-stage basis toward the first stage of the cascaded circuit. Information is stored as a binary 1 or binary 0 and upon the application of the gate pulse to the last stage, the information in that stage is transferred to a read-out circuit. After a short delay the gate pulse is regenerated and applied to the preceding stage so that information stored therein is transferred to the last stage and so on up the chain. Thus the control pulses proceed in a direction opposite to the direction of propagation of the information.

As in other prior art asynchronous devices difficulties arise due to pulse "races" both intrastage and interstage. This difficulty stems from time delays through various gates in a stage and the accumulated time delays in one stage relative to accumulated time delays in an adjacent stage. Each stage has a minimum recovery time between the time of application of a gate pulse and the time at which a new unit of information may be received; i.e., the circuit can respond to a second pulse gate. If a gate pulse is applied to a specific stage before the end of the minimum recovery time, the stage would not normally be able to respond, information would be lost and the gate pulse would not be transmitted to the preceding stage.

In response to occurrence of the above situation, a space symbol is automatically generated and introduced into the chain of information. The space symbol is a specified combination of voltage levels on the information leads and is different from the voltage levels for either the binary 1 or the binary 0. For instance, assume that the information circuit comprises two leads emanating from an information storage circuit. If a binary 1 is stored by the circuit, one lead has a binary 1 and the other lead has a binary 0 developed thereon. If a binary 0 is to be transmitted the above arrangement is reversed. If a space symbol is to be transmitted both leads have a binary 0 applied thereto.

By the use of the above arrangement it is possible to prevent loss of information but the speed of operation of the circuit is greatly reduced due to dispersion of the information along the stages. The reduction of speed of operation becomes increasingly severe as the circuits age since each circuit, in fact each gate in each circuit, is affected differently so far as time response is concerned, by the aging process. Thus as circuits age in an anti-parallel system the speed of operation declines steadily.

The anti-parallel system has a further disadvantage which is associated with the manner of control of transmission of information. Information is transmitted down the chain only in response to application of a gate pulse to the last stage from an external source. Thus the system is actually "clocked" be the read-out on external circuits and cannot operate at the inherent speed of asynchronous circuitry which ideally is faster than synchronous circuits. In consequence, much of the time advantage ascribed to such circuits is lost not only due to external clocking but also due to the fact that the asynchronous circuit cannot function (transfer information) until the read-out circuit is ready to receive information. It is thus not only possible but probable that an anti-parallel chain may remain devoid of information even though the circuit which is to feed information thereto is ready to supply information, and the chain is ready to receive information, only because the read-out circuit is not ready to receive new information.

Another asynchronous circuit of the prior art which is of interest is the circuit of Muller described in his article "Asynchronous Logics and Application to Information Processing", *Switching Theory in Space Technology*, 1963 Standford University Press.

Muller provides a true asynchronous circuit in that transmission of information down a cascaded chain of stages is primarily under the control of the stages themselves. Muller also employs circuits having three stages; a binary 1 state, a binary 0 state and a neutral state N. However Muller also has trouble with pulse "races" within each stage and between stages and in order to overcome such problems, Muller, as did the present inventor in his prior art circuit illustrated in FIG. 2, employs both feedback and feedforward control signals and prescribes certain rules for transmission of information as determined by the condition of any three adjacent stages. Specifically, Muller permits transfer of information only when the following combinations of states exist in three adjacent stages:

1. INN

2. NII where I is an information state (binary 1 or 0) and N is a neutral state.

When the first combination of states above is developed in the Muller device, a shift occurs to the INN combination, whereas the NII combination shifts to the NNI combination. No other combination of states permits a further transmission of information. Thus if four stages are considered having the following arrangement of information $I_1NNI_2$ the information $I_1$ proceeds to the second stage $I_1I_1NI_2$, but cannot progress further toward the stage storing $I_2$ until the information $I_2$ is removed from the last stage being considered above. If the last stage above is the last stage of the chain, then upon removal of the information $I_2$ from the last stage, the information $I_1$ is transmitted to the last stage through the next to the last stage. If the last stage above is in the middle of a chain, then the succeeding two stages must assume their neutral states before information $I_2$ can be transmitted.

Thus the aforesaid circuits, due to constraints placed on the system to avoid dangerous pulse races must sacrifice speed for accuracy. Further the gate logic is complex and therefore expensive.

With both the anti-parallel and the Muller circuits, difficulties and real complexities are encountered at the interfaces with other types of logic both relative to the input and output functions. Further parallel read-in and read-out and fan-in and fan-out can be realized only at such great cost and loss of speed of operation that the advantages expected to be achieved with asynchronous circuits are all but lost.

As will become apparent subsequently, the difficulties encountered with the circuits described above are also encountered with the circuit of FIG. 2 of the accompanying drawings.

It is an object of the present invention to provide an asynchronous circuit that is simple, inexpensive and which is substantially free of intrastage and interstage pulse races.

It is yet another object of the present invention to provide an asynchronous circuit and system employing cascaded asynchronous circuits in which intrastage and interstage races are inherently eliminated due to the fact that pulses which might otherwise produce races are always transmitted through different numbers of identical gates.

It is another object of the present invention to provide an asynchronous circuit which transfers information from stage-to-stage at a rate determined wholly by the internal timing of the circuits.

It is still another object of the present invention to provide a tristable asynchronous circuit and logic having binary information states and a neutral state in which the intercircuit logic is wholly defined by the interaction between any two adjacent stages.

Yet another object of the present invention is to provide a tristable asynchronous circuit and system wherein when any two adjacent stages have stored therein I and N in the first and second stages, respectively, information is immediately transferred such that the stages assume the pattern N and I respectively, regardless of the condition of any one or more other stages of the cascade of circuits.

It is another object of the present invention to provide cascade asynchronous stages in which information received at the first stage of the circuit is transmitted, at a rate determined wholly by the internal logic of the apparatus, to the first succeeding stage of the cascaded stages which is not storing information.

It is still another object of the present invention to provide an asynchronous circuit and system of cascaded stages which, when operated with synchronous systems having a clock pulse rate slower than the transmission rate of the asynchronous system, appears as an elastic memory since the cascaded asynchronous device appears to have a number of stages equal only to the number of units of information stored therein.

Still another object of the present invention is to provide an asynchronous circuit which may be readily fed information in serial or parallel and have information readily extracted in serial or parallel.

It is yet another object of the present invention to provide an asynchronous circuit and system which may be interfaced with external circuits by means of quite simple interface circuits.

It is another object of the present invention to provide a tristable asynchronous circuit which upon receipt of the information stored therein by a succeeding stage always resets itself to a neutral state and signals the preceding stage that it is available to receive additional information.

It is still another object of the present invention to provide an asynchronous circuit having a storage section, a gate (out) section and a control section, the latter of which is responsive to receipt of information by the succeeding stage to terminate transfer of information to the succeeding stage and one gate interval later to reset its stage to neutral so that it may now receive information from the preceding stage.

It is yet another object of the present invention to provide cascaded asynchronous stages in which the transmission rate of information is greater than the rate at which each stage can be completely cycled.

Still another object of the present invention is to provide cascaded asynchronous circuits which may transmit information in either the forward or reverse directions.

Another object of the present invention is to provide a novel adder circuit employing cascaded asynchronous circuits of the present invention.

Yet another object of the present invention is to provide a plurality of parallel cascaded asynchronous logic circuits which although asynchronous in operation are constrained to transmit information through certain stages of one chain in synchronism with the corresponding stages of the parallel chain or chains.

According to one preferred realization of the present invention there is provided an eight NAND gate circuit including a storage section, an output gate section and a control section. The storage section comprises three gates cross-coupled to provide a flip-flop like arrangement having to develope on two information lead signals, three stable states, 1-0 (I), 0-1 (I) and 1-1 (N). The gate section comprises two gates, each for gating out signals on a different one of the information leads. The output gates are controlled by the control section and a third gate of the storage section whose output lead is not one of the information leads.

The control section employs three gates, two of which are cross-coupled and in conjunction with the third gate provide a circuit which through part of an information transfer cycle is bistable and through another part of the cycle is monostable.

The third gate of the storage section senses the voltages on the output leads of the other two storage section gates and when the voltages on the information leads indicate the neutral state, such third gate signals the preceding stage that its stage is ready to receive information. When information is received by the stage, this third gate blocks further information transfer from the preceding stage and applies a gate to the output gates of its own stage. The output gates are not opened however until the succeeding stage transmits a signal indicating that it is in the neutral state and that it can receive information. At this point the control section of the stage opens the output gates of the stage and permits information to be transmitted. The succeeding stage, upon receiving such information, changes its signal to the stage under consideration whose control section then closes the output gates and resets the storage gates to the neutral state. The control section thereafter again opens the output gates when the signal from the succeeding stage signifies that such stage is in its neutral state, and therefore ready to receive new information.

An important feature of the operation described above is that each stage is reset to the neutral state between successive information states. The neutral state is a stable state in the device of the present invention and thus a stage is set to an information state only in response to positive recognition of the transfer of information from a preceding stage. The above procedure is in contradistinction to the prior art devices in which a preset time interval is provided between transmission of information signals and in which if the information in a prior stage has not changed during this interval the same information may be transmitted twice.

As a result of the operation of the present invention, each stage of the system is either isolated from or placed in communication with a preceding or succeeding stage in dependence only upon the internal state of each stage. As soon as an adjacent succeeding stage is ready to receive information, the information is made available regardless of the condition of the stage preceding the stage in question. Thus the cascaded circuit of the present invention may be treated in pairs of stages rather than in triplets of stages as in Muller, as in the present inventor's prior work.

Specifically, the transmission of information in the present invention follows as to any two stages, the pattern IN→NI throughout the length of the chain. In consequence information is transferred along the line of progression to the last stage which does not have information, completely independently of the operation of external circuits.

A further feature of the invention resides in the fact that parallel feed-in or feed-out of information may be readily achieved. As to parallel input, since the storage gates are the input elements of each stage, information may be applied directly to these gates without any problems. Also, since information stored in each stage is always available to external circuits, parallel read-out is easily accomplished.

Fan-in and fan-out of information are also simple tasks for the circuits. By employing interrelated interface devices, which, as will become apparent from the detailed description of the circuits, are quite simple, the cascaded stages may accept or gate out information in the alternative from or to two or more input or output circuits on a one-for-one or block-by-block basis. Thus the circuits find immediate use in multiplexing, de-multiplexing and adder functions.

Due to the interconnection of the three parts of each stage, information is transmitted through a stage in less than the overall cycle time of the stage. It was stated above that the stage gates have their input leads and output leads cross-coupled so that information applied to the storage gates is also applied at the same time to their output leads. Thus the only delay in transferring information is first through the third storage gate which opens the output gates (assuming the succeeding stage is ready to receive information) and then through the output gates to the next stage. Thus full transmission of a unit of information is accomplished in two gate delay intervals, or a few nanoseconds, even though the complete cycling of a stage takes somewhat longer due to delay in the feedback signal from the succeeding stage and resetting of the stage to neutral before the next unit of information can be accepted.

The pulse or signal race problem is greatly reduced if not eliminated in the present circuit and systems, since any group of events proceeding from the receipt of a sepcified signal are accomplished, although concurrently, through different numbers of gates. For instance, when a signal is received from a succeeding stage indicating that such stage has received information, the stage under consideration produces a pulse closing its output gates and resetting the storage gates to neutral. The closing of the output gates must occur before the resetting of the storage gates. In accordance with the control circuit, the gate-closing signal closes the gates after a one gate delay but the storage gates are reset only after a two gate delay, one gate in the control section and the storage gates themselves. The above procedure is followed throughout the circuits of the system and embodiments are disclosed which insure proper operation even in those instances where excessive differences in gate delays might be encountered due to excessive aging.

An additional feature of the invention resides in the control section of the circuits. The circuits of the control section, as a separate unit, has been found to be highly useful as an interface device for both read-in and read-out of information to or from the circuits as is described in detail subsequently. As previously indicated, the control section circuit operates as a flip-flop over a part of its cycle and as a monostable device over another part of its cycle of operation. As such, it may be set into one or another state when certain conditions exist in the circuit (when information is being inserted into the system but the circuits which are to accept readout are not ready) but operates as a self recycling device when readout has been accepted. In the interface situation this type of circuit is ideal because it can stabilize a system in one of two quiescent states but can cycle the system when a transient operation is required such as information transfer and subsequent termination of transfer and resetting of the storage gates to neutral.

As indicated above, the control section of the circuit of the present invention may be utilized as a separate entity apart from the circuit. Conversely the control section may be replaced for particular application to achieve special effects. In one such example, the real time adder of FIG. 21 employs a special control section to achieve a special data processing effect. In the case of the real time adder the special circuit is also autosynchronous.

The apparatus of the invention is capable, with minor modification, of transmitting information in one or the other direction in dependence upon external control signals and may operate as an asynchronous reversible shift register without losing any of the benefits of the basic circuit.

The embodiments of the invention initially set forth above have wide applicability to many systems only a few of which are described herein. Specifically the circuit may be employed as an elastic shift register, in a multiplexer or demultiplexer, for fan-in, fan-out and recirculating information loops and in parallel synchronized circuits as in an adder. In summary, the present invention provides an asynchronous circuit or circuits and systems employing the same, which are very fast, highly reliable and unusually versatile, may be readily interfaced with conventional digital circuits with little additional and uncomplicated sandardized circuitry, and which is devoid of most of the problems which have plagued prior art asynchronous devices.

An additional feature of the present invention is the use of specific NAND gates wired in a predetermined manner to produce a quasi-NOR function. More particularly, the output leads of two NAND gates are directly connected together so that if one of the gates has signals (1's) applied to all of its input leads the output signal of the combination of gates is determined (0) regardless of the condition of the input leads of the other NAND gate. The utilization of the above specific combination of gates permits elimination of buffering gates and the delay which attends addition of any gates to the circuit. Since high speed operation is an important feature of the invention, elimination of over one gate delay per stage is important.

BRIEF DESCRIPTION OF THE DRAWINGS

The above and still further objects, features and advantages of the present invention will become apparent upon consideration of the following detailed description of specific embodiments thereof, especially when taken in conjunction with the accompanying drawings, wherein:

FIG. 3 is the logic block diagram of a preferred embodiment of the circuit of the present invention;

FIG. 4 is the logic block diagram of the control section of the circuit of FIG. 3 and the timing diagrams applicable thereto;

FIG. 5 is a logic block diagram of a circuit employed to serially interface the input circuit of FIG. 3 with external circuits;

FIG. 6 is a timing diagram of the circuit of FIG. 5;

FIG. 7 is a logic block diagram of another form of said input interface circuit;

DESCRIPTION OF THE PREFERRED EMBODIMENTS

Figure 1:
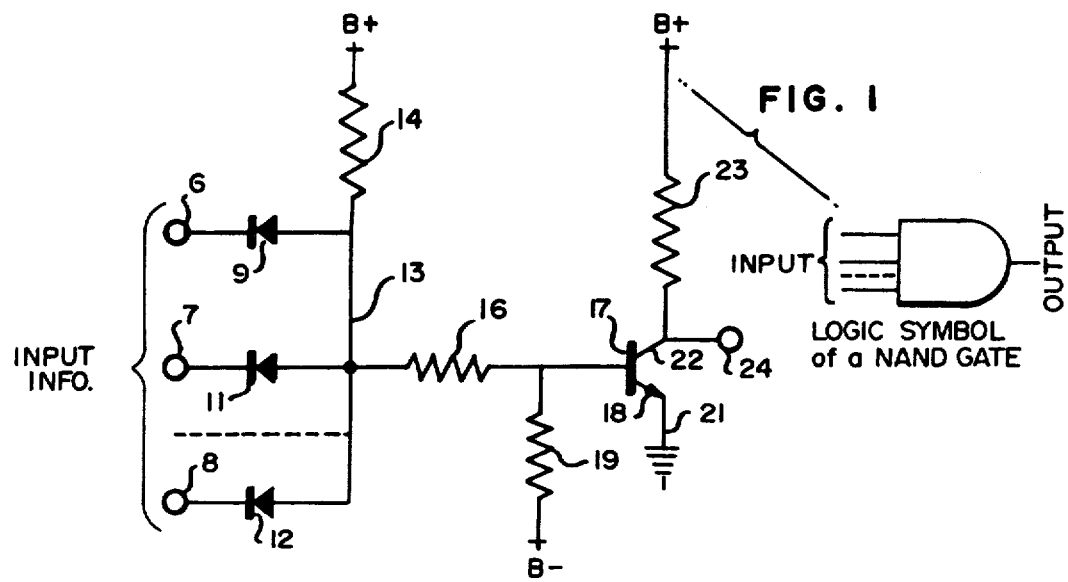
FIG. 1 is a circuit diagram of a NAND gate employed in the circuits of the present invention.

Referring now specifically to FIG. 1 of the accompanying drawings, there is illustrated a typical NAND gate which may be employed in realization of the apparatus of the present invention. For purposes of illustration only, the NAND gate is illustrated as having three input terminals 6, 7 and 8. Each of the terminals 6, 7 and 8 is connected through diodes 9, 11 and 12, respectively, to a common bus 13 which is connected to a high voltage source B+ through a resistor 14. The bus 13 is connected also through another resistor 16 to a base electrode 17 of an NPN transistor 18. The base electrode 17 of the transistor 18 is connected through a resistor 19 to a low voltage source indicated as B−. The transistor 18 has an emitter electrode 21 connected directly to ground and a collector electrode 22 connected through a resistor 23 to the B+ source. An output voltage is derived from the collector electrode 22 on an output terminal 24.

In the NAND gate illustrated, the diodes 9, 11 and 12 have their cathodes connected to the terminals 6, 7 and 8, so that the quiescent state is established when all of the input terminals have a positive voltage applied thereto. In this connection none of the diodes 9, 11 and 12 are conductive and a resistance divider network comprising the resistances 14, 16 and 19 determines the voltage applied to the base electrode 17 of the transistor 18. The relative values of the resistors 14, 16 and 19 are chosen such that the base electrode 17 render the NPN transistor 18 conductive, thereby causing a voltage drop across the resistor 23 and establishing a voltage on the output terminal 24 which is well below the value of B+. This state is hereinafter referred to as the "zero" state of the device. Alternately, it will be said that the output of the gage is a 0 or that a 0 signal appears at the output of the gate.

If now a zero voltage is applied to any one of the input terminals 6, 7 and 8, a conductive path is established from B+ through the resistor 14, the diode associated with the particular input terminal that receives the low voltage and through the source output impedance to ground. The path through the diode and output impedance of the source is lower than the impedance of the resistors 16 and 19, and the voltage on the bus 13 falls below its level when all of the diodes were blocked. The drop in voltage on the bus 13 reduces the voltage on the base electrode 17 of the transistor 18 and renders the transistor nonconductive. In consequence, the voltage on the output terminal 24 becomes essentially B+ voltage. This state is hereinafter referred to as the "one" state of the device. Alternately, it will be said that the output of the gate is a 1 or that a 1 signal appears at the output of the gate.

In summary, it can be seen that if positive voltages (1 signals) are applied to all of the input terminals 6 through 8, a low or zero voltage, i.e. a 0 signal, is established at the output terminal 24. If, however, one or more of the input terminals has a low voltage, i.e. a 0 signal, established on its input terminal, the voltage at the output terminal rises to approximately B+ voltage establishing a 1 signal on the output terminal.

An additional feature of the NAND gate illustrated in FIG. 1, is that the voltage on the output terminal 24 may be driven to the low voltage condition regardless of the voltage values on the input terminals by simply connecting the output terminal to a low voltage source. In this case, conduction from B+ through the resistor 23 and thence through the terminal 24 to the low voltage source, constrains or drops the voltage on the output terminal 24 to that of the low voltage source. This feature is employed subsequently in discussion of the remaining circuits of this application.

Figure 2:
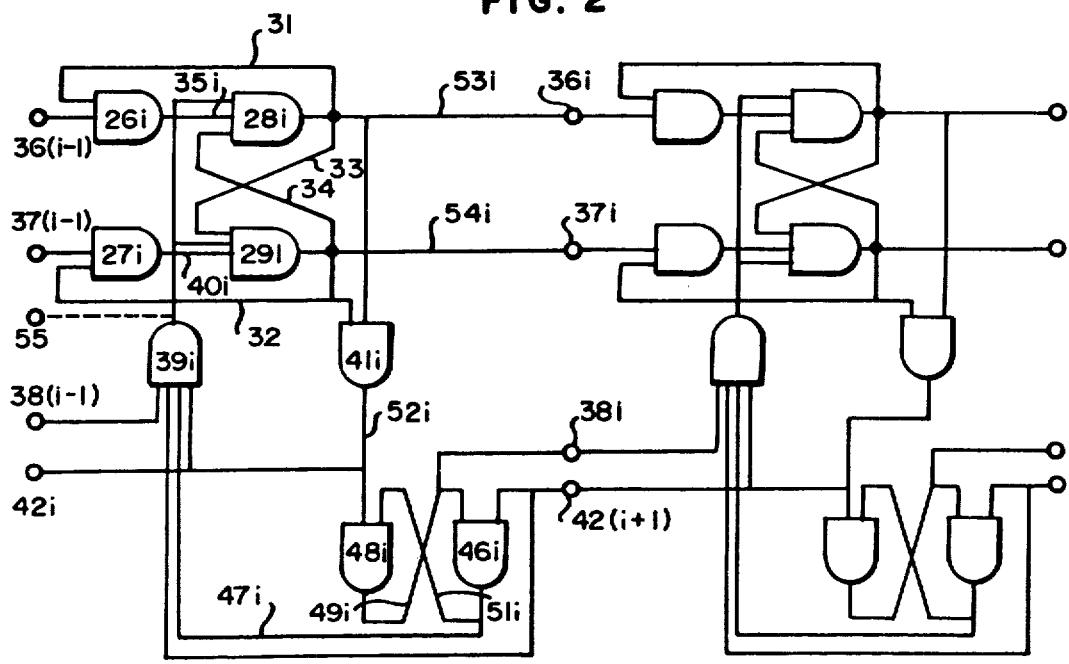
FIG. 2 is a logic block diagram of the prior art circuit of the present invention.

Referring now specifically to FIG. 2 of the accompanying drawings, there is illustrated a logic diagram of the prior art switching networks described in the inventor's aforesaid thesis. Actually two such networks are illustrated in FIG. 2 for purposes of description of operation. The numeric designations applied to the elements of the left network as illustrated in FIG. 2, carry the additional designation "i" to indicate these elements belong to the first stage of a chain of stages, whereas the corresponding and identical elements of the right network as illustrated in FIG. 2 carry the additional designation (i+1) and subscripts applying to preceding or subsequent gates in the chain carry the designations (i−1) and (i+2), respectively.

The networks of FIG. 2 comprise, and reference is initially only to the left net, a pair of input NAND gates (which will hereinafter be referred to simply as gates, since all gates employed herein are NAND gates) 26i and 27i. These input gates constitute the means whereby control is exercised as to when information available at the network inputs 36(i−1) and 37(i−1) is to be transferred to the storage elements 28i and 29i respectively. The information stored in the gate 28i is provided to an output terminal 53i of the net and correspondingly information stored in the gate 29i is provided to an output terminal 54i. Feedback between the gate 28i and the gate 26i on the one hand, and the gate 29i and the gate 27i on the other hand, which is accomplished via leads 31 and 32, respectively, produces a flip-flop action between each of the pairs of gates thusly providing the signals whereby input gates 26i and 27i control transfer of information from the net inputs 36(i−1) and 37(i−1) to the storage elements 28i and 29i respectively. The storage gates 28i and 29i are cross-coupled via leads 33 and 34 respectively, to also produce a flip-flop effect between these two gates. The input gates 26i and 27i are provided with information from an external source or an upstream net via the terminals 36(i−1) and 37(i−1) respectively. A feedback control signal from the succeeding net and a feedforward control signal from the preceding net are supplied to a control gate 39i of net i via terminals 42(i+1) and 38(i−1) respectively. Net i supplies a feedforward control signal to the succeeding net (i+1) from gate 48i via terminal 38i, and a feedback control signal to the preceding net (i−1) from gate 41i via terminal 42i which also supplies input control signals to gate 39i. Gate 39i has one additional source of input control from gate 46i via lead 47i. The output of gate 39i is connected to a third input of each of the gates 28i and 29i.

It will be noted that the terminal 42(i+1) also supplies one of two input signals to a gate 46i, a second signal applied to the gate 46i, being derived from gate 48i, cross-coupled with the gate 46i to provide a flip-flop; cross-coupling being affected by means of leads 49i and 51i. Finally, the output signal of the gate 41i is applied via a lead 52i and the second of two input leads to the gate 48i.

The right net of FIG. 2 is identical with the left net; input signals being derived on the input terminal 36i from output lead 53i of the gate 28i and on the input terminal 37i from the output lead 54i of gate 29i.

The nets each comprise input gates 26 and 27, storage gates 28 and 29, and control gates, comprising the gates 39, 41, 46 and 48. The gate 41 senses the output condition of each of the gates 28 and 29 such that if both gates are in the 1 state, gate 41 generates a 0 output voltage but if either of the gates 28 and 29 produce a 0, the gate 41 produces a 1 signal or is in the 1 state. As will become apparent subsequently, the nets are constrained to have only three output states. These states are a neutral condition of N state in which high voltages or 1 signals appear on both leads 53i and 54i, a 1 state in which the output lead 53i is 0 and the output 54i is 1, and a 0 state in which the lead 53i has the 1 signal thereon and the lead 54i has the 0 signal thereon. The 1 and 0 states of the apparatus define those states which are related specifically to information bearing signals. Either of these states will be referred to as a "valid information" state or as the I (for Information) state in contrast to the neutral or no-information bearing state N.

It will be further noted that each net has four output signals and four input signals. Specifically, the input signals are the signals applied to the terminals 36(i−1), 37(i−1), 38(i−1) and 42(i+1), whereas the output signals appear on the terminals 36i, 37i, 38i and 42i. The terminals 36 and 37 are information terminals while the terminals 38 and 42 are control terminals. A 1 signal on terminal 38i tells the succeeding net that net i is ready to transmit information and a 0 signal on terminal 42(i+1) tells the net i that net i+1 is ready to receive information. Both conditions must be met before information on terminals 36i and 37i can be transferred from net i to net i+1. Since the operations of the individual nets are obviously dependent upon the condition of a preceding and succeeding net, it is well to discuss the entire network in terms of a number of stages. It must be kept in mind that a given net may have several, actually five states, which relate not only to condition of the stored information but also the condition of the control signals as follows:

a. Net i is in state N (its neutral state if both information outputs 36i and 37i are 1 (net i ready to receive), and the control outputs are such that 42i is 0 (has not received valid information), and 38i is 1 (has no valid information to transmit);

b. Net i is in state $Q_0$ (net i is storing a 0 and net i+1 is not in state N and therefore is not ready to accept information) if the information output 37i is 0 and the control outputs 42i and 38i are both 1;

c. Net i is in state $Q_1$ (net is is storing a 1 and net i+1 is not in state N) if the information output 36i is 0 and the control outputs 42i and 38i are both 1;

d. Net i is in state $Q_2$ (net i is storing a 0 and either net i+1 is in state N or net i−1 did not return to its N state since the last time that net i was in state N, i.e. net i−1 has no new information to transmit and must prevent transmission so that the same information stored in net i−1 is not transmitted twice to net i) if the information output 37i is 0 and the control outputs are such that 42i is 1, 38i is 0;

e. Net i is in state $Q_3$ (net i is storing a 1 and either net i+1 is in state N or net i−1 did not return to its N state since the last time that net i was in state N) if the information output 36i is 0 and the control outputs are such that 42i is 1, 38i is 0.

In order to demonstrate that the nets are capable of transmitting information from one stage to another from the left to the right of FIG. 2, it is necessary to prove that the following cases are true;

a. If net i is in its neutral state N, it must be capable of accepting information from net i−1, independent of the status of net i+1.

b. If net i is in state $Q_0$ ($Q_1$), it shall remain in this state if its control feedback input 42(i+1) is 1, (stage i+1 is in state I and cannot accept information); it shall go to state $Q_2$ ($Q_3$), if 42(i+1) is 0 (stage i+1 is ready to receive), independent of the state of net i−1.

c. If net i is in state $Q_2$ ($Q_3$), it shall remain in this state if either of its control inputs 42(i+1) or 38(i−1) is 0, it shall return to state N if both 42(i+1) or 38(i−1) are 1's, the 1 on 42(i+1) indicating that net i+1 has accepted information and the 1 on 38(i−1) indicating that net i−1 has returned to state N since the last time net i received information. This latter case means that net i−1 after transmitting information to net i returned to the N state and now has new information whether it be N, 0 or 1.

In order to illustrate that the above three stated conditions, which are in actuality five stated conditions when $Q_0$ and $Q_1$ on the one hand, and $Q_2$ and $Q_3$ on the other, are considered as separate conditions, may be realized in the apparatus of FIG. 2, the three conditions are considered independently. Indeed, to define the functions necessary for operation of the nets, an analysis of the actual operation of the circuit both in its steady state and transient conditions is undertaken to prove that information may be transmitted down the chain in a time interval which is determined by the response times of the nets.

Initially, the net i is considered to be in its neutral state. According to the definition of N state, 36i and 37i are both 1's and 42i is 0, so that the output signal of gate 39 is a 1. Gates 26i, 27i, 28i and 29i are then open to their respective inputs 36(i−1), 37(i−1), 35i and 40i respectively. Specifically since all but one of the input signals to each of these gates is a 1 the signal applied to the remaining lead will determine the output signal of the gate. The output signal of gate 48i is 1, whereas the output signal of gate 46i may be a 0 or a 1 depending on whether 42(i+1) is a 1 or a 0. Notice that the logic status of the lead 47i has no effect on the status of the net as long as the terminal 42i is 0.

The net i will remain in this state as long as 36(i−1) and 37(i−1) are both 1's (i.e. net i−1 is also in state N) independent of the status of net i+1.

As soon as terminal 37(i−1), for instance, becomes a 0, the following sequence of events occurs:

I. The output signal of gate 27i becomes a 1.
II. The output signal of gate 29i becomes a 0, and
III. The output signal of gate 41i becomes a 1.

Assume that the feedback control input 42(i+1) was a 1 (i.e. net i+1 was in state I) prior to the end of the described sequence. It is seen that in this case the output signal of gate 46i was 0 and the output signal of gate 48i appearing on terminal 38i was a 1 before the signal on 42i becomes a 1, so that no other changes in the status of net i can occur at the end of the above sequence, as long as 42(i+1) stays a 1. Therefore, net i would assume its $Q_0$ state at the end of this sequence.

For reliable operation it is required that the duration of the signal at the information input 37(i−1) be greater than the combined transition periods of the gates 27i and 29i.

Net i is now in state $Q_0$.

As soon as 42(i+1) becomes a 0 (net i+1 goes into state N) the following events occur:

IV. The output signal of gate 46i becomes a 1.
V. The output signal of gate 48i becomes a 0, and at this time net i assumes its $Q_2$ state.

For the sake of completeness, consider the case when 42(i+1) was a 0 and the output signal of gate 46i was a 1 before the occurrence of event III above. It is seen that in this case event IV would have occurred without delay and that event V would follow immediately after event III.

Net i is now in state $Q_2$.

As long as either the feedback control input 42(i+1) or the feedforward control input 38(i−1) remain 0 (net i+1 is still in its N state or net i−1 did not return to its N state since the last time the net i was in its N state) after event V no other changes occur in net i. As soon as both 42(i+1) and 38(i−1) become 1, the following events will occur:

VI. The output signal of gate 39i becomes a 0.
VII. The output signals of gates 28i and 29i become both 1's, thus opening gates 26i and 27i to the signals on their respective input terminals 36(i−1) and 37(i−1),
VIII. The output signal of gate 41i becomes a 0, and
IX. The output signals of gates 39i and 48i become 1's, at which time net i assumes again its N state.

In order for the net i to switch from state $Q_2$ to the state N the terminal 38(i−1) must become 1 at the proper time. That terminal 38(i−1) does operate in the proper way can be demonstrated by analyzing the behavior of the terminal 38i with respect to net i+1. Suppose net i+1 just assumed its $Q_o$ state. We notice that net i must be in state $Q_2$ (with 38i a 0) as it can be seen by the sequence of events I through V. As soon as net i returns to state N, 42i becomes a 0, thus causing gate 48i to produce a 1 output signal on lead 49i which is connected to terminal 38i.

There are a number of problems with the nets illustrated in FIG. 2, one of the primary problems being that of interfacing the apparatus with external devices. In order to feed information serially into the nets from an external source, initially at least, the first stage of any series of nets must be in the N or neutral state. In order to ensure that the apparatus is in the neutral state, the gate 39i must produce a zero output signal in order to ensure that the signals at the terminals 36i and 37i are both ones. In order for a zero to appear on the output lead of the gate 39i all of the input leads must be ones. As a practical matter, since the states of the various nets downstream of the first net are going through various sequence of operations, it is not possible to ensure that at any given moment the output of the gate 39i will be a zero, i.e. all of the input leads will have ones thereon. Therefore it has been proposed to provide a further input lead 55 to which the external circuitry will apply a zero voltage immediately prior to each application of information to the terminals 36(i−1) and 37(i−1). Even then, however, difficulty is presented in control of the terminal 38(i−1) since without proper control on this terminal the information present at the input leads of the first net at some period during its operation could be transmitted twice to the net.

The reason for the above is as follows: If the first net i of FIG. 2 is storing a unit of information, that is, is in state I and net i+1 is in state N, then the output signals of both gates 41i and 46i are 1's and thus two of the input signals to the gate 39i are 1's. For this moment, it is considered that the terminal 38(i−1) is not controlled (floats) and therefore has no effect upon the gate. If now the signal on terminal 42(i+1) becomes a 1, then all of the effective inputs to gate 39i are 1's and thus its output becomes a 0. The storage gates 28i and 29i are set to the N state, i.e. both their outputs become 1's, and thus the input gates 26i and 27i are open to the input terminals 36(i−1) and 37(i−1) respectively. Immediately after, the output of gate 41i becomes 0, and then the output of gate 39i becomes 1, thus opening the storage gates 28i and 29i. At this point, the first net i will accept and store whatever information is present at its input terminals 36(i−1) and 37(i−1), even though such information may be the previously received, old information. Once such information is accepted again by net i, it would be transmitted to the other nets downstream in the net series thus causing an unrecognizable duplication of the same unit of information.

Thus in order to ensure proper operation of the apparatus, a 0 signal must be applied to the lead 38(i−1) in response to the lead 42i switching from 0 to 1 at the appropriate time in the sequence of operation. By applying a 0 to the terminal 38(i−1) the output lead from the gate 39i is held in the 1 condition and the gates 28i and 29i remain locked in their present I state. For proper operation, new information should be applied to the input terminals 36(i−1) and 37(i−1) and then a 1 signal should be applied again to the control terminal 38(i−1).

The severity of the interface problem is now apparent. Four separate signals must be applied to each net, two of them being the information signals and the other two the control signals. The input device must be capable of responding to the signal on terminal 42i by properly controlling not only the information presented at the input terminals 36(i−1) and 37(i−1) but also the control signal 38(i−1).

Additional disadvantages of the net of FIG. 2 reside in the fact that nine interface wires per stage are required if, in addition to the capability of serially transferring information, each net should be able to be "cleared" (i.e. set to the N state) by such external means as the aforementioned terminal 55. This is an awkward arrangement which is desirable to avoid. Further, the delicate timing between operations of various of the gates (as discussed fully in the aforesaid thesis) requires very careful selection of components in fabricating the device. Aging of the device with consequent changes in time of various functions may produce malfunctions at a later date. Another disadvantage of the net of FIG. 2 resides in the fact that parallel loading of the nets of a total series of nets is a very difficult affair as can be seen from the analysis of FIG. 2. To see how difficult an affair this really is, first it is noticed that if a 0 signal were to be applied to terminal 36i for a sufficiently long time, net i would be set to the 1 state regardless of its previous state, whereas net i+1 would be set also to the 1 state of its previous state were either 1 or N, otherwise it would remain in the 0 state. Thus, the final state of net n+1 would not be uniquely determined by such external input signal. Next, it is assumed that all stages exist in the N state when parallel loading is effected by some means or another. It is assumed further that net i assumes a state I before net n+1 assumes a state I, so that as a result terminal 38i assumes the value 0 when parallel loading is terminated. In this case (net i+1 is in either its $Q_2$ or $Q_3$ state), it is easy to see that net n+1 can again assume its N state only after and if net i assumes its N state first. Thus, either the information stored in net i is lost or a "blocking" situation has been created whereby no serial transfer of information ahead of net n+1 can occur at all. This shows that not only each stage must be set to the proper storage state, but also each of the flip-flops formed by gates 46 and 48 of each net must be set to the proper state during the parallel loading operation. The conclusion is that to insert information serially into the first net of any chain is somewhat difficult, but the problem becomes multiplied many times when it is desired to insert information into all of the nets concurrently in a parallel mode of operation.

A further difficulty in the system of FIG. 2 is that the nets actually have only four stable states, those corresponding to the storage of a 0 or a 1. The neutral state is basically an unstable state. Specifically, a net is switched out of the neutral state upon the presentation of information thereto. As a result, if for any reason the control on the lead 38(i−1), that is, on the feedforward control of the first net of a series of nets, is not operated at the proper time or hangs up for any reason, every one of the nets down the chain will store the same information as is stored in the first net and a continuous series of this information is sent out to whatever device is downstream of the series of nets.

Many of the statements above apply with equal validity to the other prior art devices previously discussed, for instance, the neutral state is unstable, parallel loading is very difficult and expensive in hardware, signal "races" are a problem, the speed is relatively slow, the logic is complex and the number of wires between stages is excessive. Also the cascaded stage must be treated (analyzed) on a three stage rather than a two stage basis and thus free exchange between a stage with information or the next succeeding stage that is neutral does not necessarily occur because of dependence on a prior stage.

Referring now specifically to FIG. 3 of the accompanying drawings, there is illustrated a net of the present invention which overcomes most, if not all, of the aforesaid difficulties with the prior art nets. The timing functions are far simpler and the neutral state of the device is a stable state so that hang-up problems encountered with prior nets are not a factor; i.e. information transfer occurs on a two stage basis as follows IN→NI regardless of all other factors in the chain.

Using the same notation that was employed relative to FIG. 2, the net of the present invention has three input terminals $56(i-1)$ and $57(i-1)$ and $58(i+1)$. The terminals $56(i-1)$ and $57(i-1)$ are information input terminals and the terminal $58(i+1)$ is a feedback terminal; a feedforward terminal as such is not employed in the net. The terminals $56(i-1)$ and $57(i-1)$ are connected to NAND gates $59i$ and $61i$ which have their output leads cross-coupled to the input leads of the opposite gate via leads $62i$ and $63i$ respectively.

The output signals of the gates $59i$ and $61i$ are also applied to a gate $64i$ having its output signal applied to a lead $66i$ which is connected to the feedback output terminal $58i$ and the other input leads of gates $59i$ and $61i$ so that each of the three gates $59i$, $61i$ and $64i$ has its output lead cross-coupled to the input leads of the other two gates in such a manner as to form a three-way flip-flop. The lead $66i$ is also connected to the output lead of a gate $67i$ and to input leads of gates $68i$, $69i$ and $71i$. The gates $68i$ and $69i$ are the output gates of the apparatus. One of the inputs of gate $68i$ is connected to the output of gate $59i$ via lead $72i$, whereas one of the inputs of gate $69i$ is connected to the output of gate $61i$ via lead $73i$.

The gate $71i$ is cross-coupled with a further gate $74i$ to provide a flip-flop, cross-coupling being effected by lead $76i$ connected to the output of gate $74i$ and one of the inputs of gate $71i$ and another lead $77i$ connected between an input of gate $74i$ and the output of gate $71i$. Feedback signals from the net $i+1$ are applied to a terminal $58(i+1)$ and to a second input connection to the gate $74i$ and via a lead $78i$ to a second input of gate $67i$. The output lead $76i$ of gate $74i$ is also connected as an input lead to each of the gates $67i$, $68i$ and $69i$.

The information states for net i are defined with reference to the output leads $72i$, $73i$ and $66i$ of three-way flip-flop according to the following table:

| State | 72i | 73i | 66i |
|---|---|---|---|
| N | 1 | 1 | 0 |
| 0 | 1 | 0 | 1 |
| 1 | 0 | 1 | 1 |

The operation of the apparatus of FIG. 3 is described by reference to Table I below, wherein the left column describes the condition of the net i at various periods during its operation and the designations of the top of the table, $66i$, $77i$, $76i$ and $78i$, are columns indicating the condition of the signals on those particular leads during the operation of the net. Numerals 0 and 1 are underlined to indicate forcing signals, that is, controlling signals; the numerals 0 and 1 which are not underlined indicate conditions obtained in other parts of the circuit as a result of the forcing signals.

TABLE I

| State of NET i | 66i | 77i | 76i | 78i | State of NET i+1 |
|---|---|---|---|---|---|
| N | 0 | 1 | 0 | 1 | I |
| I | 1 | 1 | 0 | 1 | I |
| I | 1 | 0 | 1 | 0 | N |
| I | 1 | 0 | 1 | 1 | I |
| N | 0 | 1 | 0 | 1 | I |
| N | 0 | 1 | 1 | 0 | N |

Initially it is assumed that 1's are applied to both of the input terminals $56(i-1)$ and $57(i-1)$ and a 0 is developed on the lead $66i$ and thus on the terminal $58i$, indicating that the first stage is in a neutral state and is ready to receive information. It is assumed for purposes of this explanation that the net $i+1$ has stored information and therefore is in state I. Thus a 1 is applied to the terminal $58(i+1)$ and is developed on the lead $78i$. The 1 signals applied to the leads $56(i-1)$ and $57(i-1)$ are cross-coupled to the two inputs of the gate $64i$ via leads $63i$ and $62i$ respectively, so that the gates $64i$ develops a 0 on the output lead $66i$.

Under the above conditions 1's appear on both of the leads $72i$ and $73i$ while the 0 on the lead $66i$ (this signal overriding, as previously explained, the 1 from gate $67i$) is applied to the gates $68i$ and $69i$, thus preventing any transfer of information from net i to net $i+1$ and so that 1 signals appear at the terminals $56i$ and $57i$ indicating to the net $i+1$ that the first net i is in the neutral state. The above conditions are stable and are illustrated in line 1 of Table I.

If now one of the signals on the leads $56(i-1)$ or $57(i-1)$ is changed to a 0 to indicate a 0 or a 1 state (it being immaterial to subsequent explanation which signal appears), one of the input signals of gate $64i$ is a 0 and the lead $66i$ develops a 1 thereon. It is assumed that the net $i+1$ is still in the I state and therefore the signals on the leads $77i$ and $76i$ do not change, the 0 signal on lead $76i$ ensuring that the output signals 1 from the gates $67i$, $68i$, $69i$ and $71i$ remain 1's. The above condition is stable and is illustrated in line 2 of the Table I.

If now the signal on the lead $58(i+1)$ changes to a 0, the net $i+1$ is now in the N state and is ready to receive information, regardless of all else, the signal on the lead $66i$ remains a 1 due to the 0 input signal from the lead $78i$ and either lead $62i$ or $63i$. The output signal from the gate $74i$, however, changes to a 1 and is applied to the lead $76i$, all as illustrated in line 3 of Table I. The gates $68i$ and $69i$ are now opened and transmit the information stored in the gates $59i$ and $61i$ to the output terminals $56i$ and $57i$. Specifically, if a 0 had been applied to the lead $56(i-1)$ and a 1 had been applied to the lead $57(i-1)$ (a 0 information state), the lead $72i$ has a 1 developed thereon and the lead $73i$ has a 0 developed thereon. All of the input leads to the gate $68i$ now have 1's applied thereto so that the output terminal $56i$ has a 0 developed thereon. The lead $73i$, having a 0 thereon, produces a 1 output signal from the gate $69i$ which appears on the lead $57i$. Thus the information is transmitted to the net $i+1$ which at this point is in the same condition as the net i was at the beginning of this discussion, that is, in the neutral state with the signals on its various leads as indicated in the first line of Table I.

Having now received information the net $i+1$ develops a 1 signal on the terminal $58(i+1)$ (see line 4 of Table I). Specifically, since the signals applied to the gate $64(i+1)$ are now a 1 and a 0 the output lead $66(i+1)$ from this gate has a 1 developed thereon, and also, as will be clear later, the output of gate 67(i+1) is a 1. This condition is illustrated in the fourth line of the Table I and it is seen that the leads 76i and 78i both have 1's developed thereon. This condition causes the gate 67i to produce a 0 output of the fifth line, illustrated in Table I, is developed; that is, the output signal of the gate 67i becomes a 0 and the net i returns to the neutral state which, as indicated in the fifth line of the Table I, causes all elements to assume their original states as illustrated in the first line of the Table I. It will be noted that the transition from the states of line 4 to line 5 of the Table I is self cycling which will be discussed in greater detail relative to FIG. 4.

One further case should be considered; that is, where initially net i is in the neutral state N and net i+1 is in the I state and then net i+1 becomes neutral with net i remaining unchanged. This initial condition is illustrated in the fifth line and the final condition in the sixth line of Table I. When the state of net i+1 becomes neutral but there has been no change in the input information to net i, then the only change that occurs in net i is that the lead 76i becomes a 1. This is the flip-flop action of the control section previously referred to. This change, in effect, partially opens the gates 68i and 69i and makes no other changes in the net, since said gates are still held closed by the 0 on lead 66i. In consequence, as soon as information is applied to the terminals 56(i−1) and 57(i−1) and the output gates 64i becomes a 1, this information is also transmitted to net i+1. Other than as outlined above, the change of state of net i+1 has no effect on net i when the latter is in the neutral state. More importantly, no transmission of information from net i to net i+1 occurs at all when net i is in the N state, regardless of the state of net i+1.

Before proceeding to a discussion of interfacing of the nets of the invention with each other or more conventional circuits, consideration should be given to the internal timing of the nets since this factor must be considered when designing the timing required of the interfaces employed. The internal timing of the circuit of an individual net of FIG. 3 is equal to the transit time through six gates. Considering the time interval starting from the time the information is initially applied to the terminals 56(i−1) and 57(i−1), and assuming both net i and net i+1 to be in the neutral state, the internal timing is the sum of the time through the gates 64i, 68i (or 69i), 64(i+1), 67i, 71i, and 74i. However, transmission of information down a chain is even faster. Specifically, if it is assumed that a chain is open all the way down its length, that is, all the stages are in their neutral state, and information is applied at the terminals 56(i−1) and 57(i−1) of the first stage, then information is transmitted down the chain at the rate of two gate delays only. Specifically, the information on the terminals 56(i−1) and 57(i−1) immediately appears on leads 72i and 73i, and after the output of gate 64i becomes a 1, it is transmitted through gate 68i (or 69i) and it appears at the inputs of the stage i+1 after only these two gate delays. Thus only two gate delays per stage are involved in the actual transmission of a single bit of information down the chain. The resetting and elimination of previously stored information utilizes the other four gate intervals.

It is apparent that no serious races occur in the apparatus. In all instances, adequate time is provided for each function (each operation of a gate) to be completed before a gate is called upon to respond to a new signal, i.e. perform another function. For instance, when a valid bit of information (a 0 or a 1) is transferred from net i to net i+1, the latter assumes the proper stable state well before the feedback signal generated at the terminal 58(i+1) clears net i (sets net i to the N state) by means of gates 67i and 61i (or 59i) and removes the valid information from the input terminals of stage i+1 by means of gates 67i and 68i (or 69i). Also, stage i assumes the N stage well before the "clear" action forced by a 0 output from gate 67i is terminated by the "one-shot" operation which ensues in the gate loop 67i-71i-74i-67i whenever the logic value of terminal 58(i+1) changes from a 0 to a 1. Specifically "races" are eliminated because the two signals applied to any gate transverse path having different numbers of gates.

Again, it should be emphasized that no information transfer from net i to net i+1 occurs when net i is in the N state, regardless of the state of net n+1. As a matter of fact, a transfer operation is initiated only when net i is in the I state and net i+1 is in the N state. The transfer operation that ensues is such that, upon its termination, stage i has assumed the N state and stage i+1 has assumed the I state previously held by net i, that is, net i and net i+1 have exchanged their previously held states; IN→NI.

This pair-wise behavior is very important and is one of the most basic, distinguished and unique features of the present nets. When the chain is storing all N's, insertion of information in any stage causes the IN→NI function to traverse the entire chain downstream of the point of insertion of information.

There are several additional features of the apparatus of FIG. 3 and, more particularly, of the interrelationship of two or more nets that should be made completely clear and which are quite important to an understanding of the advantages of the system. It will be noted that information is gated out of a net i upon the appearance of an appropriate signal, a 0 at its terminal 58(i+1). If this particular net is the last net or stage in a string of stages, then application of a 0 to the terminal 58(i+1) of such last stage gates the information out of the chain, and a following aplication of 1 to the same terminal "pulls" new information from the preceding stage of the chain into such last stage. Thus the last stage of the net may be readily interfaced with a synchronous system since clock pulses from such a system may readily be applied to the terminal 58(i+1). The appearance of the neutral state at the last stage may be employed by the downstream synchronous circuits to indicate a lack of information.

At the other end of the chain of stages the same condition prevails, more particularly, information may be inserted whenever the terminal 58i of that stage indicates that the stage is ready to accept information. Interface circuits are illustrated in subsequent drawings for the input of information to the chain, since certain other factors must be considered. However, from the point of view of timing, the only consideration is the fact that information may be inserted into the chain whenever a 0 signal appears on the terminal 58i. If the net of the present invention operates at a speed higher than that at which input information is presented, then, assuming that the input and output devices are themselves synchronous, the apparatus of the present invention will always accept the information at the rate at which it is presented.

Considering now the transfer of information between the stages and the timing involved, such transfer is completely internally controlled. Specifically, a first stage passes information to a second stage when the first stage has the information and the second stage indicates it is ready to accept such information. Ability of the second stage to accept information is a function of the stage downstream from the second stage having taken the information previously in the second stage and so on down the chain. Thus the internal operation of the apparatus is wholly asynchronous even though the apparatus is readily interfaced both at its input and output ends with synchronous devices which may be operating simultaneously with different phases and, for "short" time intervals, rates. The only constraint on the system is that the average output rate be equal to the average input rate of information. As far as instantaneous rates are concerned, the only requirement is that whenever the input rate temporarily exceeds the output rate, for any time interval, the excess of the input rate over the output rate should be equal to or smaller than the number of stages in the N state available in the chain. In the case that the output rate temporarily exceeds the input rate, no erroneous operation ensues if proper advantage is taken of the fact that the last stage of the chain will output only non-valid, N-state-type outputs after the information contained in the chain has been depleted. The apparatus of the present invention will appear as an elastic memory in any such system. Specifically, the apparatus accepts information up to its maximum storage capacity and transmit this information to an output device. Similarly, it accepts information at a rate which is well below its maximum storage capacity but appears to the output device exactly the same as it did when it was storing at its maximum capacity since input information proceeds immediately at a two gate delay per stage (a few nanoseconds) to the last stage of the chain or the last stage in stage N. Thus the completely asynchronous operation of the apparatus causes the system to appear to expand and contract so far as the output device is concerned, as required by the quantity of information being transmitted. At the input end, the apparatus appears an an infinite memory.

Additional features of the apparatus of FIG. 3 which are discussed in detail below are that it may readily receive information in parallel or transmit it out in parallel and that fan-in and fan-out and loop operations are readily realized without any large complement of additional circuitry.

It is thus seen that the network arrangement of the present invention and the systems envisioned thereby far exceed the flexibility and capability of the systems of the prior art; the best prior art apparatus known to the inventor being illustrated in FIG. 2 of the accompanying drawings. The ease of interface, parallel read-in and read-out, of fan-in and fan-out and loop operations of the apparatus of FIG. 3, relative to the apparatus of FIG. 2, is believed to be readily apparent even at this stage of the writing, and will become increasingly apparent upon presentation of additional circuits.

As will become apparent subsequently, the circuit comprising essentially the gates 67, 71 and 74 has uses apart from the overall net and is employed to perform various functions in circuits of the present invention particularly involving interfacing with external circuits. Therefore, the operation of the circuit comprising these three gates is considered separately in the timing diagram of FIG. 4.

Referring specifically to FIG. 4, in addition to the schematic diagram the figure comprises four graphs, the uppermost graph indicating the voltage appearing at various time intervals on the terminal $58(i+1)$ of the first net of FIG. 3. The second graph indicates the voltage appearing on the output lead of the gate 67 and the third and fourth graphs indicate the voltages appearing in the output leads of the gates 74 and 71 respectively. These graphs take into account the time intervals required for any signal to change from one voltage level to the other. Such time tntervals include the combined effects of triggering level, initial delay and response speed of each gate, and are shown to be the same for all gates and for both level changes. This is somewhat of an over-simplification, but is greatly eases understanding of the circuit operations, while still being sufficiently acurate for the present purposes. Reference to FIG. 4 indicates steady-state conditions existing prior to $t_0$, after $t_9$ and during the interval from $t_3$ to $t_4$. Transient conditions are shown to exist during the intervals from $t_0$ to $t_3$ and from $t_4$ to $t_9$.

The steady-steady situation existing during the interval from $t_3$ to $t_4$ is the easier one to describe. In this case, a 0 has been applied to terminal $58(i+1)$ for a sufficiently long time so as to cause the outputs of both gates 67 and 74 to assume 1 signals, and for these latter signals, in turn, to cause the output of gate 71 to become a 0, and thus for the circuit to assume steady-state conditions (namely, a situation such that input/output relations are satisfied for each of the NAND gates comprised by the circuit).

The steady-state situation existing prior to time $t_0$ (and after $t_9$) is somewhat harder to describe since the 1 signal applied to terminal $58(i+1)$ by itself is not sufficient to determine the output value of gates 67 and 74 and, in turn, of gate 71. Therefore, some assumptions must be made and their validity must be verified. First, the assumption is made that the output of gate 74 is a 1. Then, it follows that the output of gate 67 must be a 0 since both its input signals are 1. Gate 71, in turn, having a 0 on one of its input leads, must have a 1 output. Thus, both inputs of gate 74 are 1 and, therefore, its output must be a 0, but this is in contradiction with the assumption made that such an output be a 1. Next, the assumption is made that the output of gate 74 is a 0. Then, it follows that the output of both gates 71 and 67 must be 1. Thus, the inputs of gate 74 are both 1 and, therefore, its output must be a 0, and this agrees with the assumption made.

The following remarks regarding steady-stage conditions of the circuit are worthy of notice. The first remark concerns the characteristics of the circuit itself and it points out two facts, one being that the output of gate 67 is always 1 regardless of whether the circuit input terminal $58(i+1)$ is a 0 or a 1, and the other fact being that the inputs of gate 74 have both the same value, i.e. they are both 0 or both 1. A second remark is about the uses that can be made of such a circuit. Reference to FIG. 4 shows that a 1 applied to terminal $(58(i+1)$ serves to indicate that the downstream net is not ready to accept information in the application of FIG. 3, or, in any other given system, that the downstream device, whatever its nature, does not wish information to be transmitted. In this case, the output of gate 74 is 0 and, in the operation of the nets of FIG. 3, is used to block transmission of information by the gates 68 and 69. The opposite situation occurs whenever a 0 is applied to the same terminal $58(i+1)$, namely, in this case the downstream device wishes information to be transmitted, the output of gate 74 is a 1 and, in the application of the nets of FIG. 3, such output signal would permit transmission of information to take place. Of course, another condition must be satisfied for transmission to actually take place, e.g. in the application of the nets of FIG. 3, the upstream net must have valid information to transmit, i.e. it must not be in the N state.

The transient situations in the circuit are described next. With reference to FIG. 4, starting at time $t_0$ and ending at time $t_1$ the voltage on the terminal $58(i+1)$ goes to 0, indicating that a transfer function is to be effected. Thus, a 0 signal is applied to the input of the gate 74 and at the time $t_2$ the output voltage of the gate 74 goes to 1. In the circuit of FIG. 3, of course, the signal 1 appearing on the output of the gate 74 opens the gates 68 and 69. In addition, since the gate 67 has a 1 output signal and a 1 now appears on the output of the gate 74, the gate 71 now has two 1's applied to its input circuits and the output of the gate 71 falls to 0. This occurs at time $t_3$ and nothing further happens at this point. At some subsequent time, say starting at time $t_4$ and ending at time $t_5$, the voltage on the terminal $58(i+1)$ rises to 1. The 1 now appearing on the terminal 58 causes two 1's to be applied to the gate 67 which at time $t_6$ produces a 0 output voltage. The 0 output voltage from the gate 67 causes the gate 71 to produce a 1 signal on its output lead at time $t_7$. The 1 appearing on the output lead of the gate 71 causes the gate 74 to have a 1 applied to both input leads and thus its output lead falls to 0 at time $t_8$. When the output lead of the gate 74 falls to 0, a 0 is applied to an input lead at both of the gates 67 and 71. But since the gate 71 already has a 0 on the other input lead this fact has no effect on gate 71. However, the 0 now applied to the input lead of the gate 67 causes the gate 67 to produce a 1 at time $t_9$. This last signal has no effect on gate 71 since gate 71 has already a 0 on the other input lead. Thus no further changes in any of the gates comprised in the circuit can take place and initial conditions are re-established.

Other signals may be applied in specific uses of the circuit, to other portions of the circuit subsystem comprising gates 67, 71 and 74 to cause operations to occur in a different sequence. Such uses of the circuit are found in various circuits subsequently illustrated and described. However, the essential operation of all of the circuits is as described relative to FIG. 4.

In conclusion, it is well to note the fact that as a result of the signal on lead $58(i+1)$ changing from a 0 to a 1, the output of gate 67 changes from a 1 to a 0 and back again to a 1. Thus, a negative pulse, three gate delay times wide at the mid-points of its transactions, was generated in response to a simple voltage level change from a 0 to a 1 at the input terminal $58(i+1)$ of the circuit. That is to say, the circuit displays a very valuable pulse-forming or one-shot type action in response to dc type signals. This fact is quite important in that it allows combinatorial type (or level, or dc-type) logic to perform memory-like functions without recourse to double-storage techniques (essentially use of two flip-flops per information bit) as is common practice. Furthermore, in the application to the nets of FIG. 3, this memory-like function is accomplished within the scope of the feedback control signals (i.e. proper reception of information of the downstream net) and with ample margin of safety and yet within a remarkably short time interval.

Referring now specifically to FIG. 5 of the accompanying drawings, there is illustrated an input interface circuit for introducing serial information into a net of FIG. 3. There is one danger inherent in inserting information from a synchronous circuit into an asynchronous circuit and this basically is that there must be provided guarantees against transmitting the same information twice, or more specifically, transferring a given unit of information from the interface circuit into the synchronous circuit as two or more distinct units of information. In consequence, constraints are placed on the length of time that the information is available to the asynchronous net. First of all, the information must subsist in the interface circuit for a sufficient length of time to guarantee transfer of that information to the asynchronous net. This constraint is easily met since the nets of the present invention operate in a time which is several times shorter than that required by comparable conventional devices. Second, the information must be removed from the input leads to the asynchronous net after a sufficiently short period of time to ensure that the asynchronous net is not looking for a second piece of information while the first piece of information is still present in the interface circuit. This constraint is met using one of the several adaptations of the control circuit of FIG. 4 employed for interfacing, thus avoiding undue constraints on the external source.

Referring to FIG. 5, the portions of the net of the present invention which are illustrated in FIG. 5 bear the same reference numerals as they do in FIG. 3. In addition, there is illustrated a circuit which comprises initially a pair of gates 81 and 82 employed to control transmission of information from an external circuit to the input gates 59 and 61 of the first stage of the chain of nets of the present invention. Control of passage of information through the gates 81 and 82 is effected by a series of four gates 83, 84 86 and 87, the latter three gates corresponding to gates 74, 71 and 67 of FIG. 4. The gates 84 and 86 are cross-coupled via leads 85 and 88. A second input lead to the gate 84 is connected via lead 89 to the output circuit of the gate 83. The output circuit of the gate 83 is also connected via leads 91 and 92 to input circuits to the gate 87 and the gates 81 and 82. The output lead 88 of the gate 84 is also connected to an input of the gate 87, while an output lead 93 from the gate 87 is connected as a second input lead to the gate 86. A lead 96 also connects the output of gate 84 to input circuits of gates 81 and 82.

The operation of this circuit is probably best understood by reference to the timing diagrams of FIG. 6 and considering similarities with the circuit and timing diagrams of FIG. 4. The graph designated by numeral 94 refers to the input control signal appearing on input lead 94 to the gate 83. The timing diagrams relative to each of the gates indicates the response at the output lead of the gate with several factors taken into account as a simple delay through the gates in a manner similar to that used for FIG. 4. It is assumed that the delay of operation of the various gates in this interface network are the same on the average as the delay in the operation of the gates in the nets of the present invention, the gates all being NAND gates and of the same construction.

Initially the lead 94 has a 1 signal applied thereto from the external information source, indicating that the source has no information to transmit to the nets of the present invention. The output lead from the gate 83 thus has a 0 thereon and the gates 81 and 82 are thus constrained to have 1's developed on their output leads and thus a neutral state is generated at the output of the interface. Since 0's are applied at the input leads to both of gates 84 and 87, they generate 1's at their outputs. Thus the gate 86 has a 1 applied to both of its input leads and produces a 0 at its output circuit as illustrated in the graph of FIG. 6.

The system has now received input information which it is wished to gate to the following net. The information appears at the input leads 97 and 98 of gates 81 and 82, as two opposite voltage values, i.e. one of them being a 0 and the other being a 1. A 0 appears on lead 97 of gate 81 when the information has value 1; a 0 appears on lead 98 of gate 82 when the information has value 0. The control signal on the lead 94 is then changed to a zero indicating that the external circuit is ready to transfer information to the net of the present invention. This situation is indicated by the negative going part of line 94 of the graph of FIG. 6. After an appropriate time delay which is a function of the gate 83, the voltage on its output lead rises to a 1. This 1 level appears on the lead 92 while lead 96 also has a 1 level since the output of gate 84 is also kept at the 1 level by the 0 output of gate 86. Thus the gates 81 and 82 are opened and produce on their output terminals 56 and 57 information corresponding to that applied to the input terminals by the source. Specifically assuming the information to be a 1, the gate 81 has a 0 applied to its input terminal 97 and therefore its output signal is a 1. The gate 82 has a 1 applied to its input terminal 98 and this, in conjunction with the 1's appearong on the leads 92 and 96, produces a 0 at its output terminal 57 which is indicated in FIG. 6 by the negative going wave of the line indicated by the numeral 82. Thus the information which appears at the input terminals to the gates 81 and 82 is gated to the gates 59 and 61 of the input net of the apparatus of the present invention.

As it has been shown previously for the timing of FIG. 4, with reference to FIG. 6, after the output of gate 83 has assumed its 1 level, the following sequence of events occur: the output of gate 87 becomes a 0, the output of gate 86 becomes a 1, the output of gate 84 becomes a 0, the output of gate 87 becomes a 1 again. At the time when the output of gate 84 becomes a 0 gates 81 and 82 are closed and thus any further flow of information to the nets of the present invention is stopped.

At a later time the gate signal appearing on lead 94 returns to its 1 state and all of the gates assume the condition illustrated at the beginning of the graphs of FIG. 6.

As previously indicated, in considering the performance of any circuit relative to feeding the nets of the present invention, the input information must be applied to the net for a sufficient length of time to ensure that the net acquires the information but must be terminated sufficiently quickly so that the net does not acquire the information twice under any set of operating circumstances. Also, as previously indicated, it takes a net of the present invention about two gate intervals to reliably acquire new information and it takes six gate intervals for information to be acquired and transmitted by a net and for the net to be reset to the N state, which is the condition to again accept new information.

Referring to the timing diagrams of FIG. 6, it can be seen that, assuming a gate acquires information when its signal has reached its half switching point, the information is gated through the gate 82 at a time designated on the graph by $t_1$ and subsists for an interval ending at time $t_2$. If the speed of operation of the gates 84, 86 and 87 is substantially the same as the gates 59 and 61, then it is apparent that the signal is applied to these latter gates for an interval equal to three gate intervals. The total time from the appearance to the termination of a signal is therefore well within the required margin of safety. A "safer" circuit, using feedback from the first net of the present invention, terminal 58, to the control gates 84, 86 and 87, will be shown later.

It should be noted that the gate 83 serves only a single function in the diagram of FIG. 5. Specifically it converts the negative input control signal on the lead 94 to a positive signal. Thus if the input control signal is a positive going signal, gate 83 may be eliminated and then the total delay required to transfer the input information into the first net is reduced by one gate switching time.

The above description of the input circuit of FIG. 5 indicates that the circuit is useful particularly when information from the apparatus feeding the net of the invention becomes available prior to or no later than one gate delay after the appearance of a negative going control signal. However, it may be that the control signal occurs prior to the arrival of new information. In this case, several gate pairs may be added in cascade in front of gate 83 in order to obtain the required delay, so that gates 81 and 82 are not open before the information is available at the input leads 97 and 98. If, in addition to occurring prior to the information arrival, the control signal is also positive-going, then an odd number of gates must be used in front of gate 83. As it was noted earlier, in regard to the function of gate 83, these additional gates do not change the length of the time interval during which information is gated into the net of the present invention.

As another alternate, an inverting gate may be inserted directly between the lead 93 and the input circuits of the gates 81 and 82 with this lead constituting now the only input to these gates in addition to the information leads. In this instance, the delay or gate delays introduced between the appearance of the pulse on lead 94 and the gating of a signal through the gates 81 ànd 82 is three gate intervals, the gate 83, the added gate just discussed and the gate 87. Duration of the gating interval remains unchanged as three gate delay times.

The above description makes it apparent that although a single standard type of input circuit may not be employed, the basic control network (gates 84, 86 and 87) is the same and additional control elements or gates may be introduced to produce the proper timing or provide the proper timing interface between the external and internal circuitry.

If the assumption of equal delays through the gates of the input interface circuit and through the gates of the net of the present invention should become unrealistic, an alternate circuit configuration, employing feedback from the net, is shown on FIG. 7. Reference to FIG. 7 shows that the new circuit has been derived from that of FIG. 5 with the addition of another circuit similar to that of FIG. 4 and two more gates, gates 95 and 99, which are cross-coupled to form a flip-flop. The Figure also uses the same notations as FIG. 5 and FIG. 4, the only changes being as follows—output lead 93 of gate 87 is now connected to the inputs of both gates 86 and gate 95 of the flip-flop. The output of gate 67 of the circuit similar to that of FIG. 4 is connected to the inputs of both gates 71 and 99 of the flip-flop. The output lead of gate 95 is cross-coupled to the input of gate 99 and is also connected to the inputs of gates 81 and 82, thus replacing the output lead 91 of gate 83 of FIG. 5 in the function of controlling information transfer. The output lead of gate 99 is connected only to the input of gate 95. The output of gate 74, in addition to being connected to the inputs of gates 67 and 71 as in FIG. 4, is also connected to the input lead 96 of gates 81 and 82 thus replacing the output lead 88 of gate 84 in the function of controlling information transfer. Thus, it is seen that information transfer is controlled by both the external source and the net of the present invention, although not directly.

The operation of the overall circuit of FIG. 7 is now described briefly, since the detailed operation of the individual circuits has been described already in detail. When lead 94 goes to 0, indicating that new information is available, the output of gate 95, after a three gate delay, goes to 1, thus partially opening gates 81 and 82. If terminal 58$i$ of the net is a 0, indicating that the net is ready to receive new information, lead 96 is a 1 and thus gates 81 and 82 are fully open and transmission of information begins. As soon as lead 58$i$ goes to 1, indicating that the net is receiving information, after a three gate delay, both leads 92 and 96 go to 0, thus terminating transmission. It is worthy of notice that this timing is well within safe limits and that no new transmission of information can occur until lead 94 first goes to 1 and then back to 0 so as to cause lead from gate 99 to go back to a 1 and thus again partially open gates 81 and 82.

Several variations of the circuit of FIG. 7 are possible, one of them could be adding an inverting gate between the terminal 58$i$ and lead 96, and eliminating the connection between the output of gate 74 and lead 96. The effect of this change would be to terminate information transfer two gate delay times sooner than with the previous connection.

In the case where the net of the invention controls transfer of information thereto, elements must again be employed that ensure that the information is not transferred twice. However, and reference is now made to the circuit of FIG. 8 of the accompanying drawings, in considering input systems under control of the net, the particular circuit employed depends upon whether or not the system supplying information to the net is such that new information is guaranteed to appear on information leads, such as 101 and 102 of FIG. 8, when the net is ready to accept the information. Where the input circuit can be guaranteed to meet this condition, a simple circuit, which is basically the same as the control circuit of FIG. 4 may be employed. In this system, illustrated in FIG. 8, the input information gates 81 and 82 of the external control circuit are driven directly from terminal 58 of the net through an inverter gate 103. The terminal 58 is also connected to a control section 104 comprising the interconnected gates 84, 86 and 87. The negative pulse now appearing on lead 93 is employed by the external source as a shift pulse which, after the information currently on leads 101 and 102 has been supplied to the gates 59 and 61, shifts new information to the leads 101 and 102. Thus in operation, when the gate 64 indicates that the net is in the neutral state, that is a 0 appears at the terminal 58, a 1 appears at the inputs of gates 81 and 82 due to the action of the gate or inverter 103 and information on the leads 101 and 102 is gated to the net. Concurrently, after a delay determined by the gate 87 and the gates to which the lead 93 is applied, new information is gated to the leads 101 and 102 so that when the net is again ready to accept information, the information is available on the leads 101 and 102.

Figure 8:
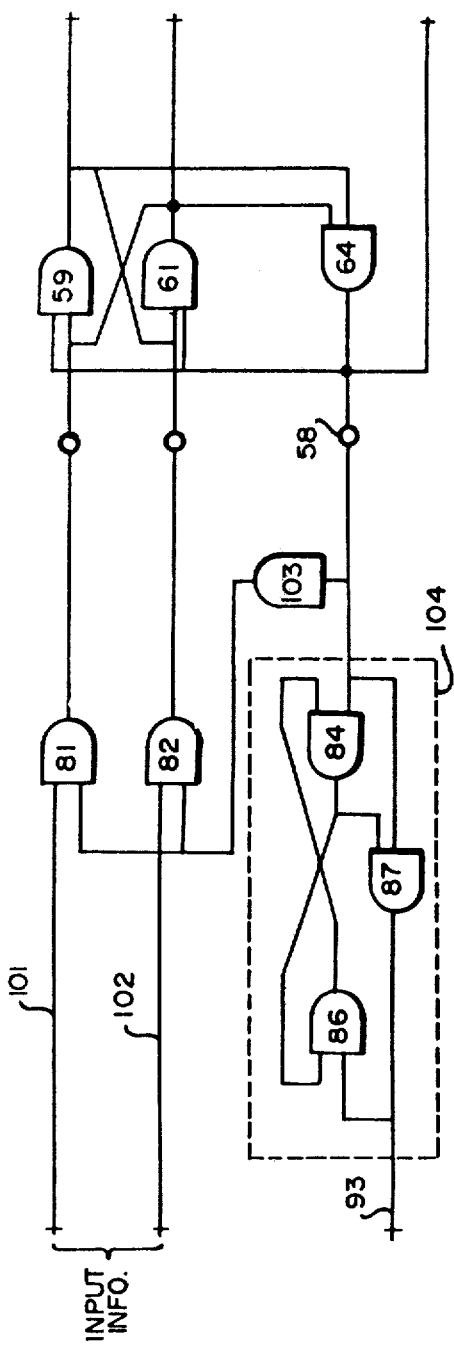
FIG. 8 illustrates a logic block diagram of a simplified serial input interface circuit.
Figure 9:
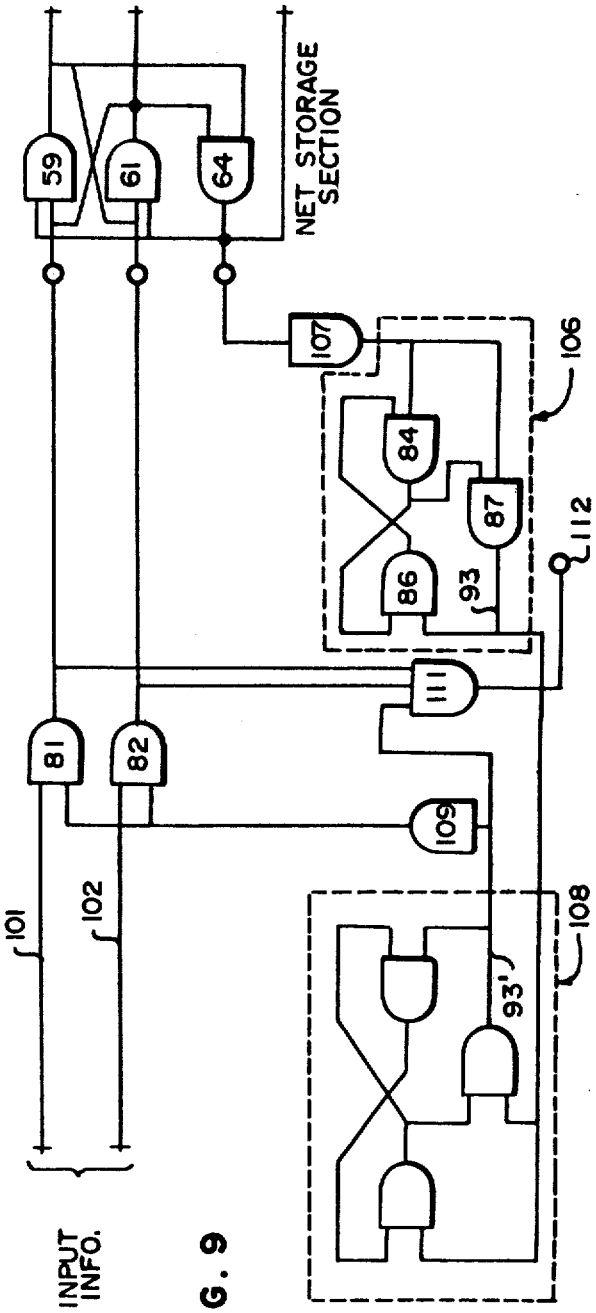
FIG. 9 illustrates a further serial input interface circuit.

If the input circuit or if the system with which the net is to be interfaced cannot guarantee that information is available at the end of the shift pulse, at which time, with the arrangement of FIG. 8, the net is ready to accept it, then a circuit such as illustrated in FIG. 9 may be employed. In this circuit a control circuit 106 constituting the gates 84, 86 and 87, is fed from terminal 58 through an inverter gate 107. Output lead 93 of the control circuit 106 feeds a second control circuit 108 constituting the same three gate arrangement with the output lead 93 of the control circuit 108, applying the gating pulses to the gates 81 and 82 via a further inverter gate 109. In this circuit a negative shift pulse may be derived from the lead 93 of the control circuit 106, so that the delay between the appearance of the shift pulse and of the gating pulse is about three gate delays. If necessary, a longer pulse may be derived from a further gate 111. This gate is connected as a three input gate having one input circuit connected to the output lead 93 of the control circuit 108 with one of each of the other two leads connected to a different one of the output circuits 81 and 82. There is available on output lead 112 of the gate 111, a six gate delay positive pulse for shifting. If additional delays are required gates may be added in pairs between the output circuit of the gate 109 and the control gates 81 and 82.

It is also possible to generate the various timing pulses by the use of such things as one shot multivibrators. Thus if the timing pulses required becomes too long, rather than adding gates as suggested immediately above, one shot multivibrators may be connected in series to provide sequentially the various pulses required; namely, the shift pulse to shift information to the leads 101 and 102 and the gate pulse to open the gates 81 and 82. Various timing functions may be achieved by simply controlling the time delays in the one shot multivibrators which may be accomplished by well-known techniques. Where, however, relatively short delay intervals are required, it is more appropriate to employ the circuits illustrated in FIGS. 8 and 9 and add a small number of appropriately located gates.

Figure 10:
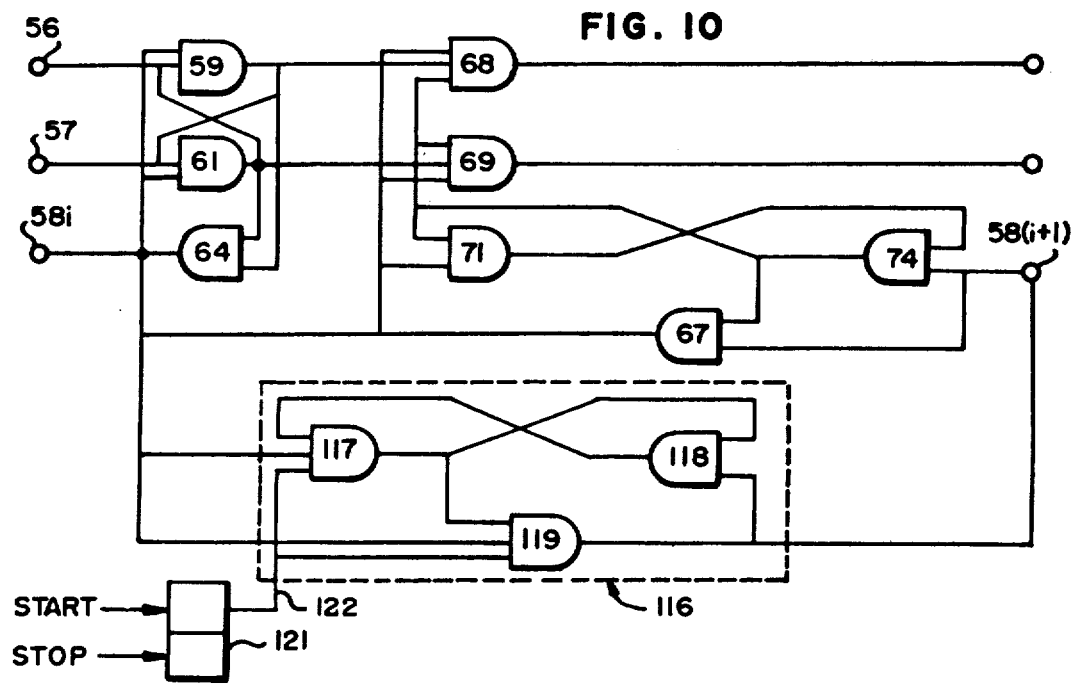
FIG. 10 is a logic block diagram of a serial output interface circuit.

Referring now specifically to FIG. 10 of the accompanying drawings, there is illustrated a circuit employed to gate information out of the net of the present invention. The elements of the net bear the same reference numerals as employed in various of the previous figures, and the apparatus again employs as an interface subcircuit the basic control section of a net which in FIG. 10 is generally designated by the reference numeral 116. The output interface control circuit 116 employs gates 117, 118 and 119 having the output and input circuits of the gates 117 and 118 cross-coupled and with the output circuit of the gate 117 connected to provide an input signal to the gate 119. The output signal from the gate 119 is supplied to the terminal 58(i+1) and as an input signal to the gate 118. Both of the gates 117 and 119 receive an input signal from the terminal 58$i$. Additional input signals to the gates 117 and 119 are derived from a flip-flop 121 which develops the transfer or no transfer signal on a lead 122 connected as input to the aforesaid gates 117 and 119. "Start" and "Stop" transfer signals are applied to the flip-flop 121 in order to control start or stop of transfer information from the net to an external circuit which may be, for instance, a shift register.

It is the function of the control circuit 116 as was the function of the similar control circuits in the input interfaces to the nets of the invention to ensure that sufficient time is effected for transfer while insufficient time is allowed during the transfer function to permit transfer of the same unit of information twice. It will become apparent that the interfacing of the output is simpler than the interfacing of the input since once a start or transfer signal is developed on the lead 122, information is transferred at a rate determined by the net until the transfer signal is removed from the lead 122.

Figure 11:
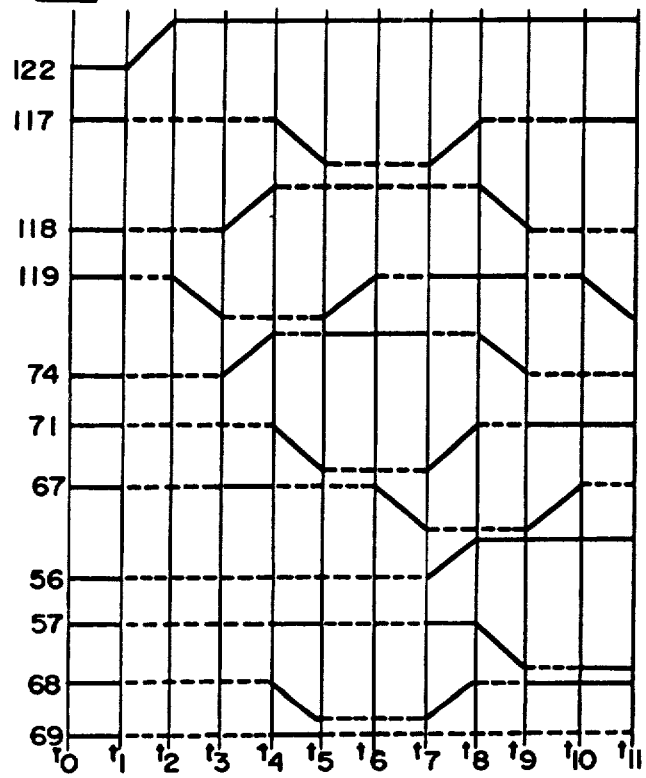
FIG. 11 is the timing diagram illustrating the operation of the circuit of FIG. 10.

Referring now specifically to FIG. 11 of the accompanying drawings, there is illustrated a graph defining the operation of each element in the control circuit 116 and each of the gates of the net. Where the graph refers to a particular gate, the function defined is the output function of the gate. It is assumed for purposes of example only, that the terminal 56 has a 0 applied thereto while the terminal 57 has a 1 applied thereto. Initially ($t_0$) the lead 122 has a 0 signal thereon which indicates no transfer is to occur. Upon the application of a start pulse ($t_1$) to the flip-flop 121, a 1 signal ($t_2$) is developed on the lead 122 and is applied directly to the gates 119 and 117. The gate 117 is initially unaffected since a 0 is applied thereto from the gate 118 and its output signal remains a 1. However, the gate 119 is affected and switches ($t_2$-$t_3$) from a 1 state to a 0 state. Switching of the gate 119 to the 0 state causes the gate 118 to switch ($t_3$-$t_4$) to the 1 state and apply a 1 to the gate 117 which since it has 1's applied to the other input leads now switched ($t_4$-$t_5$) to a 0 state. Switching of the gate 117 to the 0 state causes the gate 119 to switch ($t_5$-$t_6$) back to its 1 state. It should be noted that the interval during which the gate 119 was in its 0 state is equal to three gate delays ($t_{2-3}$-$t_{5-6}$).

It is well to determine the effect of the above operations within the control circuit 116 upon the net.

When the gate 119 went from its 1 to its 0 state, the gate 74 which previously had 1's applied to both of its input leads has a 0 applied to its input from the gate 119 and thus the gate 74 develops ($t_4$) a positive signal on its output lead. The lead 66 previously had a 1 signal thereon and thus two 1 signals are applied to the gate 71 which now produces ($t_5$) a 0 signal on its output lead which is reapplied to gate 74 thus holding its output to the level 1. The 1 signal developed on the output lead of the gate 74 constitutes gating signals for the gates 68 and 69 and the information developed at the output leads of the gates 59 and 61 is gated to the output information leads of the net ($t_5$).

Upon resetting of the gate 119 ($t_6$), the gate 67 has 1's applied to both of its input leads and develops a 0 ($t_7$) on its output lead. A 0 signal on the lead 66 and terminal 58$i$ switches the gate 117 ($t_8$) which in turn switches the gate 118 ($t_9$). The 0 signal on the lead 66 reset the gates 59 and 61 to 1 and they are now free to acquire ($t_8$-$t_9$) a new unit of information, which in this case is assumed to be 1 and 0, the converse of the original signals. Switching of the gate 67 ($t_6$-$t_7$) from 1 to 0, caused the gate 71 to switch ($t_7$-$t_8$) from a 0 to a 1 which in turn forces the gate 74 to switch ($t_8$-$t_9$) from a 1 to a 0. Switching of the gate 74 from 1 to 0 causes the gate 67 to now switch back ($t_9$-$t_{10}$) from 0 to 1 and thus the gate 119 now has all 1's applied to its input circuits and switches back ($t_{10}$-$t_{11}$) to a 0 to start the shift out cycle all over again.

Thus it is seen that the system of FIG. 10 is self-timing. As long as a shift out signal or a 1 appears on the lead 122 the interrelationship of the control circuit of the net and the control circuit 116 is such that the apparatus continues to self-cycle.

It will be noted that in the circuit of FIG. 10 there are five gate delays ($t_{5-6}$-$t_{10-11}$) between the end of one shift out operation and the beginning of the next shift out. The total delay of the circuit of FIG. 10 between initiation of shift outs is eight gate delays as opposed to the six gate delays normally encountered in the nets both through the net itself and with some of the input interface circuits described.

Figure 12:
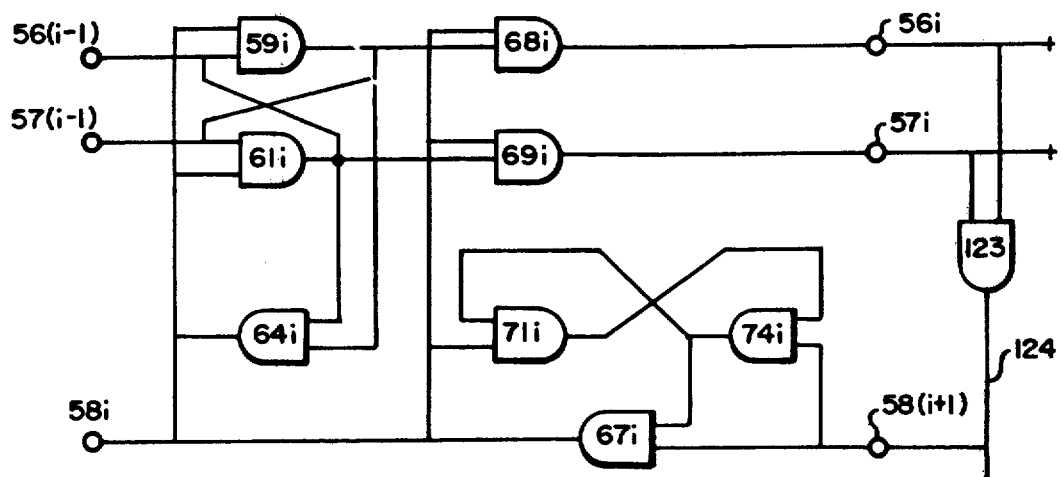
FIG. 12 is a logic block diagram of another serial output interface circuit.

Referring now specifically to FIG. 12 of the accompanying drawings, there is disclosed a circuit in which the delay between read-outs is held to six gate delays. This circuit employs as a last stage of a string of nets a special net i which is obtained from the basic net of FIG. 3 by removing the connection from the output of gate 74$i$ to the inputs of gates 68$i$ and 69$i$. Control signals for the terminal 58($i+1$) are derived from lead 124 which is connected to the outputs of gates 123 and 126. The inputs to gate 123 are derived from the output terminals 56$i$ and 57$i$. Gate 126 is cross-coupled with a further gate 127 to form a flip-flop 131, which receives external control signals via the input leads 128 of gate 126 and 129 of gate 127.

Operation of the circuit of FIG. 12 is as follows. Assume that the external control signal is such that the output of gate 126 of flip-flop 131 is a 1, i.e. lead 128 is 0 or both leads 128 and 129 are 1's but lead 128 was last to become a 1. Initially, with net i in the N state, both output terminals 56$i$ and 57$i$ are 1's so that the output of gate 123 is 0 (and lead 124 is also a 0 since the 0 on the output of gate 123 overrides the 1 on the output of gate 126). As soon as net i assumes the I state information is gated out of the external devices, one of the inputs to gate 123 becomes a 0 and lead 124 becomes a 1. As it was shown in reference to FIG. 4, a negative pulse is now generated at the output of gate 67$i$ of the control circuit, net i is set to the N state, and a new information cycle is started. Assuming information to be continuously available from the upstream nets, it is apparent that the transfer rate corresponds to six gate delays, since it involves the switching of gates 68$i$ (or 69$i$), 123, 67$i$, 71$i$, 74$i$ and 67$i$ again. By this time new information from net (i—1) is also ready for read-out since the first switching of gate 67$i$ also causes gates 74(i—1) and 68(i—1) [or gate 69(i—1)] of net i—1 (not shown in FIG. 12) and gate 64$i$ of net i to switch in the given sequence.

It is now assumed that the status of the external control leads 128 and 129 is such as to cause the output of gate 126 of flip-flop 131 to be a 0, then lead 124 also is a 0 regardless of the status of net i. In this case, whenever net i assumes the I state, information is made available to the external devices via leads 56$i$ and 57$i$ but since now lead 124 is forced to remain a 0, a negative pulse cannot be generated at the output of gate 67$i$ and net i remains in its present I state until the external control signals on leads 128 and 129 force the output of gate 126 to become a 1.

In some applications, it may be desired that information be gated out of a string of nets under the control of the external devices. This can be done very simply by supplying "shift pulses" to the terminal 58($i+1$) of the last net i of the string. Of course, such external "shift pulses" should have characteristics such as pulse width repetition rate, etc. which do not exceed the capability of the nets of the string.

Several read-in and read-out circuits have been described above, each being useful for effecting interfacing with external circuits of different characteristics or useful for achieving varying degrees of reliability or specific timing intervals. An important point relative to each of these circuits is that they all utilize the control circuit of FIG. 4, and thus of the basic net, with only variations in interconnection required to achieve each of the desired functions. This basic design is not required to accommodate the nets to external circuits of various different characteristics; it is only necessary to adjust circuit connections as between basic circuits to effect such accommodations.

Thus far there has been discussed the concept of serial feed-in and serial feed-out of the net. However, parallel feed-in and parallel feed-out are important concepts in any information handling system and the nets are now considered from the point of view of these latter functions. It should be kept in mind that parallel operation in one mode (feed-in or feed-out) must not interfere with the serial mode of operation, (serial feed-out and serial feed-in respectively).

Figure 13:
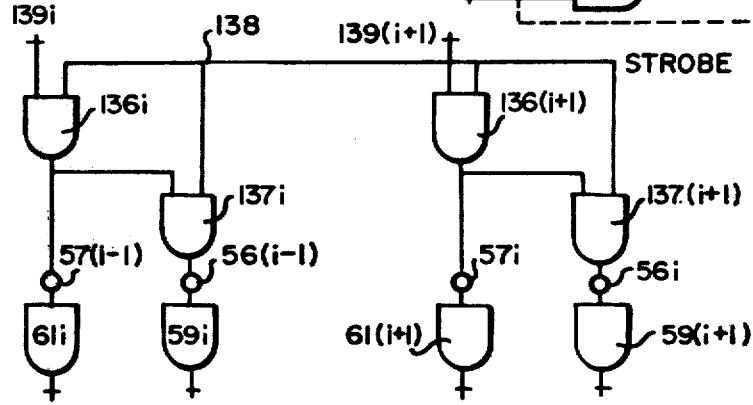
FIG. 13 is a logic block diagram of a parallel input interface circuit.

The parallel feed of information into a series of nets of the type of the present invention is quite simple and requires practically no additional circuitry. Initially reference is made to FIG. 3 to consider what can happen when information is fed in parallel to the circuits of FIG. 3. First of all, valid information (0 or 1), as will become apparent subsequently upon reference to FIG. 13, is fed to all nets by means of the terminals 56 and 57 thus possibly producing a change in information appearing on leads 72 and 73. This latter change may produce a change in the signals (0 to 1) on the leads 66 if any of the nets were in the N state at a prior time. The question of greatest concern is what happens when the leads 66 switch to 1's since this switching action affects prior circuits in the string of nets. Actually, only three different conditions may arise. In any given string of nets, with reference to net i, the terminal 58(i+1) can become positive first, the terminal 58i can become positive first or the terminals can become positive at the same time. The starting condition of the system is as illustrated at $t_3$ in FIG. 4. Both terminals 58i and 58(i+1) are 0 and the output leads of the gates 67, 74 and 71 are 1's. It will be noted that the output of the gate 71 at this instant is illustrated as a dashed line in FIG. 4. The discussion of FIG. 4 (the solid line graph) was for the generalized case of the control circuit. However when the circuit is employed in a net as in FIG. 3 and the net in its neutral state, a 0 is generated by the gate 64 and thus the lead 66i is 0 instead of a 1 even though the output signal of the gate 67 as determined by the input signals thereto would be a 1. The 0 on the input to the gate 72 produces a 1 on its output lead, but this effects no change in any other gate, since the gate 74 has a 0 applied thereto by the terminal 58(i+1) and thus the output signal from the gate 74 remains a 1. Whether or not the gate 64 produces a 0 or 1 output, the conditions in the control net are assumed as illustrated at $t_3$ in FIG. 4.

It is now assumed that the gate 64(i+1), terminal 58(i+1), switches to a 1 first and this occurs between the times $t_4$ and $t_5$ of FIG. 4. When 58(i+1), the output of both gates 67 and 74 (dashed lines) go to 0. Gate 67 immediately reverts to the 1 state (dashed line) and the circuit is quiescent even when information is received by net i since the output of gate 74 is 0 and thus switching can occur only when terminal 58(i+1) goes to 0 indicating net (i+1) can accept information from net i, and therefore no malfunction has been generated in this case.

If net i receives information first, the output of gate 71 shifts to a 0 and no further change occurs in the net since gate 74 already has a zero applied thereto from terminal 58(i+1).

A possible complication now arises when terminal 58(i+1) goes to 1, since a negative pulse is generated at the output of gate 67 and this pulse attempts to set net i to the N state and thus erase the valid information stored therein. It is easily seen that in this case, if the appropriate terminal 56(i−1) or 57(i−1) is held at the 0 level until after said negative pulse terminates, the effects of the pulse upon net i will be over-ridden and the net will end up in the proper state. This is to say that the 0 level should be held at the appropriate terminals 56 and 57 for not less than seven gate delay times.

In the case where both 64i and 64(i+1) change states at the same instant, since the control circuit comprising the gates 67, 71 and 74, have a positive feedback or self-reinforcing effect, the final status of the circuit cannot be an oscillation but must be the assumption of one or the other stable states indicated relative to the two prior conditions. Since these states eventually generate the same final condition, as it has been shown earlier, no difficulties arise relative to the final outcome of the system.

A circuit for suitably inserting information in parallel to the net of FIG. 3 is illustrated in FIG. 13.

Referring specifically to FIG. 13, the circuitry for loading two successive nets is illustrated. The circuit for loading a single net comprises NAND gates 136i and 137i. Each gate receives a 1 input from a strobe line 138. The gate 136 receives, over a lead 139i, the actual input information from the external circuits. The output lead of the gate 136i is connected as an input lead to the gate 137i and also supplies the gate 61i via the terminal 57(i−1). The output lead of the gate 137i supplies the gate 59i via the terminal 56(i−1).

Under initial conditions the strobe line 138 has a 0 applied thereto and therefore a 0 is applied to all gates. Thus the gates 136i and 137i both produce 1's at their output leads and impose 1's on the gates 59i and 61i. When it is desired to gate information into the circuit a 1 is applied to the strobe line. If the lead 139i has a 1 applied thereto, then two 1's are applied to the gate 136i and its output signal is a 0. The 0 output signal from the gate 136i is supplied to the gate 61i and is concurrently applied to the gate 139i thus forcing a 1 to be applied to the gate 59i. Conversely, if the lead 139i has a 0 applied thereto, its output signal is a 1, applying a 1 to the gate 61i and causing the gate 137i to apply a 0 to the gate 59i. The strobe line in its 0 condition forces a neutral signal on the gates and when the strobe signal is a 1, a signal 0–1 or 1–0 is applied to the gates 59i and 61i, respectively, depending upon the condition 0 or 1 of the lead 139i. Thus by simply applying signals in parallel to gates 139i through 139(i+N) the information may be gated in parallel to a chain of nets of the type illustrated in FIG. 3.

Previous discussions relative to the control circuit and the timing diagram of FIG. 4 indicate that no interference is to be anticipated as a result of parallel loading of the nets. The duration of the strobe pulse should be long enough to ensure that transient condition generated by possible negative pulses occurring at the gates 67 have terminated and the information has been stored in each net. Thus, this duration should be at least seven gate delays long.

Although the preceding discussion has been concerned with parallel loading of valid information into a series of nets, the same procedure can be used to set any of the nets into the N state. In this case, a 0 signal should be applied to terminal 58i when it is desired to set net i to the N state. Duration of the 0 signal can be as short as three gate delays. Also, setting of net i to the N state has no effect on the adjacent nets, but it should be noticed that, once the input signal to lead 58i changes from a 0 to a 1, net i is ready to receive whatever valid information is stored in net i−1 and therefore net i will not remain in the N state if net i−1 is in the I state.

Figure 14:
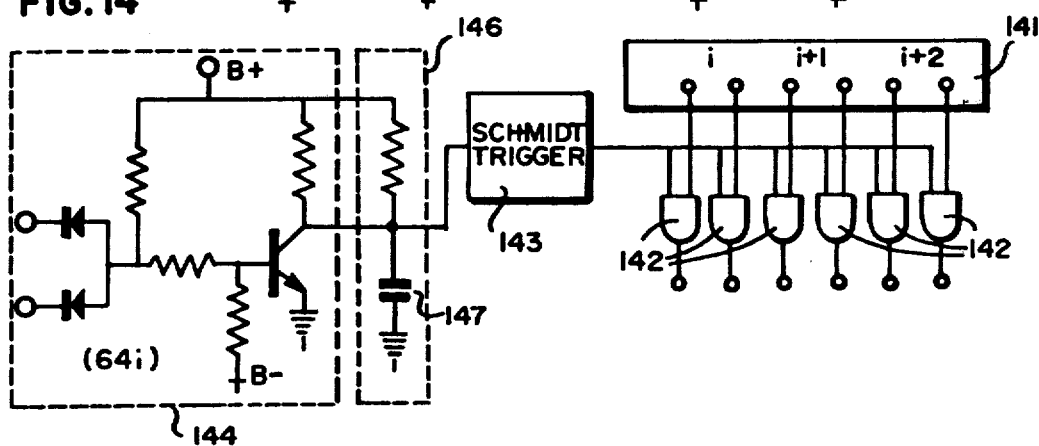
FIG. 14 illustrates a logic block diagram of a parallel read-out interface circuit.

In any system of the type of which the present invention is concerned, parallel feed-in of a register is normally employed when it is desired to change from parallel to serial operation. Conversely, parallel read-out of a register is normally employed when it is wished to switch from serial to parallel operation. The parallel read-out of information from a net or chain of nets of the invention is completely conventional. Determining when a chain of nets is full and therefore parallel read-out may be initiated, does present something of a problem since the nets of the present invention are asynchronous, and conventional techniques do not readily lend themselves to use with such circuits. One solution to the problem would be to calculate the maximum time required under any normal circumstances to fill the chain and introduce a time delay between parallel feed-outs which is greater than this known time interval. A simpler system which in effect counts the number of bits of information which have proceeded down a chain, can be employed. Such a system is illustrated in FIG. 14 of the accompanying drawings. In the circuit of FIG. 14, a plurality of nets, which are designated by the reference numeral 141 and which are arranged as illustrated in FIG. 3, have their output terminals 56 and 57 connected to gates generally designated by the reference numeral 142 which receive strobe pulses from a Schmidt trigger 143. A NAND gate 144 supplies pulses to an integrator circuit, generally designated by the reference numeral 146, including a capacitor 147. The NAND gate 144 is one of the gates 64 of the nets 141. For instance, in FIG. 14, there is illustrated three nets and it is assumed that the left-hand-most net, net i, is the first stage of the chain and therefore the last net to receive stable information. In this system the gate 144 would be the gate 64 of the stage i. If, on the other end, one were only interested in the last two units of information stored, that is, information in the righthand two nets, then the gate 64 of the net (i+1) would be sensed.

The operation of the circuit of FIG. 14 is as follows: Initially all nets are assumed to be in the neutral state and thus 1's are applied to both of the diodes of the NAND gate 144. The current flow through the diodes is blocked, the transistor of gate 144 becomes conductive and the voltage applied to the upper plate of the capacitor 147 is held at about ground potential. When the first unit of information is gated into the input stage of the nets 141, one of the diodes of gate 144 becomes conductive, the transistor becomes non-conductive, the output voltage of the gate 144 rises and the capacitor 147 begins to charge. However, very quickly, the information is passed on to the next net (i+1) and the stage i is reset to its neutral state and the capacitor is discharged. This cycle continues until all of the nets in the circuit 141 are filled, at which time the gate 64i does not again assume a neutral state until after the parallel feed-out of information. Thus the capacitor 147 continues to charge until it approaches the 1 output level of voltage of the NAND gate 144. If the threshold of the Schmidt trigger is set immediately below the high output voltage of the NAND gate 64i, that is, just below a voltage for the system, then the trigger fires only after some interval as determined by the value of the resistor and capacitor, in the integrating network 146. Of course when the Schmidt trigger fires the information in the nets of the circuit 141 is read-out in parallel through the gates 142. By appropriately choosing the relative values of the resistor and capacitor in the integrator network 146, one can readily assume the fact that all of the nets have settled down and are in a steady state condition before parallel read-out, that is, before firing of the Schmidt trigger. The firing of the Schmidt trigger may additionally or as a completely independent function, operate a visual or audible indicator whereby to indicate that the register is full. This feature may be of particular value in read-out to peripheral equipment or in signalling in communication terminals.

There are times when it is necessary, particularly in an operation of two series of nets in parallel, to ensure that the information is transferred between, for instance, the next to the last and the last nets in synchronism, or more particularly, to ensure that the last two nets of two parallel strings both have information before, for instance, a read-out operation is permitted. Such an arrangement might be of interest in an adder where the information in the two strings of nets constitute the two binary words to be added. In a situation such as this, as indicated above, it is essential that both of the last stages of the cascaded nets or strings of nets have information and that information is not transferred out of a net which has information before the corresponding stage of the parallel string of nets has also received its information.

Figure 15:
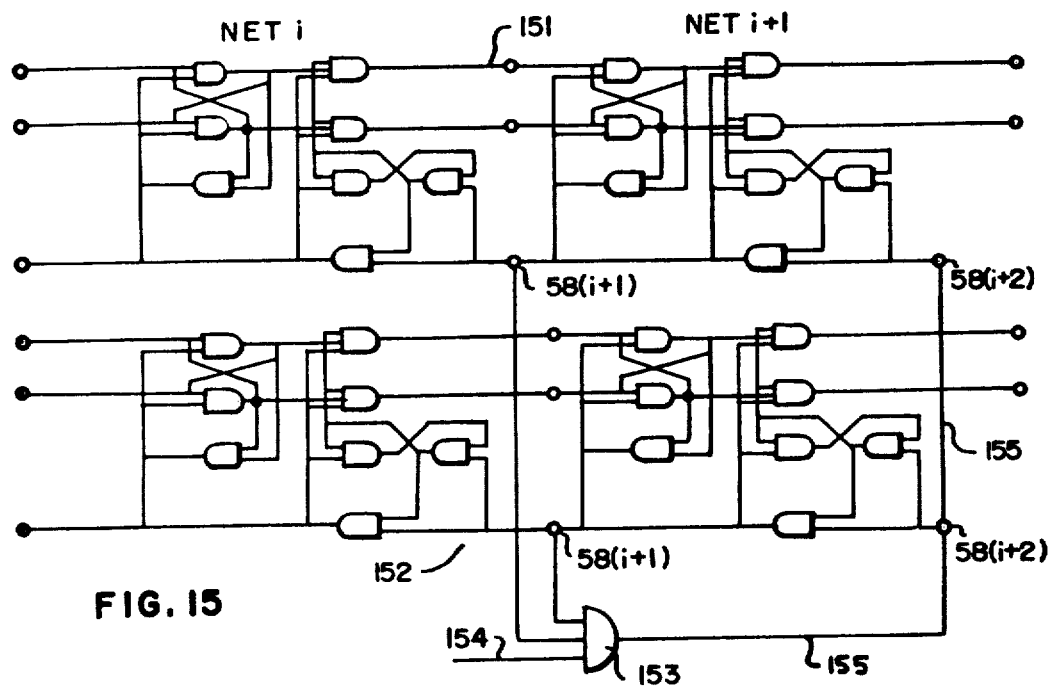
FIG. 15 is a logic block diagram of a circuit employed to control concurrent transfer of information between two adjacent nets in each of at least two parallel cascade chains of circuits.

Referring specifically to FIG. 15, there is illustrated a mechanism by which the above desired function may be accomplished. Specifically, it is assumed that two series of nets are connected or arranged in parallel, the upper series being designated by the reference numeral 151 and the lower series being designated by the reference numeral 152. Only the upper net 151(i+1) is illustrated in detail, since the last two net arrangements are identical. It will be noted that the illustration of the upper net is identical with that illustrated in FIG. 3 except that the terminal 58(i+1) is also connected as one input lead to a NAND gate 153. A second input lead to NAND gate 153 is derived from the terminal 58(i+1) of the last stage of the lower string of nets 152. A third input to gate 153 is lead 154 derived from the external systems involved with the read-out of information from the nets i+1. The output of gate 153 is connected to terminals 78(i+1) of nets i+1 via lead 155.

Operation of the apparatus of FIG. 15 is as follows. Initially, it is assumed that no valid information is stored in either of nets i+1, i.e. both nets are in the N state and both terminals 58(i+1) are 0's. Then, as long as any of the inputs to gate 153 is a 0, namely any of the nets i+1 does not have valid information or the external system does not wish information to be transferred, the output of gate 153 is a 1 and the output gates 68(i+1) and 69(i+1) of both nets (i+1) are closed by the 0 signal applied at their inputs by gate 74(i+1) of the control circuit, as was demonstrated in reference to FIG. 4. As soon as all three inputs to gate 153 become 1's, the output of gate 153 becomes a 0, output gates 68(i+1) and 69(i+1) are opened, thus allowing transfer of information from the nets i+1 to the external system. It should be noticed that, as long as all the inputs to gate 153 are 1's, the same unit of information will be continuously stored by each of the nets i+1 and made available at the outputs of gates 68(i+1) and 69(i+1). If now the input lead 154 to gate 153 from the external system goes to 0, indicating that the system does not wish information to be transferred, but indicating in this particular instant to have properly received previous information, the output of gate 153 goes to 1 and this causes negative pulses to appear at the output of gates 67(i+1) of the control circuit, so that both nets i+1 are set to the N state and a new cycle can be started again. It is seen that no malfunctioning can occur during any of the subintervals of the operation cycle described and that the only requirements on the external signal is that the duration for each of the 0 or 1 states be at least three gate delay times.

It is apparent that the above operation may be performed with any number of string of nets, the number certainly not being limited to two as illustrated. All that is required for the case of n strings of nets is that gate 153 receive an input signal from the terminal 58(i+1) of each string (in addition to the external input lead 154) and that the output lead 155 from gate 153 be connected to lead 78(i+1) of each string.

Figure 16:
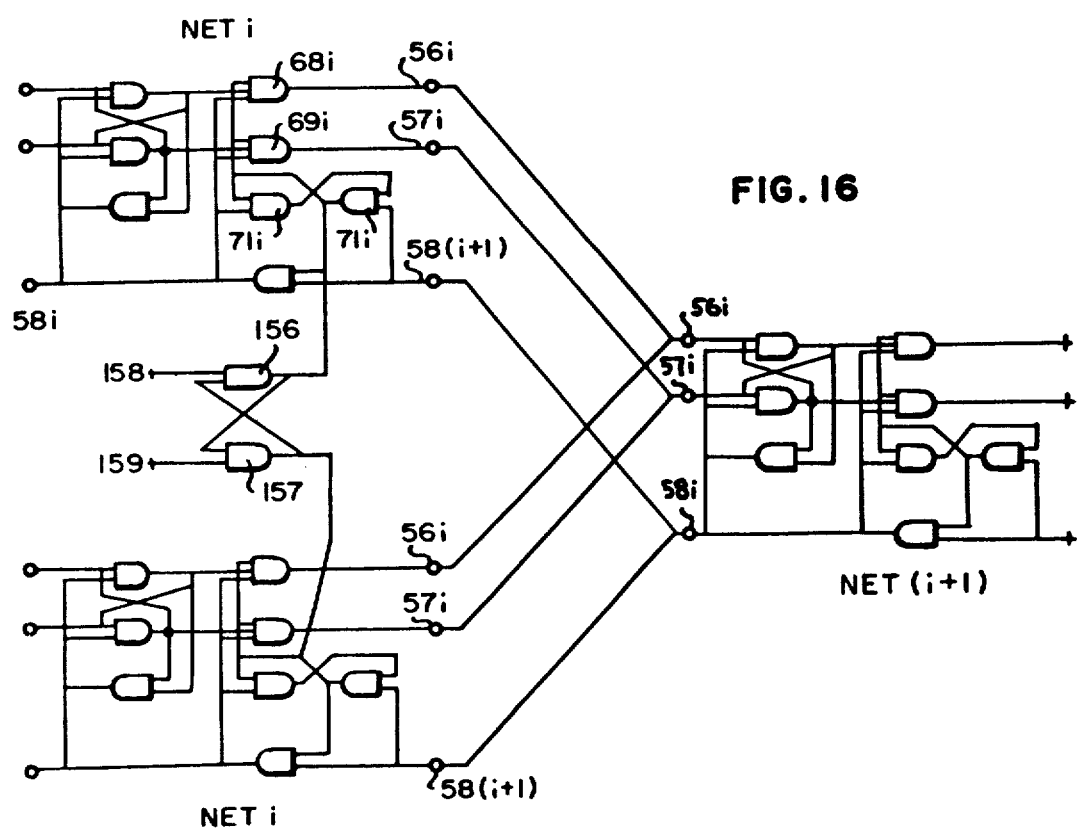
FIG. 16 is a logic block diagram of a multiplexer employing the circuit of the present invention.

In some applications it may be desired that information be fed to a string of nets from either of two other strings, (fan-in) as directed by some external control signal. FIG. 16 shows how this problem can be solved. The figure shows the last stages, nets i, of such two feeder strings and the first stage, net i+1, of the receiving string. A flip-flop formed by cross-coupled NAND gates 156 and 157 receives the external signals controlling which of the two string, i.e. the top or the bottom one, should feed information to net i+1. These external control signals are applied to the input of gate 156 via lead 158 and to the input of gate 157 via lead 159. The output of gate 156 is also connected to the output of gate 74i of the top i, and the output of gate 157 is also connected to the output of gate 74i of the bottom net i. Leads 56i, 57i and 58(i+1) of each net are connected with the like-named leads of the other two nets. Operation of this apparatus is as follows: Assume that the top string and not the bottom one should feed information to net i+1. Then a 0 signal is applied from the external control circuitry to the input lead 158 of gate 156 (and a 1 to the input lead 159 of gate 157) thus causing the output of gate 156 to become a 1 and the output of gate 157 to become a 0. It is easily seen that the operation of the top net i remains unaltered, i.e. the apparatus behaves as if the top net i were connected directly to net i+1 and the bottom string and the flip-flop were not present at all. As far as the bottom net i is concerned, the 0 applied to the output of its gate 74i effectively removes the bottom string from the rest of the apparatus since its gates 68i and 69i are closed and any feedback signals from terminal 58(i+1) cannot have any effect on its control section, i.e. the gates 67, 74i and 71i.

If information had been desired from the bottom net i, then a 0 signal would have been applied to the input lead 159 of gate 157 (and a 1 to the input lead 158 of gate 156) thus causing a 1 at the output of gate 157 and a 0 at the output of gate 156. In this case, it is easily seen that transmission is inhibited from the top net i and is allowed from the bottom net i.

An important remark regarding the apparatus of FIG. 16 is that the maximum transmission rate is not affected by the presence of the switches 156–157. Also, transfer of information upstream of nets i is not directly affected by the presence of the switch, namely both strings of nets continue to receive and transmit information as long as valid information and storage (i.e. nets in the N state) are available.

It is apparent that the above operation can be performed with any number of feeder strings, the number certainly not being limited to two as illustrated. All that would be required, in the case of n feeder strings, is that the terminals 56i, 57i and 58(i+1) of net i+1 be connected to the like-named terminals of the last stage i of each string and that the flip-flop formed by the cross-coupled gates 156 and 157 be replaced by suitable circuitry. In particular cases, embodiment of such circuitry can take the form of a ring counter with a decoding matrix, consisting of "trigger" type flip-flops, and gates. This embodiment is well known and therefore will not be described here in detail. It will suffice, for the present purpose, to state that such circuitry can be thought of as a device with a single input lead and n-output leads all of which have a 0 signal applied thereto with the exception of one lead corresponding to the accumulated count, which has a 1 signal applied thereto. In the present application, each of the n outputs would be connected to the output lead of gate 74i of one of the feeder strings. The function of the ring counter and associated decoding matrix is to respond to an input pulse by increasing the accumulated count by one and thus change from a 1 to a 0 the signal on the output lead corresponding to the previous count and from a 0 to 1 the signal on the output lead corresponding to the new count. Succeeding pulses increase the count up to the maximum value n, at which point a new counting cycle is started. With the above additions, the apparatus of FIG. 16 can be very useful in solving "multiplexing" problems, i.e. applications in which information is fed into a common sink from n sources according to a predetermined cyclic scheme, e.g. one information unit from each source is a prescribed order per multiplex cycle. With reference to FIG. 16 and the additions mentioned above, each of the feeder strings of nets is associated with an information source and is driven from the output lead of the decoding matrix corresponding to the prescribed order, whereas the receiver string is associated with the information sink. Also, the input pulses to the ring counter can be derived from lead 58(i+1) of net i+1 with obvious synchronization advantages, once relative operational delays are taken into account and properly compensated, if required, by using any of the schemes outlined earlier, e.g. in reference to FIG. 5.

Figure 17:
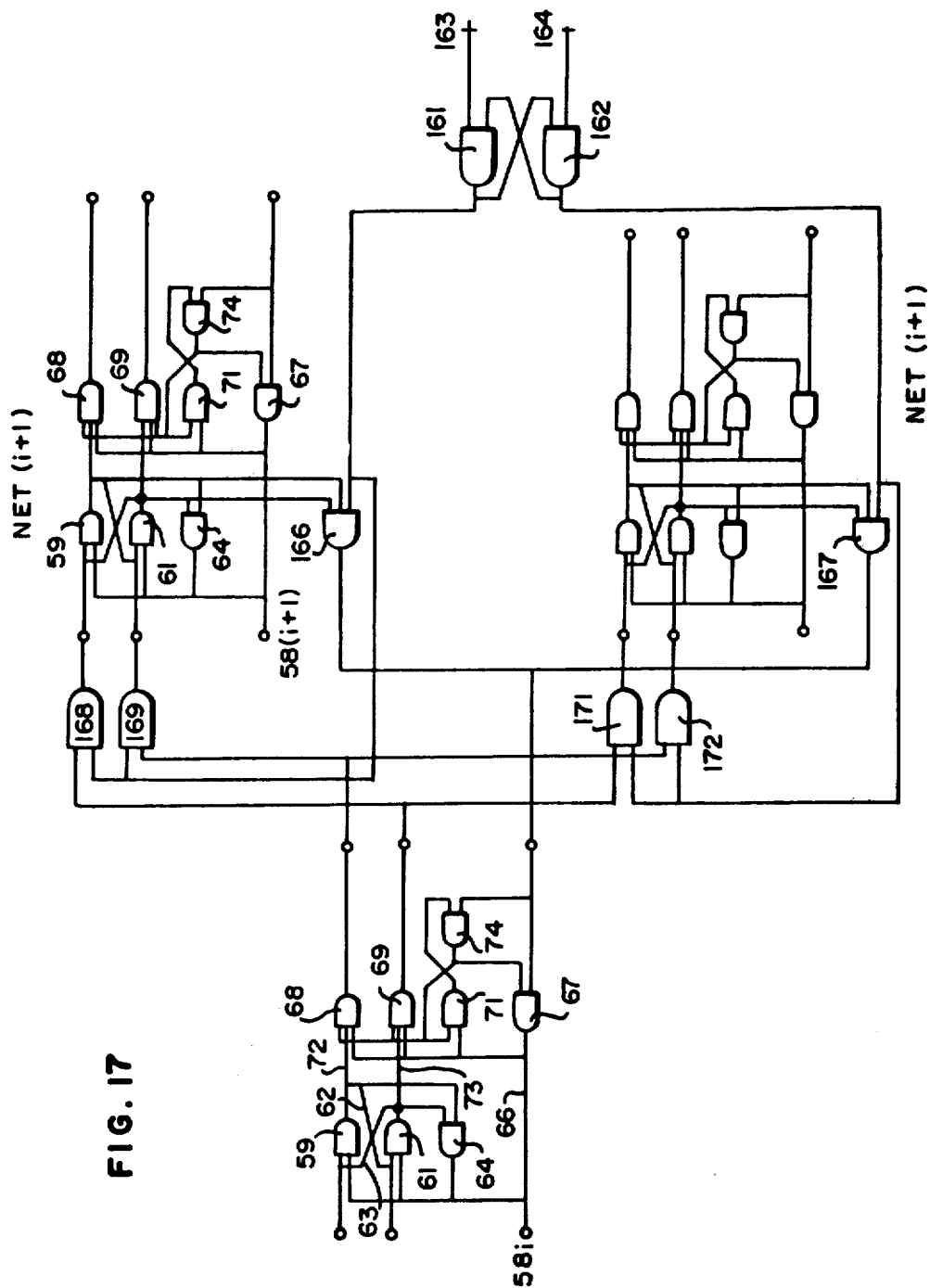
FIG. 17 illustrates a logic block diagram of a fan-out circuit (di-multiplexer) employing the circuit of FIG. 3.

Another application, complementary of the one discussed above, may require that a string of nets feed information to one of two other strings, (fan-out) as directed by some external control signal. FIG. 17 describes how problems of this kind can be solved. The Figure shows net i, the last net of the feeder string, and two nets i+1, the first nets of the receiver strings. The Figure also shows two cross-coupled NAND gates 161 and 162 and two additional gates 166 and 167. The output of gate 161 is connected as input to both gates 162 and 166; the output of gate 162 is connected as input to both gates 161 and 167. In addition gate 166 receives the same inputs as gate 64(i+1) of the top net i+1 and gate 167 receives the same inputs as gate 64(i+1) of the botton net i+1. Further gates 168, 169, 171 and 172 are shown inserted between the output leads 56i and 57i of net i and the input leads 57i and 56i of both nets i+1 respectively. A further input to gates 168 and 169 is the output of gate 161 and a further input to gates 171 and 172 is the output of gate 162. External control inputs are received via lead 163 which is connected as input to gate 161 and via lead 164 which is connected as input to gate 162. Operation of the apparatus is as follows. Assume that a 0 signal is applied by the external source to the input of gate 161 (and a 1 signal is applied to the input of gate 162), so that the output of gate 161 becomes a 1 and the output of gate 162 becomes a 0. It is easy to see that in this case transmission of information between net i and the bottom net i+1 is effectively inhibited and transmission between net i and the top net i+1 is allowed, with the maximum rate of transmission being now decreased somewhat by the insertion of the gates 168 and 169.

If a 0 had been applied to the input of gate 162, the result would have been to inhibit transmission between net i and the top net i+1 and allow transmission between net i and the bottom net i+1, with the same conclusion regarding the transmission rate.

It should be noted that, while its transmission with the feeder string is inhibited, each of the receiver strings can still properly transfer information already in the string to the downstream nets in the same string. Also, by properly adding more gates to partially duplicate the function of existing ones (as was done with gates 166 and 167 to duplicate the functions of gates 64 of both nets i+1) the overall maximum transmission rate can be made equal to that of the feeder string. For instance, two pairs of four-input gates could be used to duplicate the function of gates 68i and 69i, one pair being to replace gates 168 and 169 in the top string and the other to replace gates 171 and 172 in the bottom string. The fourth input of the top pair of gates would be connected to the output of gate 161 and that of the bottom pair of gates would be connected to the output of gate 162.

Again, it is apparent that the above operation can be performed with any number of receiver strings, the number certainly not being limited to two as illustrated. All that would be required for a number n of receiver strings are three additional gates per string, connected in a manner similar to gates 166, 168, 169 of the top string or to gates 167, 171 and 172 of the bottom string in FIG. 17. Also, the flip-flop formed by cross-coupled gates 161 and 162 would have to be replaced by suitable circuitry. In particular cases, embodiment of such circuitry can take the form of a ring counter and associated decoding matrix, as explained earlier. Further, if the input pulses to the ring counter are derived from terminal 58(i+1) of the last stage (net i) of the feeder string, the resulting apparatus can be used to solve "de-multiplexing" problems, i.e. applications in which information from a common source is to be fed to n sinks according to a pre-assigned, cyclic scheme. This problem is complementary to the multiplexing application described earlier and, since solutions and conclusions are similar, no further details are given here.

Again, the simplicity, elegance, speed, and reliability of the interfaces should be recognized.

Figure 18:
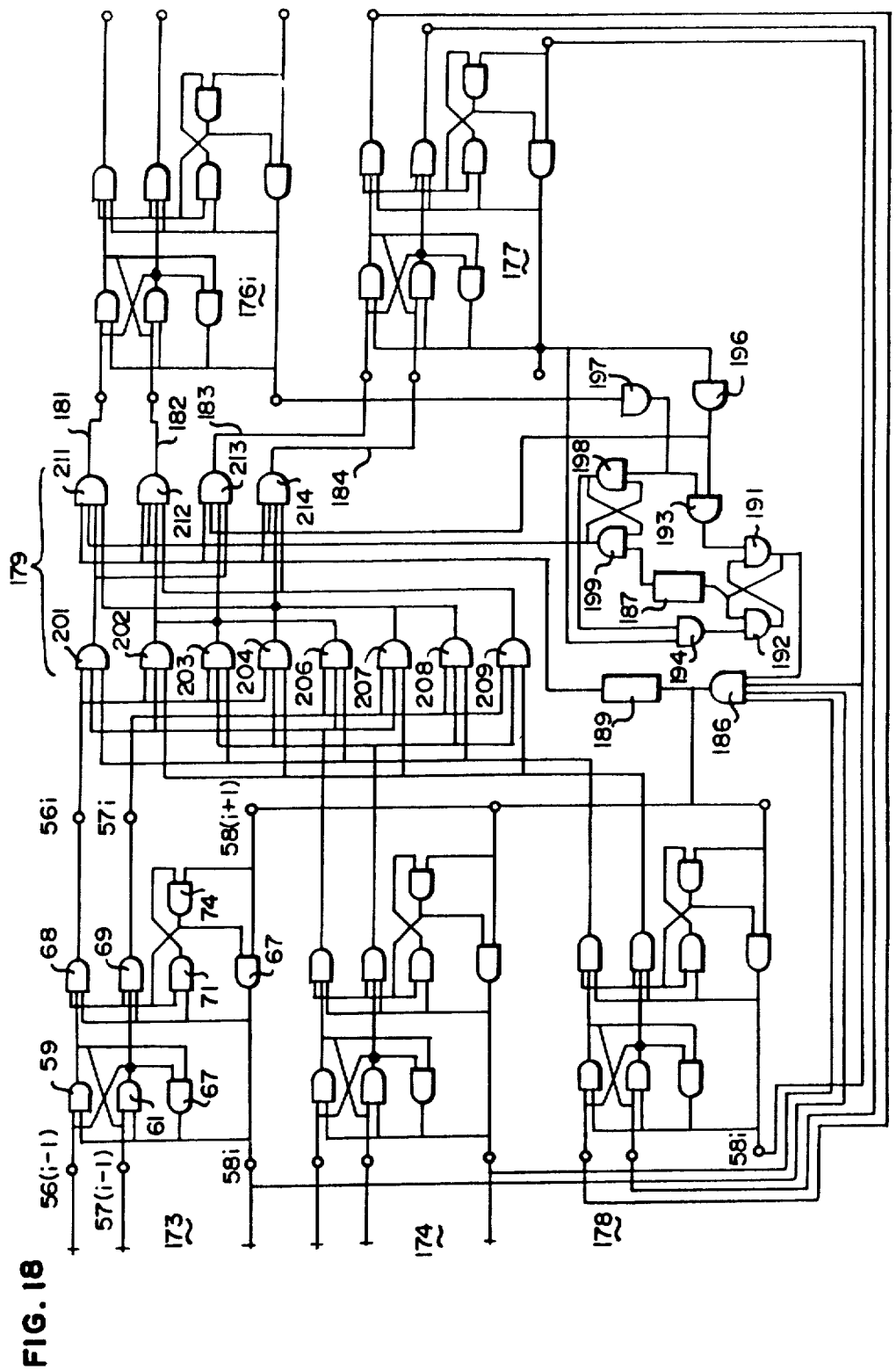
FIG. 18 illustrates a full adder employing circuits of FIG. 3.

Referring now specifically to FIG. 18, there is illustrated an arrangement whereby several strings of nets of the present invention are used in a system which performs the serial, bit-by-bit addition of two binary numbers A+B to produce their sum S. Information bits corresponding to the number A are fed to a string of nets generally indicated by the reference numeral 173, those corresponding to the number B are fed to a second string generally indicated by the reference numeral 174, and those corresponding to the sum S are fed to a third string generally indicated by the reference numeral 176. "Carry bits", generated during the process, are stored in a net 177 and then transferred to a further net 178 for use during the successive bit addition. A summing network, formed by twelve NAND gates and generally indicated by the reference numeral 179, receives the three current bits to be added and produces their sum and carry values on the output leads 181, 182, 183 and 184.

In addition to the above circuitry, several more gates, some of which are cross-coupled to form flip-flops, are shown in FIG. 18 and they are used to effectuate proper control upon the operations of the system. Using the letter i to denote the last two nets of strings 173 and 174 and net 178, i.e. all the three nets directly feeding information to the summing network, reference to FIG. 18 indicates a gate 186 with three of its input leads connected to the terminal 58i of all three nets i and a fourth input lead connected to the output of a gate 191. The output lead of gate 186 is connected to the terminals 78a of all three nets i and to an inverting delay circuit denoted by the numeral 189. The output of the delay 189 is connected as input to all four second level gates of the summing network 179, namely gates 211, 212, 213 and 214. The gate 191 is cross-coupled with another gate 192 to form a flip-flop. Other inputs to these gates 191 and 192 are from the outputs of gates 193 and 194 respectively. Inputs to gate 193 are derived from the outputs of gates 196 and 197, which in turn are inverting gates having their input connected to terminals 58 of net 177 and of the first net of string 176 respectively. Terminal 58 of net 177 is connected also as input to gate 194, whose other input is connected to the output of gate 198. This latter gate is cross-coupled with a further gate 199. Other inputs to gates 198 and 199 are from the output of gates 197 and from the output of one-shot circuit 187 respectively. The one-shot circuit 187 is the same as that shown in FIG. 4, and thus its output is always a 1 except immediately following a 0 to 1 transition at its input, at which time the output will assume the 0 level for a short time interval, namely three gate delays. The input to the one-shot circuit is derived from the output of gate 191. Finally, the output of gate 199 is connected also as an input to the second-level gates 211 and 212 of the summing network, and the output of gate 196 is connected also as input to the second-level gates 213 and 214 of said summing network. Gates 201 through 204 and 206 through 209 comprise the first-level gates of the summing network.

A full description of the summing network is delayed to later paragraphs, those dealing with a remarkable property of such network, commonly known as "auto-synchronous logic". For the present, it will suffice to say that when an addition is performed, if the number of the nets i that are in the 1 state is odd, then lead 181 is 1 and lead 182 is 0; if it is even, then lead 181 is 0 and lead 182 is 1; if it is two or three, then lead 183 is 1 and lead 184 is 0; if it is less than two then lead 184 is 1 and lead 183 is 0.

The inverting delay circuit 189 can be implemented by an odd number of cascaded gates. Since its purpose is to compensate for transmission delays through three levels of gates, namely gates 74i, 68i and 69i and the first-level gates of the summing network, a proper number of such gates is five.

The observation should be made at this point that the arrangement of the system as shown in FIG. 18 displays features of fan-in (nets i all converge into the summing network), fan-out (the summing network feeds nets 176 and 177) and data recirculation (loop formed by nets 177 and 178). Since no timing constraints will be imposed on any of the information or control signals, the system of FIG. 18 will serve also to show how the above-mentioned problems of fan-in, fan-out and loops are solved in regard to the nets of the present invention.

The operation of the system of FIG. 18 will now be described in some detail. This description is most conveniently done by illustrating first the initial procedures for establishing a starting state and then following step-by-step the sequence of events taking place during the various addition cycles, as follows:

a. Assume all the nets of the strings 173, 174 and 176 and those of the carry loop, 177 and 178, are in the N state. Then, with reference to their output terminals, the following situation exists: gates 196, 194 and 197 are 1's gate 193 is 0, gates 191 and 186 are 1's, gate 192 is 0, and the inverting delay 189 is 0. The status of the flip-flop formed by gates 199 and 198 is not, as yet, determined since both gate 197 and the one-shot circuit 187 have 1's as outputs. This can be interpreted by saying that nets 176 and 177 are ready to receive information and thus gates 213 and 214 of the summing network related to net 177 are partially open (gate 196 has a 1 output) whereas the same may not be true for gates 211 and 212 related to first net of the string 176. Also, the nets i have no information to feed to said summing network and thus keep their output gates 68$i$ and 69$i$ and the second-level gates of said summing network closed (a 1 output from gate 186 causes a 0 at the output of inverting delay circuit 189 and at the outputs of gates 74$i$ of nets i, as shown in the discussion of FIG. 4).

b. Assume now that information representing the numbers A and B is inserted in the strings of nets 173 and 174 and net 177 is set to the 0 state (corresponding to a 0 numerical value) with net 178 held temporarily to the N state. It is to be noticed that no action can occur outside of strings 173 and 174 and nets 177 and 178 until all three nets i assume the 1 state, with the exception of gates 199 and 198 whose outputs will now become determined and assume the values 1 and 0 respectively. To see how this happens, first assume that during event a. above gate 199 had an output signal 0 and gate 198 had an output signal 1. With net 177 in the 1 state 194 would have an output of 0, gates 192 and 193 would have output 1's and gate 191 would have output 0. When net 177 assumes the N state as a result of transmitting its 0 state to net 178, gate 193 would produce a 0 output (both its inputs being 1's since both net 177 and the first net of string 176 are in the N state), gate 194 would produce a 1 output, and the output of gate 191 would change from a 0 to a 1, thus producing a negative pulse at the output of one-shot circuit 187. Since the input to gate 198 is also a 1, the flip-flop formed by gates 199 and 198 assumes a stable state whereby the output of gate 199 is 1 and that of gate 198 is 0.

If it had been assumed that during event a. above gate 199 had an output signal 1 and gate 198 had an output signal 0, then whether or not a pulse is generated at the output of one-shot circuit 187 makes no difference since gates 198 and 199 have already the proper state. In actuality, no pulse is generated.

In either of the assumed cases, the insertion of the initial 0 for the carry function into net 177 rather than directly into net 178 guarantees that proper initial conditions are set for gate 199. Also, it is apparent that the 0 inserted into net 177 will be transferred into net 178 and net 177 will assume the N state after an appropriate time (six gate delays). Also, information can be fed into strings 173 and 174 either serially without any restrictions or in parallel with the only restriction that a 0 pulse of duration equal to that of the "strobe pulse" (reference is made here to the previous discussion of FIG. 13) be fed to gate 186 (using a fifth input not actually shown in FIG. 18) whenever such "strobe pulse" may approach or exceed a duration of 19 gate delays, which is the fastest cycle time of the system of FIG. 18 (through the gates 64$i$, 186, 189 (five), 211 or 212, 64 of net 176, 197, 198, 192, 191, 186 again, 67$i$, 71$i$, 74$i$ and 67$i$ again between acceptance of two consecutive units of information by nets i, as it will become apparent later).

c. Assume now that all three nets i have assumed the I state, i.e. terminals 58$i$ are all 1's. Then the output of gate 186 becomes a 0, the outputs of gates 74$i$ become 1's, the valid information stored in nets i is gated into the summing network 179 and, five gate delays after the output of gate 186 became a 0, the output of the inverting delay circuit 189 becomes a 1 and the results of this first addition cycle are gated into the output carry storage net 177 and to net 176$_1$, the first net of the sum storage string 176.

d. Assume now that net 177 and net 176$_1$ have different response times, i.e. they assume the I state at different instants.

Assume first that net 176$_1$ is the faster one. As soon as net 176$_1$ assumes the I state, the output of gate 197 goes to 0, those of gates 193 and 198 go to 1's and that of gate 199 goes to 0. Thus gates 211 and 212 are closed and transmission from the summing network of net 176$_1$ is stopped. Since net 177 is still assumed in the N state, the outputs of gates 194 and 196 are both 1's, thus the status of the flip-flop formed by cross-coupled gates 191 and 192 remains unchanged (with the output of gate 191 being a 1), the addition is still being performed and transmission from the summing network to net 177 is still allowed. It is also important to notice at this point that, should net 176$_1$ return to the N state (after transferring its information to the downstream net 176$_2$) with net 177 still in the N state, no malfunctions would occur. In fact, gate 199 would remain with a 0 output, thus inhibiting any transmission from gates 211 and 212 to net 176$_1$; gate 191 would remain with a 1 output, thus keeping the addition in process; and gate 196 would remain with a 1 output also, thus allowing transmission from gates 213 and 214 of the summing network to net 177.

Assume next that net 177 has a faster response than net 176$_1$. As soon as net 177 assumes the I state, the output of gate 196 becomes a 0, thus stopping transmission between the summing network and net 177. The addition process and transmission of net 176$_1$ are not affected. It must be noticed at this point that net 177 cannot transfer its information to net 178 until the latter is set to the N state, and therefore the danger of taking the same unit of information twice from the summing network does not exist for net 177.

e. Assume now that net 177 is in the I state and net 176$_1$ has received valid information, the latter phrase meaning that net 176$_1$ either is in the I state presently or was in the I state after the addition process was started. In any case, the outputs of gates 193 and 194 are 1 and 0 respectively, so that the outputs of gates 191 and 192 become a 0 and a 1 respectively (and thus the flip-flop which they form assumes a new stable state). The output of gate 186 thus becomes a 1 and the three nets i are reset to the N state by their respective control circuits (gates 67i, 71i and 74i). Transmission from nets i to the summing network is stopped. The input to one-shot circuit 187 becomes a 0 and its output remains a 1. The output of the delay circuit, after a five gate delay, becomes a 0 and thus further inhibits transmission from the summing network to both nets $176_1$ and 177.

f. All three nets i receive new information, those of the strings 173 and 174 from upstream nets, and the net 178 from net 177. It must be noticed that net 177 could again receive information from the summing network six gates delays after the output of gate 186 became a 1 (through the gates 67i, of net 178, 74, 68 or 69 of 177, 64i of 178, 67 of 177 and 196), whereas transmission is stopped after five gates delays by the inverting delay circuit 187. Considering the requirements of a minimum input pulse width to set the net to the I state, this represents a safe margin. A larger margin may be achieved by inserting additional gates between the output of gate 196 and the input of gates 213 and 214 to insure that net 177 remains in the N state.

g. Nets $176_1$ and 177 both assume the N state, thus changing the output of gate 191 from a 0 to a 1, and that of gate 192 from a 1 to a 0. The one-shot circuit 187 produces a 0 output pulse which sets the output of gate 199 to a 1, thus re-establishing proper initial conditions.

h. A new addition cycle starts when both events f. and g. have occurred. The total operation stops whenever either string 173 or 174 has no more valid information or net $176_1$ can no longer transfer its valid information to its succeeding net. It should be noticed that the last carry bit is stored now in net 178.

i. By inserting 0's to the left of the most significant places of both numbers A and B the total sum would be available in the string 176, provided adequate downstream storage is available in said string 176. Also, a value 0 for the carry function would be stored in net 178 and proper initial conditions would exist to start a new addition involving two new numbers C and D. Thus continuous adding operations can be performed, with the only requirements being the insertion of 0's to the left of the most significant digits of the numbers.

Thus it has been shown that the arrangement of the system in FIG. 18 performs properly the function of serially adding numbers when the proper indicated procedure is followed. The summing network 179 will now be described, especially in reference to its "autosynchronous" property.

First, assume that all three nets i are in the N state, i.e. all the inputs from nets i to the summing network are 1's. Using the numeral 200 to denote generally the eight first-level gates, namely gates 201 through 204 and 206 through 209, it is seen that all the gates thusly generally denoted 200 have outputs 0. In turn, gates 211 through 214 have outputs 1 independently of any other inputs thereof, and thus no valid information can be transmitted to nets $176_1$ and 177, regardless of the output signal of gates 196 and 199 and of the inverting delay circuit 189.

Assume next that net 173i is the only one presenting valid information to the first-level gates 200, and more specifically, assume terminal 56i of net 173i is the only one with a 0 signal thereon. Then gates 206 through 209 receive all 1's as inputs, so that their outputs are 0's and again each of the gates 211 through 213 receives at least a 0 input from a gate 200 and their outputs are 1's regardless of the output signals from gates 196 and 199 and the delay 187. The same conclusion will be reached if any other net i is assumed to be the only net feeding valid information to the gates 200.

Assume now that only two of the nets i are feeding valid information to the gates 200, and more specifically assume that the terminals 57i of both nets 173i and 174i are the only ones with a 0 signal thereon. Thus gates 201 and 202 are the only ones with all 1's as inputs and therefore with 0's as outputs. Both gates 211 and 212 have therefore a 1 output, regardless of the output values of gates 196 and 199 and of circuit 189. Also gate 213 has an output signal 1, whereas gate 214 can have an output of 0 if gates 196 and the circuit 189 have 1 output signals. But the stated hypothesis is that the current bits of information from nets 173i and 174i have both a numerical value 1, thus the "carry" value must be 1 also, regardless of the numerical value that might be stored in net 178. If the assumption had been made that terminal 57i of net 173i and terminal 56i of new 174i were the only ones with 0's thereon (numerically a 0 and a 1 respectively) then gates 203 and 204 would have been the only ones with all 1's as inputs and therefore with 0's as outputs. All four gates 211 through 214 would then have 1's as outputs regardless of the output values of gates 196 and 199 and of circuit 189, as it should be since the final numerical values of the carry and sum function cannot currently be determined without a knowledge of the value stored in net 178.

Similar conclusions will be reached with the assumption of valid information being available from any other two nets i (and not available from the third).

The conclusion to be drawn is that the summing network 179 by itself has the property of giving no valid outputs unless they are the correct ones regardless of how many valid inputs are available to it. This property is commonly referred to as "autosynchronous" logic behavior. The importance of such property should be quite apparent even at this stage of writing. A preliminary study has been performed and the conclusion reached that taking advantage of the basic characteristics of the nets of the present invention, any combinational logic system can be designed so that it will display "autosynchronous" behavior, i.e. the only valid outputs (I state) of such systems are the correct ones regardless of the timing sequence with which the inputs are applied thereto, and non-valid (N state type) outputs will be given whenever a correct valid output value cannot be given because of the conditions of the inputs.

With reference to FIG. 18, some of the obvious simplification that can be made are the elimination of gate 186 and the delay circuit 189. The terminals 78i of nets i would then be connected to the output of gate 192. The second-level gates of the summing network 179 would each receive three inputs only, i.e., two from the first-level gates 200 and one from either gate 196 or gate 199. Much more important is the reduction of the cycle time per bit addition (through gates 68i or 69i, net 179 [two], 64 of nets $176_1$ or 177, 197, 198, 194, 192, 67i, 71i, 74i and 67i again between acceptance of two consecutive bits by nets i, for a total of 12 gate delays). Thus cycle time has been reduced considerably with respect to the previous implementation. Also, the much simpler design and reduced amount of design labor involved should be noticed. Furthermore, gates 196, 197 and 193 are not really essential and can be eliminated (for instance, the output of gate 97 can be replaced by the pair of leads 181 and 182) thus further reducing the addition cycle time.

Figure 19:
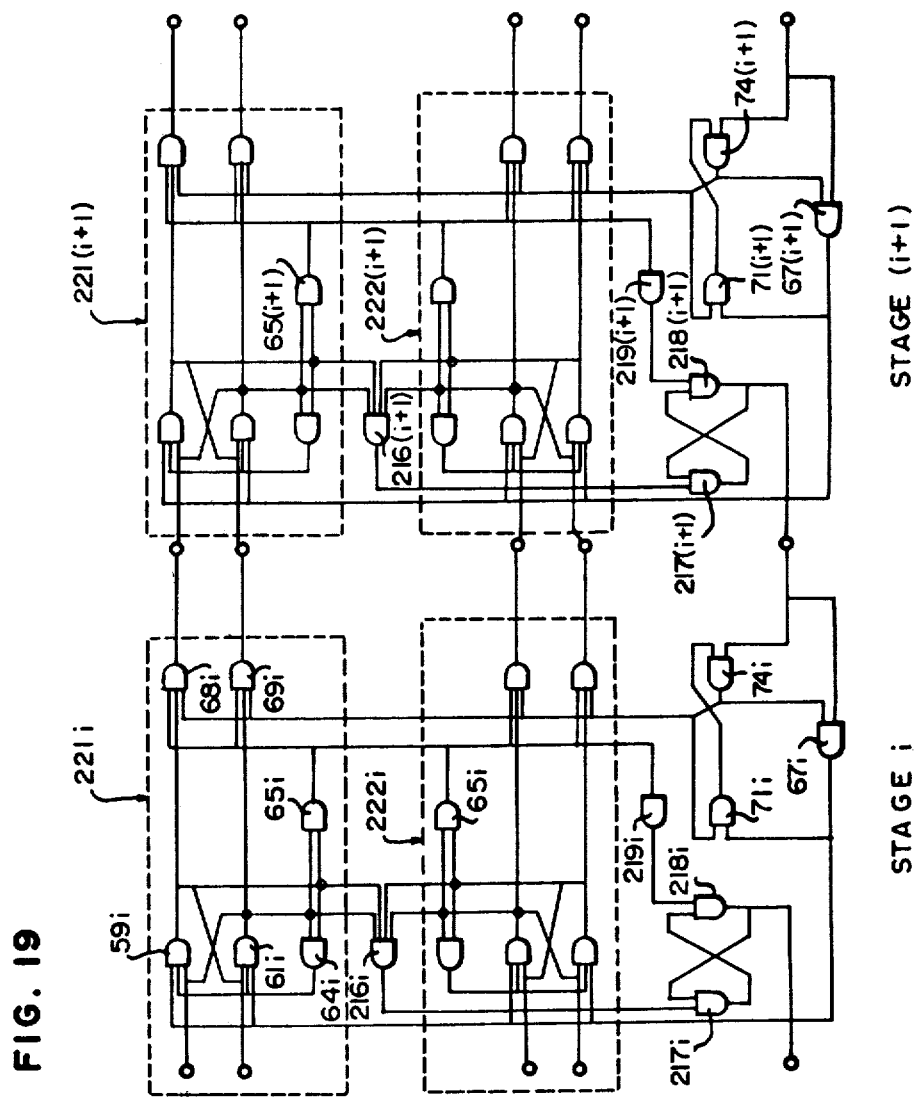
FIG. 19 illustrates a logic block diagram of two cascaded chains of circuits arranged in parallel and employing common control circuit to effect transfers of information between adjacent circuits in each chain concurrently in both chains.

There are applications involving several parallel strings of nets in which it is desired to maintain synchronization between corresponding units of information through all the stages of the strings, i.e. units of information entering the first stage of each string at the same time should step through (enter into and depart from) equally numbered stages downstream of each string at the same time. With reference to FIG. 19, which has been drawn for the case of two such strings, this means that corresponding units of information, one propagating through the upper string and the other propagating through the lower string, should step through stages i and i+1 the same time. With reference again to FIG. 19, the elements pertaining specifically to one stage of the upper string are generally designed by the reference numeral 221 and those pertaining specifically to one stage of the lower string by the reference numeral 222. It will be recognized that all such groups of elements consist of the same number of gates all of which have correspondingly the same connections. Therefore, only the group 221i will be described in detail. Group 221i consists of six gates 59i, 61i, 64i, 68i, 69i and 65i, the first five of which are connected in the same manner and perform the same functions as in FIG. 3, with the following exceptions, all of which involve to some extent functions which in FIG. 3 are related to gate 64i:

a. The output of gate 64i is no longer connected as an input to gates 68i and 69i. The function of controlling information transfer out of net 221i is now performed by gate 65i which, in a sense, "doubles up" for gate 64i, since it has the same inputs as, but not necessarily the same outputs as gate 64i. In fact, gate 65i of net 221i, together with gate 65i of net 222i, performs the function of (partially) controlling the gating out of information from nets 221i and 222i to nets 221(i+1) and 222(i+1) respectively, since the outputs of gates 65i of both nets 221i and 222i are connected together and as inputs to gates 68i and 69i of both said nets.

b. Gates 59i and 61i have now each three inputs, two of which are connected as previously done in FIG. 3, and the additional one being connected to gate 67i. Thus, the previous connection between the outputs of gates 67i and 64i, as shown in FIG. 3, has now been removed in FIG. 19.

c. Gate 64i now performs only the function of providing a stable N state in group (or net) 221i by virtue of its cross-coupling with both gates 59i and 61i.

A control section comprised of three gates 67i, 71i and 74i and connected in the same manner as in FIG. 3, is used to perform functions similar to those performed in FIG. 3 or, more specifically, to control gating of information into nets 221(i+1) and 222(i+1) and to set both nets 221i and 222i to the N state after information transfer has been effected.

Four additional gates are shared by nets in the same stage, i.e. such as 221i and 222i. These are gates 216i, 217i, 218i and 219i. Gate 216i has four inputs, one each from gates 59i and 61i of each net 221i and 222i. Thus gate 216i will have a 0 output signal if both nets 221i and 222i and 222i are in the N state, it will have a 1 output signal otherwise. Gates 217i and 218i are cross-coupled to form a flip-flop. A second input to gate 217i is the output of gate 216i, whereas a second input to gate 218i is the output of gate 219i. This latter gate receives as its only input the combined outputs of both gates 65i of nets 221i and 222i. Thus, the flip-flop operation of gates 217i and 218i is such that the output of gate 218i is forced to become a 0 when both nets 221i and 222i go into the N state and is forced to become a 1 when both said nets go into the I state or, in other words, the flip-flop will "remember" whether nets 221i and 222i were both in the N or in the I states the last time that they were both in the same state.

The operation of the nets of FIG. 19 can be briefly described now as follows. Assume that all the nets of both strings are initially in the N state. In this situation the nets in stage i will accept information, when available, from the nets of a preceding stage i-1, whereas transfer from the nets in stage i to those in stage i+1 is inhibited by the combined action of gates 65i of nets 221i and 222i.

Assume now that valid information (i.e. a 0 or a 1) becomes available somehow in net 221i but not in net 222i. No transfer of this information to net 221(i+1) is effected, since gates 68i and 69i of both nets 221i and 222i are held closed by gate 65i of net 222i, which gate as yet has two 1's as inputs.

Assume now that both nets 221i and 222i are in the I state. Transfer of information to the nets of stage i+1 begins since all four gates 68i and 69i of both nets of the i stage are fully open (both gates 65i have 1's as outputs, and a 0 is provided by the output of gate 218(+1) thus causing the output of gate 74i to be a 1 also).

Assume at this point that net 222(i+1) is much faster than net 221(i+1), i.e. net 222(i+1) assumes the I state while net 221(i+1) is lagging and is still in the N state. It is easy to see that no further actions can occur, namely net 222(i+1) cannot transfer its information to its succeeding net 222(i+2) , transfer of information into net 221(i+1) cannot be inhibited, and setting of any of the i-stage nets to the N state cannot occur. The only event that can occur is that net 221(i+1) also goes into the I state.

Assume now that both nets 221(i+1) and 222(i+1) just went into the I state. Then transfer of information to the nets of stage i+2 begins and, at the same time, the output of gate 218(i+1) becomes a 1, thus generating the conditions whereby the control circuitry formed by gates 67i, 71i and 74i generates a negative pulse at the output of gate 67i (as described in regard to FIG. 4). This negative pulse forces the outputs of gates 59i and 61i of both nets 221i and 222i to assume 1 signals, thus forcing the output of gates 64i in both said nets to assume a 0 signal, i.e. forcing both nets to go into the N state.

The above description shows that the nets of FIG. 19 accomplish the function of insuring that corresponding bits enter and leave nets of the same stage at the same time. In fact, information can enter such nets only if both nets are in the N state and can leave only if both are in the I state.

It is apparent that the above operation may be performed with any number of string of nets, the number certainly not being limited to two as illustrated. All that is required for the case of n such strings is to use strings of nets such as that generally designated by the reference numeral 221 to form n string each with the required number of stages, increase the number of inputs to gate 216 to a number equal to two times n and use a common section (gates 67,74 and 71, 217,218 and 219) per stage in a manner similar to that shown in FIG. 19.

Figure 20:
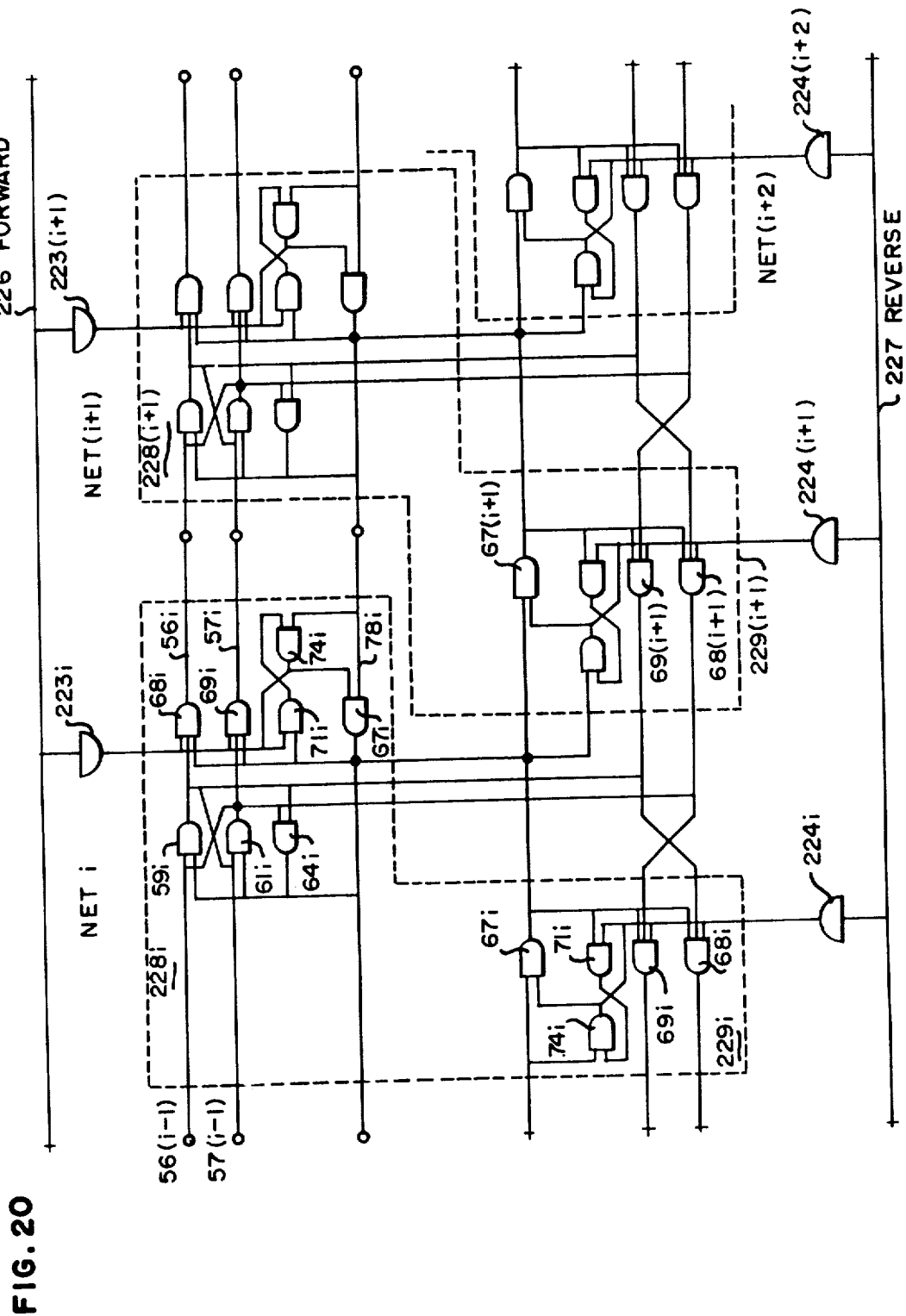
FIG. 20 illustrates a logic block diagram having cascaded circuits in which information may be transferred in either direction.

In many practical applications it is desirable to reverse the flow of information in a series or string of nets. With the nets of the present invention this task is easily accomplish with the arrangement shown in FIG. 20. With reference to FIG. 20, there are shown two rows of networks. The top row is identical to FIG. 3 except for some additional connections as will be described later. These nets are generally indicated by the numeral 228, and their elements (gates, leads and terminals) are denoted by the same numerals as in FIG. 3. Each of the networks shown on the bottom row is obtained from a net of the present invention by eliminating the storage section, namely gates 59, 61 and 64. The bottom nets are generally indicated by the numeral 229 and their elements are correspondingly indicated by the same numerals as in FIG. 3 (or the nets 228 of FIG. 20). It will be noticed that the nets 229 are turned around by 180°. Also, their connections are such that net 228$i$ "shares" the storage section with the nets 229$i$, so that, with the addition of such storage section the nets 229 form "reverse-flow" string of nets, i.e. they form a string of nets whereby information flows from right to left (e.g. from net i+1 to net i). In addition, the output of gate 74$i$ of net 228$i$ is connected to the output of an inverting gate 223$i$, and the output of gate 74$i$ of net 229$i$ is connected to another inverting gate 224$i$. All the inputs of the gates 223 are connected to a common bus 226, and all the inputs of the gates 224 are connected to another common bus 227.

Operation of the apparatus shown on FIG. 20 is as follows. Whenever it is desired to achieve normal, left-to-right, information flow, a 0 signal is applied to bus 226 and a 1 signal is applied to bus 227. Thus, the nets 229 are effectively disabled and the nets 228 perform in the usual way. It will be noticed that this method of disabling some nets while leaving other interconnected nets enabled is similar to that of FIG. 16, and therefore it will not be discussed again here. If, on the other end, it is desired to achieve "reverse", right-to-left, flow of information, a 0 signal should be applied to bus 227 and a 1 signal to bus 226, thus enabling the nets 229 and effectively disabling the nets 228.

It is obvious that reversal of the direction of information flow should not be attempted while information is still propagating in the string of nets. Subsiding of information flow can be detected using any of the methods suggested in reference to parallel read-out of a string of nets. For instance, the method illustrated in FIG. 14 may be used.

In the description of the serial full adder, it was demonstrated that the overall speed of operation of an adder can be sensibly improved using "autosynchronous logic". There are practical applications of such circuits in which the speed of operation is the major concern and even greater speed of operation is required.

Figure 21:
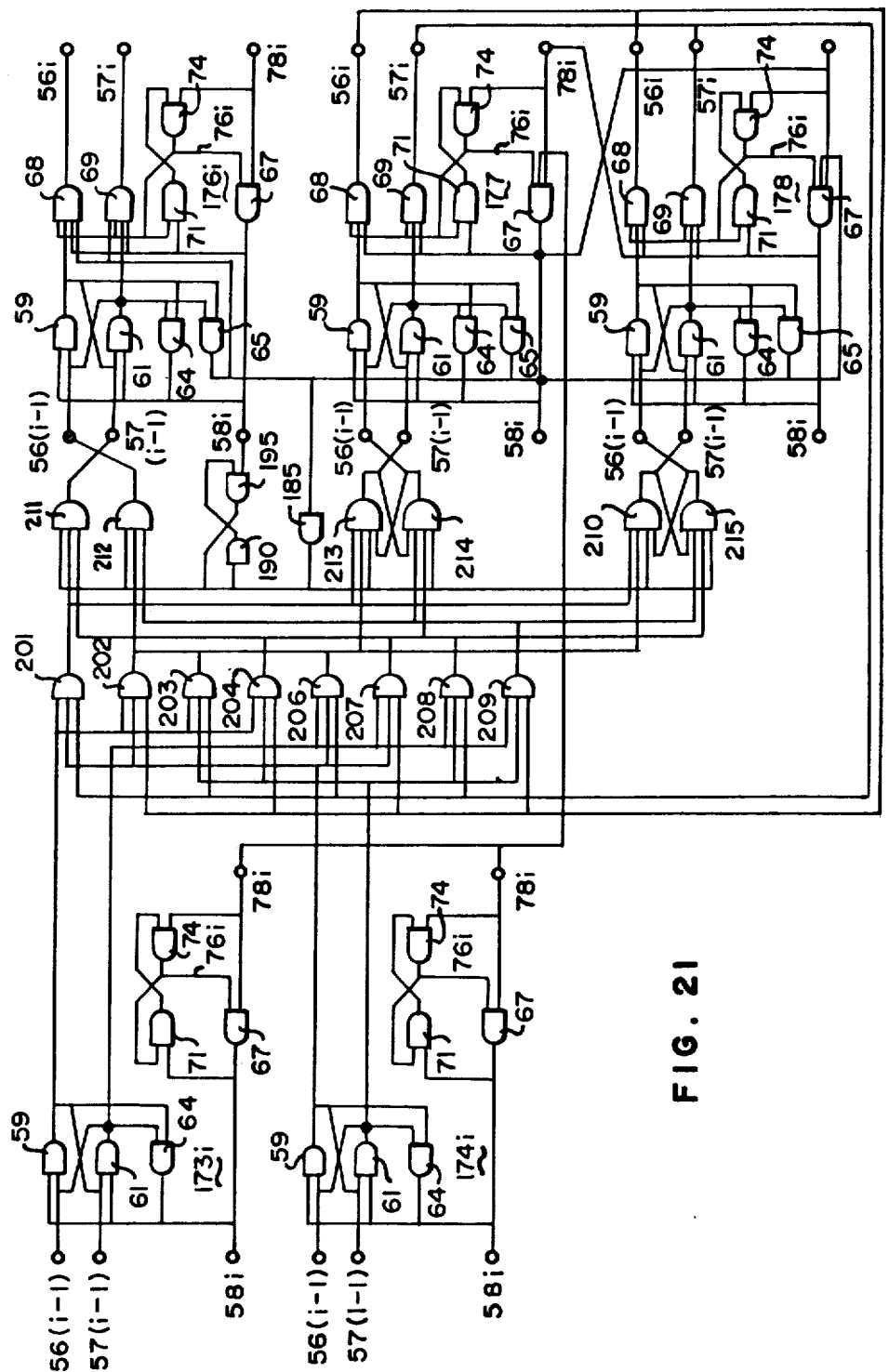
FIG. 21 is a logic block diagram of a real-time full adder.

An alternate arrangement is now described whereby an addition cycle can be performed during only a six-gate delay time, i.e. at the same rate at which information is transferred down a chain of nets of the present invention, thus proving that simple two-level logic operations can be performed without reducing the basic operating speed of the nets. This new arrangement is shown in FIG. 21. With reference to FIG. 21, it is seen that the new arrangement is somewhat similar to that of FIG. 18, and many of the elements bear the same reference numeral. In FIG. 21, there are shown the last two nets, 173$i$ and 174$i$ of strings 173 and 174 and the first net 176$i$ of string 176. These strings carry the addend, augend and sum, respectively in the same manner as in FIG. 18. Nets 177 and 178 are both involved with the carry function, namely one of the nets holds the carry value (input) used in the current addition cycle, the other receives and stores the carry value (output) produced by the current addition cycle. The function performed by each net changes every cycle, as will be shown later.

The adder network is composed of eight first-level gates 201 through 204 and 206 through 209, and of six second-level gates 210 through 215. The pair of gates 211 and 212 produces the sum function and feeds it to net 176$i$, whereas there are two pairs of gates, namely 213, 214 and 210, 215 which independently produce the carry function. Of these, the first pair of gates feeds the carry value to net 177, the second pair feeds the same value to net 178. Cross-coupling between gates 213 and 214 (also 210 and 215) allows the current output carry value to be transferred to net 177 (178) only if net 177 (178) is in the N state. In fact, assume that net 177 is in the 1 (0) state, i.e. the output of its gate 59 (61) is 0, then the output of gate 213 (214) is held at 0 and that of gate 214 (213) is held at 1 regardless of the values of their other inputs. Thus none of these gates can have any effect on the state of net 177. If net 177 were in the N state, then both its gates 69 and 61 would have an output of 1 and gates 213 and 214 would be both enabled and their effect on net 177 would depend on their other inputs. A similar reasoning holds true for net 178 and gates 210 and 215.

In FIG. 21 there are shown two additional gates 190 and 195 cross-coupled to form a flip-flop. A second input to gate 195 is derived from the terminal 58$i$ of net 176$i$. The only input to gate 190 is connected also to the output of inverting gate 185 and the inputs of the gates 210 through 215. The input to this latter gate is from the common outputs of gates 65 of the nets 176$i$, 177 and 178. In each net, gate 65 duplicates the function of (has the same inputs as) gate 64. The outputs of gates 65, besides being connected together and to the input of gate 185 as already mentioned, are connected also as inputs to gates 68 and 69 of net 176$i$, gates 67 of nets 177 and 178 and to terminals 78$i$ of nets 173$i$ and 174.

With reference to FIG. 21, there is also illustrated a connection from the terminal 58$i$ of net 177 (178) to terminal 78$i$ of net 178 (177). Also, the outputs of gates 68 and 69 of net 177 are connected with the outputs of the like-numbered gates of net 178 and as inputs to the first level gates of the summing network. Finally, FIG. 21 discloses that the transfer gates 68 and 69 of nets 173$i$ and 174$i$ have been eliminated and the outputs of the storage gates 59 and 61 of said nets are connected directly to the first level gates of the summing network. Since this reduces by one the number of signal inversion with respect to FIG. 18, the connections between the outputs of the second level gates of the summing net and nets 176$i$, 177 and 178 have been interchanged.

Operation of the system arrangement of FIG. 21 is as follows: Assume that initially all five nets 173$i$, 174$i$, 176$i$, 177 and 178 are in the N state. The first level gates 201 through 204, 206 through 209 of the summing network have all 1's as inputs, therefore their outputs are all 0's, so that the outputs of the second level gates 210 through 215 are all 1's. The system is in a stable situation whereby no changes occur. The system is now subjected to the following initialization procedure: Net 177 is set to the 0 state (numerical value 0) and the number A and B to be added are inserted into the net springs 173 and 174 in either serial or parallel fashion. Net 178 and the net string 176 are left in the N state. It should be noticed that, because of symmetry, the functions of nets 177 and 178 could have been interchanged. At the end of the initialization procedure, the system is ready to perform the first addition cycle. The output of gates 195 and 185 and terminals 56(i−1) and 57(i−1) of net 178 are all 1's so that the gate pairs 211, 212 and 210, 215 are open and ready to transfer the results of the first sum and carry operations to nets 176i and 178 respectively. The gate pair 213, 214 is closed, as was described earlier, by the 0 at the outut of gate 61 of net 177.

At this point either the sum or carry result could occur first, i.e. either net 176i or net 178 could be set to a valid (0 or 1) state first. Proper system behavior is achieved in either case. Assume that net 176i is set to a valid state first. In this case terminal 58i of net 176i changes from 0 to 1, but the cross-coupled flip-flop formed by gates 195 and 190 remains in its previous state, with gate 195 having output 1 and gate 190 having output 0, and no transfer of information from net 176i to its following stage 176(i+1) can occur since the 0 on the output of gate 65 of net 178 holds closed gates 68 and 69 of net 176i. The gate pair 210, 215 remains open, the carry operation in process is not effected, and no other changes can occur until net 178 also is set to a valid state.

Assume now that net 178 is set to the 1 state first. The gate pair 210, 215 is closed (in the sense explained earlier), terminal 58i of net 178 changes from 0 to 1, but it has no effect on net 177 since the 0 on the output of gate 65 of net 176i holds closed gate 67 of net 177 (and the 0 on the output of gate 71 of net 177 holds closed gate 74 of the same net). Also, since terminal 58i of net 177 remains 1, the output of gate 74 of net 178 remains a 0 and thus prevents the newly produced carry value from being applied from net 178 to the sum and carry network, and disturbing the addition in process. The gate pair 211, 212 remains open, and no other changes can occur until net 176i also is set to a valid state.

Assume now that both net 176i and net 178 have been set to the I state. The common output of all three gates 65 of nets 176i, 177 and 178 changes from 0 to 1. The outputs of gates 67 of nets 173i and 174i become 0 thus setting said nets to the N state. The output of gate 185 becomes 0 and thus closing all the second level gates 210 through 215 of the summing network. Since terminal 58i of net 176i is a 1, the flip-flop formed by gates 195 and 190 changes states (the output of gate 190 becomes 1 and that of gate 195 becomes 0). The output of gate 67 of net 177 also becomes 0, and thus it resets said net 177 to the N state and closes its transfer gates 68 and 69, while it also opens the transfer gates 68 and 69 of net 178 by virtue of its coupling to terminal 78i of said net 178. Finally, gates 68 and 69 of net 178 are open and, if the succeeding stage 176(i+1) is in the N state, information is transferred from net 176i to net 176(i+1).

Three gate-delays after the common outputs of gates 65 became 1, new information is available at the inputs of the first-level gates of the summing network from net 178 and nets 173i and 174i (assuming that the stages upstream of the latter two nets were in the I state), net 177 assumes the N state, with the common output of all three gates 65 becomming a 0 and, if not 176(i+1) was in the N state, terminal 58i of net 176i becomes 0. One gate delay after the last event, the state of the flip-flop formed by gates 195 and 190 changes again, with the common outputs of gates 185 and 195 becomming a 1 and the gate pairs 211, 212, and 213, 214 being open and ready to transfer the results of the new addition cycle to nets 176i and 177 respectively. Had net 176(i+1) not been in the N state, information transfer from net 176i to net 176(i+1) would not have occurred, terminal 58i of net 176i would not have become 0 and the output of gate 195 would not have changed from 0 to 1. Therefore, the gate pairs 211, 212 and 213, 214 would have remained closed and, although a new addition cycle would be in progress, its results could not be transferred to nets 176i and 177 and there would be a pause in the operation of the system. Operation would resume as described as soon as net 176(i+1) assumes the N state.

Thus it is seen that the system of FIG. 21 does behave in a proper manner under all possible situations. Also, assuming that information, as required, is available in the input strings 173 and 174 and is taken out of the output string 176, it is seen that addition cycles occur at six gate-delay time intervals, i.e. at the fastest rate that information can travel in any string of nets. Therefore, the system arrangement shown in FIG. 21 achieves the very important goal of being capable of processing information in "real time", i.e. at the fastest rate that such information can be received into and transferred out of the nets of the present invention. Also, the very minimal amount of additional circuitry required should be noticed.

This remarkably high speed of operation has been made possible by the elimination of the transfer gates 68 and 69 from nets 173i and 174i and the high degree of concurrent and yet hazard-free, actions taking place in the system. These same principles can be applied to other practical situations to achieve operating speed up to the maximum rate of six-gate delay time intervals.

Figure 22:
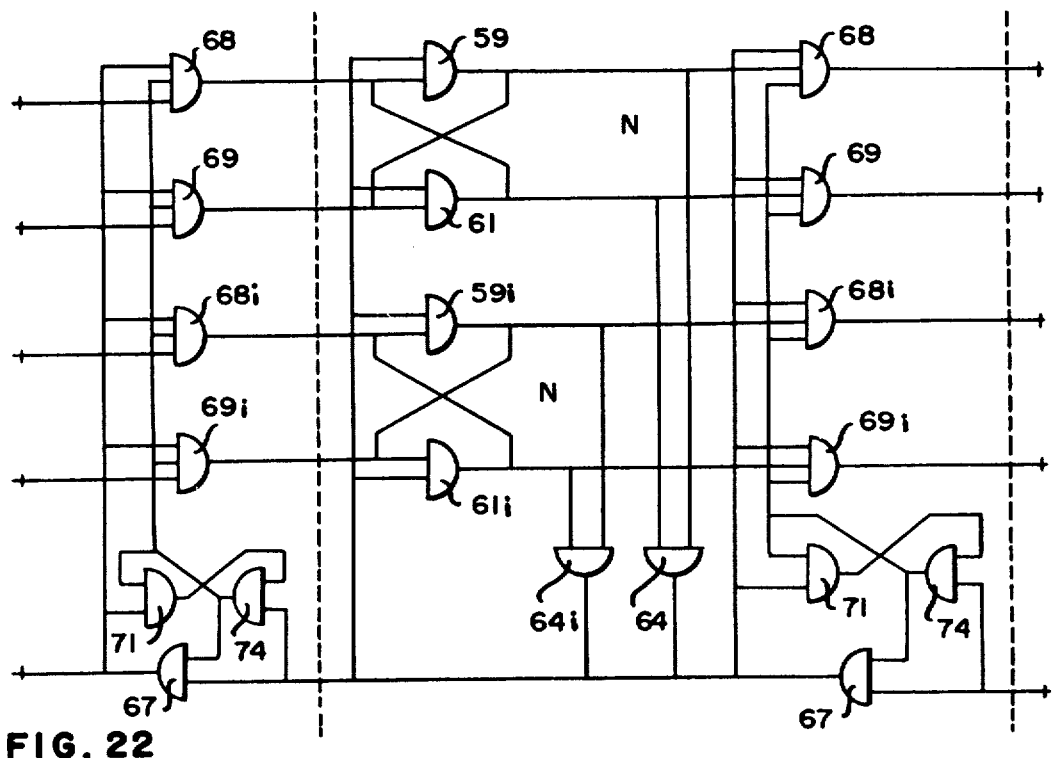
FIG. 22 is a logic block diagram of two cascaded chains in which transfer between all stages in each chain is effected concurrently in both said chains.

In line with the above reasoning and for those applications in which speed is the primary concern, an alternate circuit configuration is given for the arrangement of FIG. 19, which shows a possible solution to the problem of maintaining synchronization between units of information entering different strings of nets at the same time. The new arrangement is shown in FIG. 22. With reference to FIG. 22, it is seen that a stage of the composite string is formed essentially by having two stages like those shown in FIG. 3 share a common control circuit. It is easily seen that information is allowed to enter a composite stage as long as the output of one of the gates in position 64 in the storage sections is 0, and is allowed to exit such composite stage only if the outputs of both gates 64 and 64i are 1's. Also, both storage sections of a preceding composite stage are set to the N state whenever the outputs of both gates 64 and 64i of a stage assume the value 1 from a previous situation in which at least one gate had output 0.

The arrangement of FIG. 22 has the advantage of less circuitry and a higher transfer rate (six vs. eight gate-delays) over the arrangement of FIG. 19. Its chief disadvantage is that no storage section can exist in a true I state whenever the other one is in the N state, so that valid information must be held at the input terminals of both storage sections until they both assume the I state (the outputs of both gates 64 become 1's ) for reliable operation. This requirement causes no problems at the internal interfaces in a string of such nets, but for some applications it could become a serious operational restriction as far as the interfaces with external devices are concerned.

It is apparent that the arrangement of FIG. 22 can be extended to the case of more than two storage sections per composite stage. A comparison of such extended stages with those derived by a corresponding extension of the nets of FIG. 19 would lead to conclusion analogous to those reached above in regard to the nets of FIG. 22 and those of FIG. 19.

Figure 23:
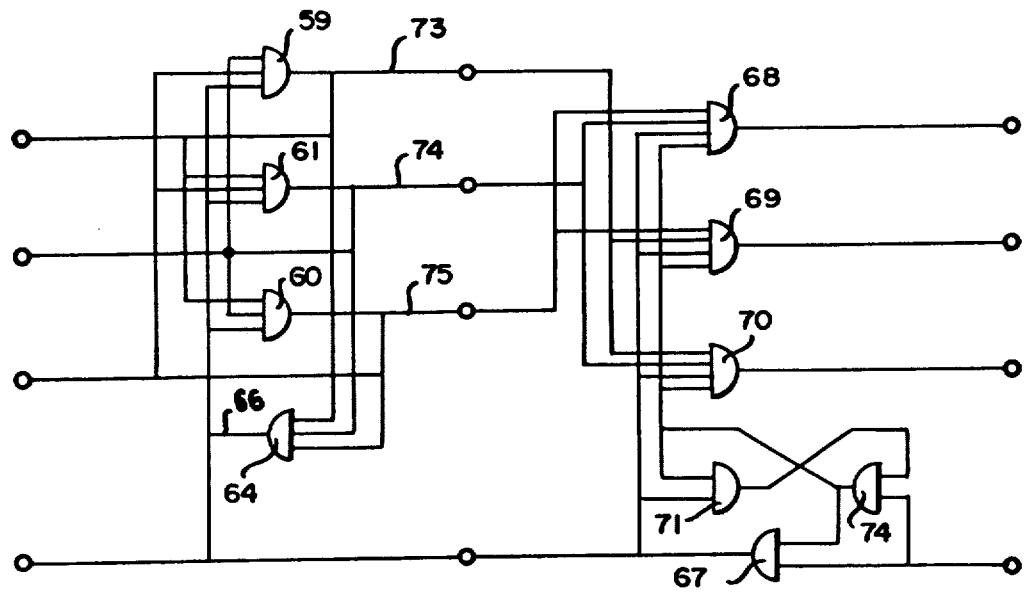
FIG. 23 illustrates a circuit of the present invention employing ternary logic.

A further extension of the basic concept of the nets of the present invention is shown in FIG. 23. With reference to FIG. 23, there is shown an extension of the storage section to the case of four stable states, three of which are used to carry valid information and the fourth being used again to represent a neutral, no-information state "N". The four stable states correspond to the situations whereby the output of one of the four gates 59, 61, 60 and 64 is 0 and the other three are 1's. In analogy with the state assignments used for the nets of FIG. 3, the stable states of the nets of FIG. 23 will be labelled 0, 1, 2 and N according to whether gates 59, 61, 60 or 64 has output 0. Also, the state 0, 1, and 2 will be collectively called the information or valid states and denoted with the symbol I in contrast to the no-information or neutral state N.

Table II below illustrates the state assignments for the output leads of the gates 59, 61, 60 and 64 respectively.

TABLE II

| State | 73 | 74 | 75 | 66 |
|---|---|---|---|---|
| 0 | 0 | 1 | 1 | 1 |
| 1 | 1 | 0 | 1 | 1 |
| 2 | 1 | 1 | 0 | 1 |
| N | 1 | 1 | 1 | 0 |

The internal operations and the information transfer mechanism of the nets of FIG. 23 are very similar and are derived as a simple and natural extension of those already described for the nets of FIG. 3 and occur at the same rates. Also, interface operations like serial and parallel feed-in and feed-out of information, fan-in, fan-out, recirculating information loops, fan-in and fan-out switching, bi-directional information flow for the nets of FIG. 23 are very similar and are derived as a simple and natural extension of the same operations as they have already been described for the nets of FIG. 3.

It is apparent that the arrangement of the nets of FIG. 23 can be further extended to the cases in which the memory section can have n (n>4) stable states, of which n−1 states can be used to carry valid information and one state can be used to denote the no-information or neutral state.

These extended nets, with more than three stable states, not only have possible natural applications in logic systems with numerical bases higher than two, (i.e. ternary, quaternary, etc., numbering systems) but also can be used to carry special information symbols in binary systems. For instance, in the nets of FIG. 23 the information state "2" can be used to indicate such "housekeeping" information as "end-of-word", "end-of-message", etc., and to determine the mode of operation of such network arrangements as fan-in and fan-out switches, bi-directional flow-nets and so on. Furthermore, very efficient encodng schemes based on the availability of this extra state can be developed to enhance processing of information and error detection and correction in a noisy environment.

Figure 24:
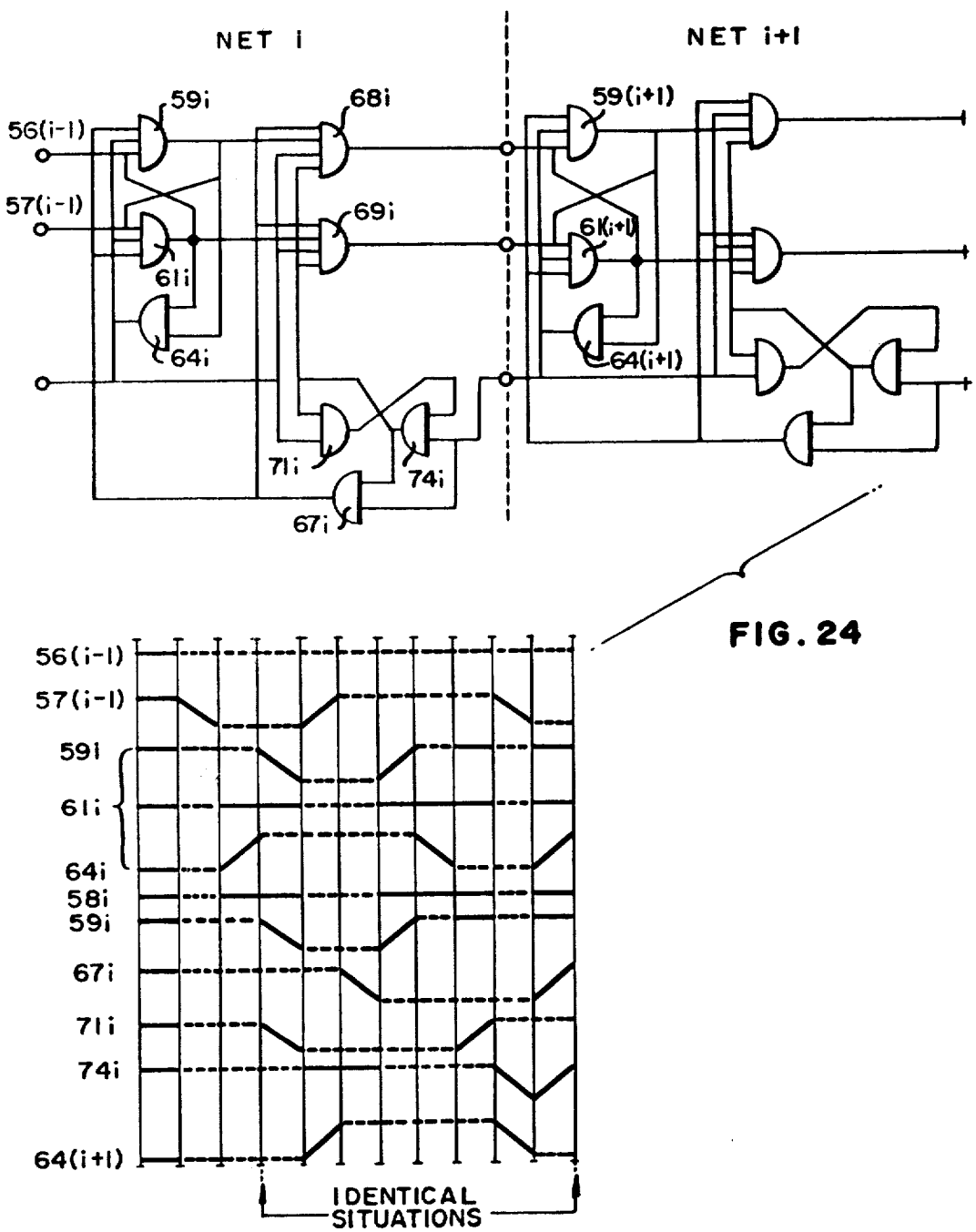
FIG. 24 illustrates a modification of the binary logic circuit of FIG. 3.

As it has been shown thus far, the high speed of operation for the nets of the present invention is achieved by letting several events take place simultaneously and reliable operation is achieved by "feedback", i.e. by properly sensing the start, progress and termination of key events. It is apparent that some variations of the basic circuit are possible to improve speed and/or reliability of operation. For instance, a variation of the basic circuit of FIG. 3 is shown in FIG. 24. It will be recalled that in a string of nets, as soon as net i+1 receives valid information from a net i, the latter is set to the N state by a negative pulse from gate 67 of the control section of net i. Although the width of such a pulse is quite safe (three gate delays vs. two actually required), no feedback is used to sense that such an event has indeed taken place before the negative pulse is terminated in the circuits of FIG. 3. With reference to FIG. 24 there is shown a new circuit configuration which is very similar to that of FIG. 3 except that the outputs of gates 64 and 67 are no longer connected together. In the circuit of FIG. 23, the output of gate 64i is connected as input to gates 67(i−1) and 74(i−1) of the preceding net and to gates 59i, 61i, 68i, 69i and 71i of net i (as in FIG. 3); whereas the output of gate 67is connected as input to gates 59i, 61i, 68i and 69. As a consequence, the gates 59, 61, 68 and 69 have one more input lead in the nets of FIG. 24 as compared to the nets of FIG. 3. In addition, several graphs are shown in FIG. 24 to illustrate the output waveforms of those gates which bear the same reference numerals. It is apparent in FIG. 24 that the negative pulse ensuring at the output of gate 67i (upon net i+1 receiving valid information from net i) is five gate delays wide and it requires that the output of gate 64i becomes a 0 (net i assumes the N state) before the pulse can terminate.

It also can be seen that the remainder of the events taking place in the nets of FIG. 24 are very similar to those taking place in the nets of FIG. 3 and therefore no further details will be given in regard to the operation of the nets of FIG. 24. The only additional remark to be made is that an operation cycle for the nets of FIG. 24 involves eight gate delays as compared with six for the nets of FIG. 3.

In the above description of the circuits and systems of the present invention, the apparatus is described as employing a specific type of NAND gate. The use of the specific type of NAND gate disclosed and the use of NAND logic are both not essential to operation of the apparatus. The use of NAND logic and the specific gate do impart simplicity to the circuit and thus increase its speed. The specific NAND gate permits direct coupling of the output leads of two such gates even under circumstances where the states of the input leads of the gates specify different output functions. If other types of NAND gates are to be employed buffering of the outputs should be employed to provide isolation of the gates. Further the logic functions of the circuit may be accomplished by NOR gates or OR gates plus inversion. However again additional gates may be required in this type of logic than in the NAND logic with a corresponding reduction in speed of operation.

The circuit of the invention is described in FIG. 3 as employing binary logic and in FIG. 23 as employing ternary logic.

It is apparent that any level of N-ary logic may be developed by the simple addition of one storage gate and one output gate per increase in the base number. Thus in FIG. 3 a single three gate storage section and 2 gate output section is employed; in FIG. 23, a four gate storage section and a three gate output section is employed. The next N-ary level is added by adding a further gate to the storage section and to the output section. If sufficient storage and output gates are employed, the levels of the control signals may have to be amplified but this factor becomes a problem only when the normal fan-out capability of the NAND gates is exceeded.

There has also been disclosed in FIG. 3 a circuit which under normal aging and related problems does not generate serious pulse races. There are environments, such as in high temperature work or in the space field where extended periods of continuous operation is required, wherein the individual gates may change characteristics sufficiently that pulse races could occur. FIG. 24 illustrates a circuit which eliminates such a problem in one area of the device. Similar techniques or addition of gates may be employed to eliminate all foreseeable race problems.

The system disclosed herein deal with both translation of information and processing of information concurrently with or independently of translation. Thus in the translation area there have been disclosed serial transfer, serio/parallel transfer and vice versa, fan-in (multiplexing for instance), fan-out (demultiplexing) and in-step, serial transfer in parallel cascades. Each of these systems finds applicability in the data handling arts.

The high speed of operation of the devices permit data processing in the translational mode. Thus the full adders of FIGS. 18 and 21 are of specific interest, particularly the latter system which is a real-time adder. The real time adder may be employed as a subtraction circuit by means of conventional complementing circuitry. If the devices are divorced from the translational process, conventional techniques may be employed to convert the adders to multiplication and division circuits or comparison circuits.

It is apparent from the above that the circuit or circuits of the present invention provide an exceedingly flexible data handling and processing tool from which may be realized many high speed systems for data translation and processing while retaining substantially complete independence from surrounding circuits and retaining an unusually high degree of reliability.

Figure 27:
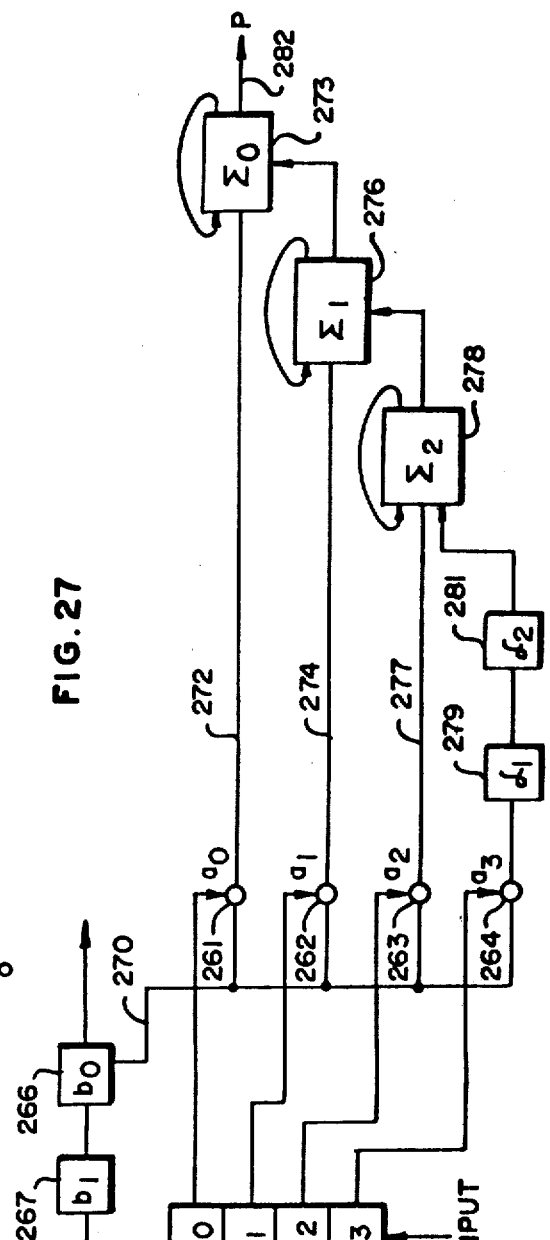
FIG. 27 is a logic diagram of a real-time multiplier.
Figure 29:
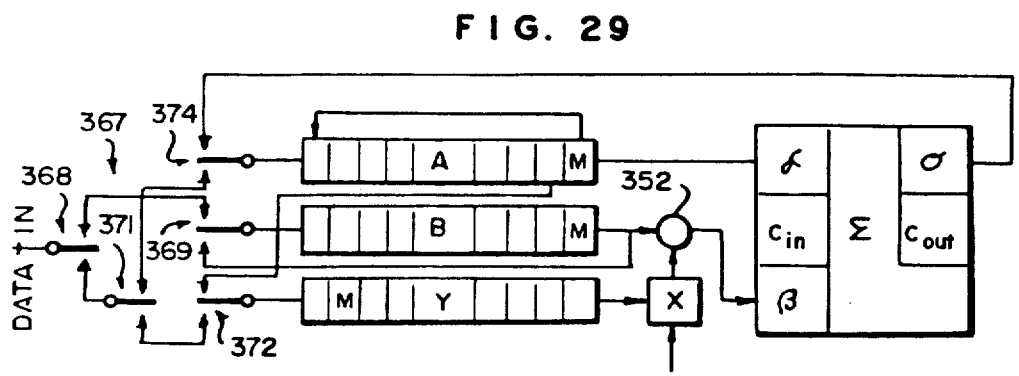
FIG. 29 is a logic block diagram of a serial adder and multiplier.
Figure 28:
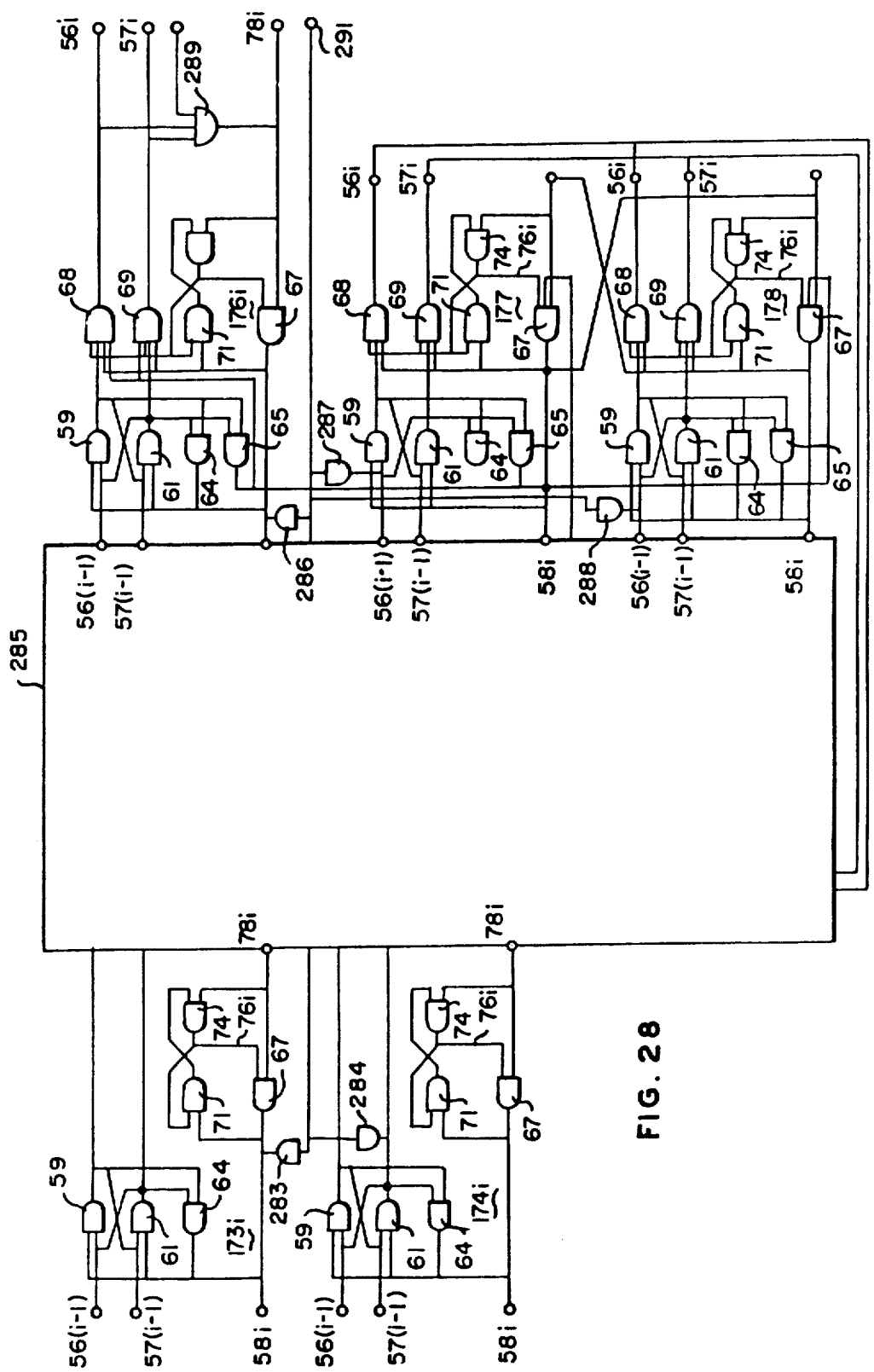
FIG. 28 is the circuit diagram of FIG. 21 with presetting gates added to adopt the real-time adder of FIG. 21 to use in the circuits of FIGS. 27 and 30.
Figure 30A:
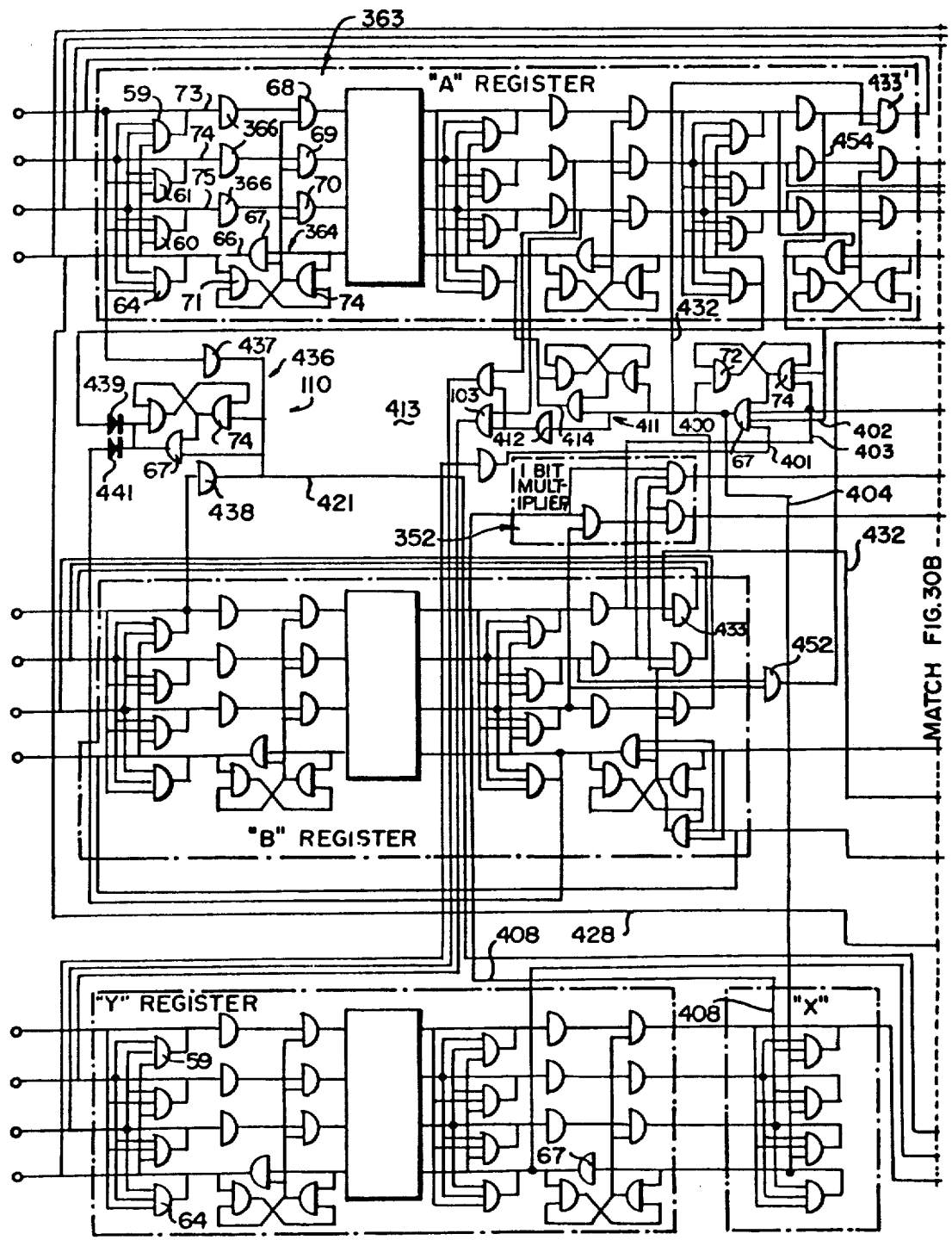
FIG. 30 is a circuit diagram of the adder and multiplier of FIG. 29.
Figure 30B:
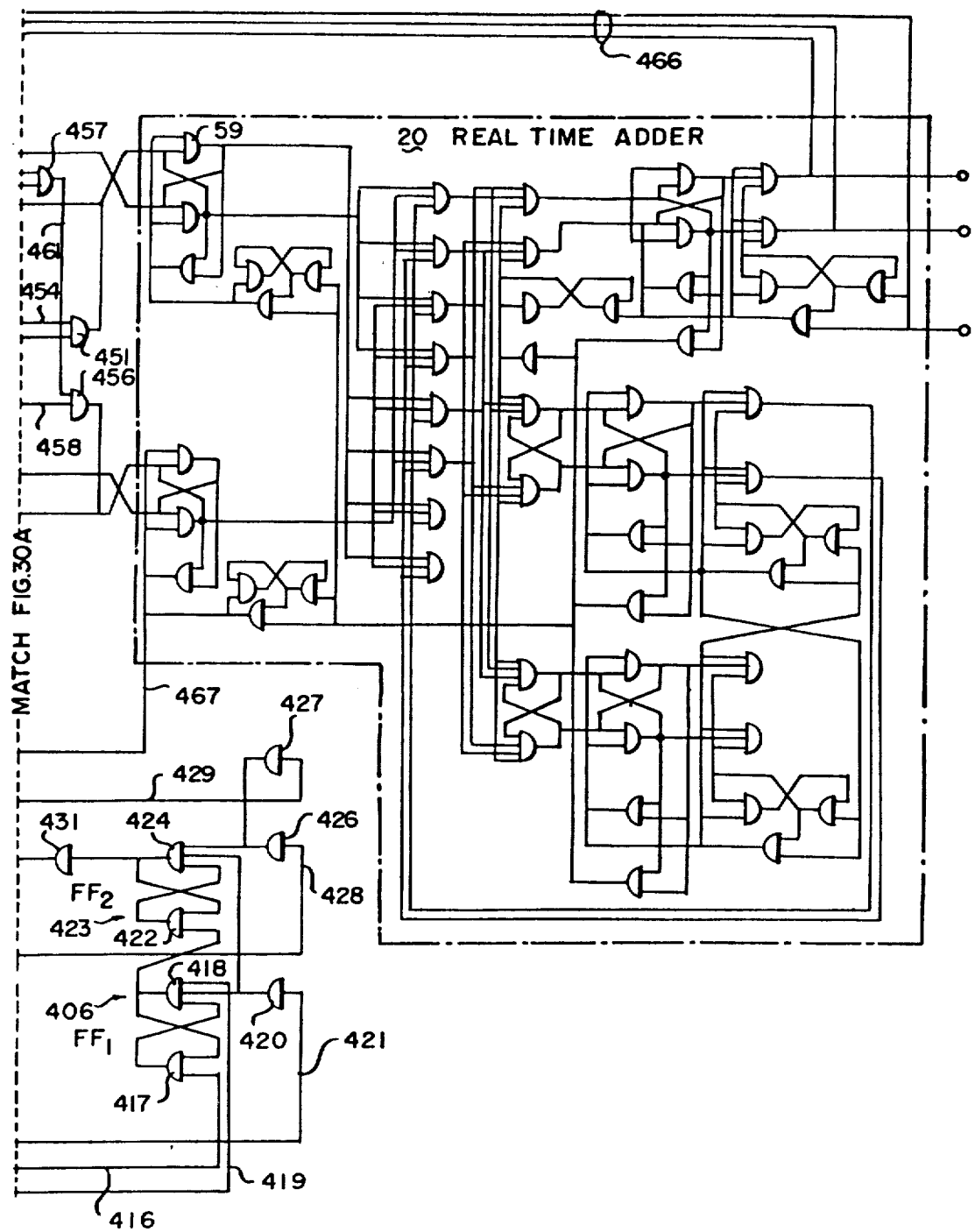

As an example of specific computer circuits that may be developed using the techniques of the present invention there is presented in FIG. 27 a real-time multiplier and in FIGS. 29 and 30 a combined serial multiplier and adder. In order to develop these circuits, however, there must be provided a "clear" circuit, FIG. 25, and a 1-bit multiplier with fan-out, FIG. 26. FIG. 28 discloses the additional gating required in the real-time adder of FIG. 21, to preset the adder to the conditions required in the multipliers.

Figure 25:
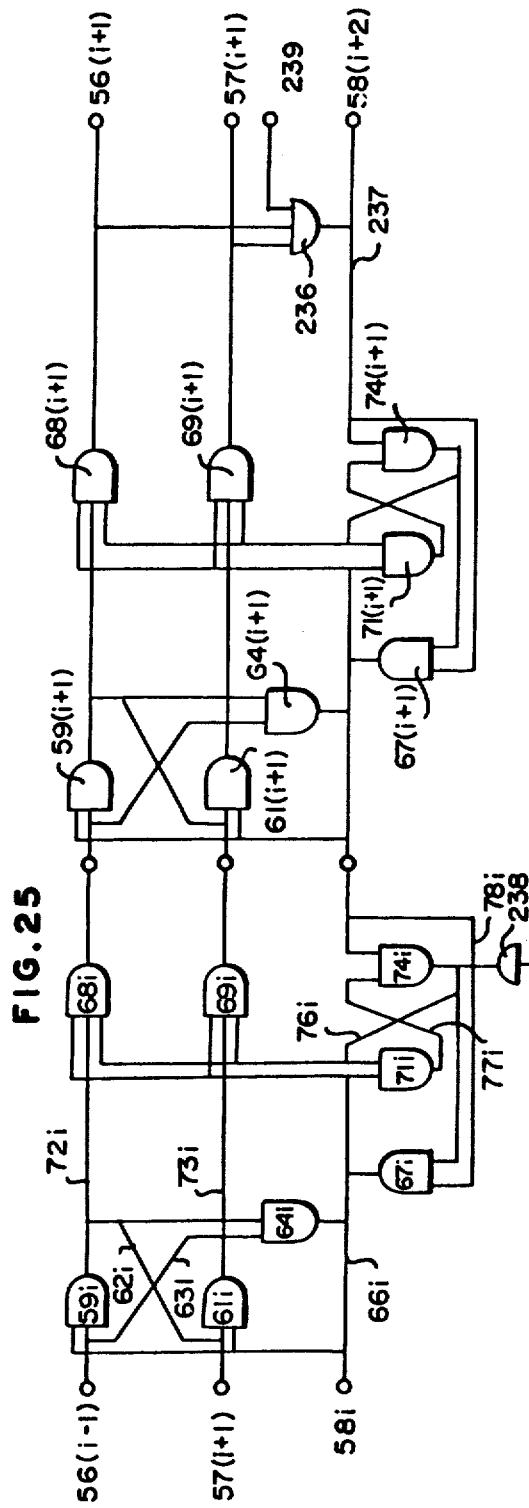
FIG. 25 is the circuit diagram of FIG. 3 with clear and hold gates added.

Referring now specifically to FIG. 25 of the accompanying drawings, there is illustrated a net of the present invention having a circuit for clearing all or any selected part of the information stored in a given chain of nets. The circuit of FIG. 3 has added thereto a NAND gate 236 having its output lead 237 connected to terminal 58(i+2) of FIG. 25. It will be noted that FIG. 25 is identical with FIG. 3 except for the addition of the gate 236 and the addition of a further gate 238 which applies signals to the gate 67i.

The NAND gate 236 has three input leads, one connected to terminal 57(i+1), a second input lead connected to terminal 56(i+1), a third lead connected to a terminal 239 to which may be applied gating or clear signals, depending upon the conditions under which the signal is applied.

In operation, if a zero or grounded signal is applied to the terminal 239, a one is forced to appear at the output lead 237 and the control gates 67(i+1), 71(i+1) and 64(i+1) assume the initial or starting conditions illustrated in the graph of FIG. 4 of the accompanying drawings. Specifically a 0 appears at the output of the gate 74(i+1) and a 1 appears at the output of the gate 67(i+1). A 0 is applied to the output gates 68(i+1) and 69(i+1) from the gate 74(i+1) and the output gates are closed. Thus 1's appear at the output terminals 56(i+1) and 57(i+1) which, due to the 0 applied to the terminal 239 cannot change the condition of the signal on the lead 237.

If it is assumed that information is applied at the terminals 56i and 57i, serving as input terminals to the second stage of the chain, then a signal appears at the output of the gates 59(i+1) and 61(i+1, that is, one of the leads has a 0 and one of the leads has a 1. If now it is desired to clear the system, a 1 is applied to the terminal 239. Since the gates 68(i+1) and 69(i+1) have been closed and 1's appear on two of the input leads to the gate 236, the application of a 1 to the terminal 239 causes a 0 to appear on the lead 237. The gate 74(i+1) now produces a 1 at its output terminals and the output gates 68(i+1) and 69(i+1) are opened and information is transmitted to the outside world. The condition at the input leads to the gate 236 is now changed since one of the leads now has a 0 applied thereto and thus a 1 is reestablished on the lead 237 closing the gates 68(i+1) and 69(i+1) and informing the next stage upstream from the output stage to transmit information to the output stage. If the terminal 239 remains in the 1 state as soon as information is applied to the gates 59(i+1) and 61(i+1) the information re-opens the gates 68(i+1) and 69(i+1) via the gate 74(i+1) and the entire cycle repeats itself.

This cycle will repeat until all information is transmitted out of the chain and the terminals 56(i+1) and 57(i+1) assume a permanent neutral condition due to no further information. Once transmission of information down the chain terminates, the signal may be removed from the terminal 239 and further transmission inhibited.

It may be desirable to limit the portion of a chain from which information is extracted. It is assumed for purposes of illustration that the i stage of FIG. 25 is somewhat upstream from the (i+1) stage of FIG. 25, that is, there are several stages in between, and it may also be assumed that there are further stages upstream of the i stage. It may be desired not to clear the information from the stages upstream of the i stage. In order to prevent the extraction of such information, a single input NAND gate 238 has its input connected to the lead 76i. If a 1 is applied to the gate 238 the output is a 0 and the lead 76i is held at 0. Therefore the gates 68i and 69i cannot be opened and transmission from this stage and upstream thereof cannot be effected. Thus the addition of the single gate 238 permits selection of the portion of the system that will be cleared.

Figure 26:
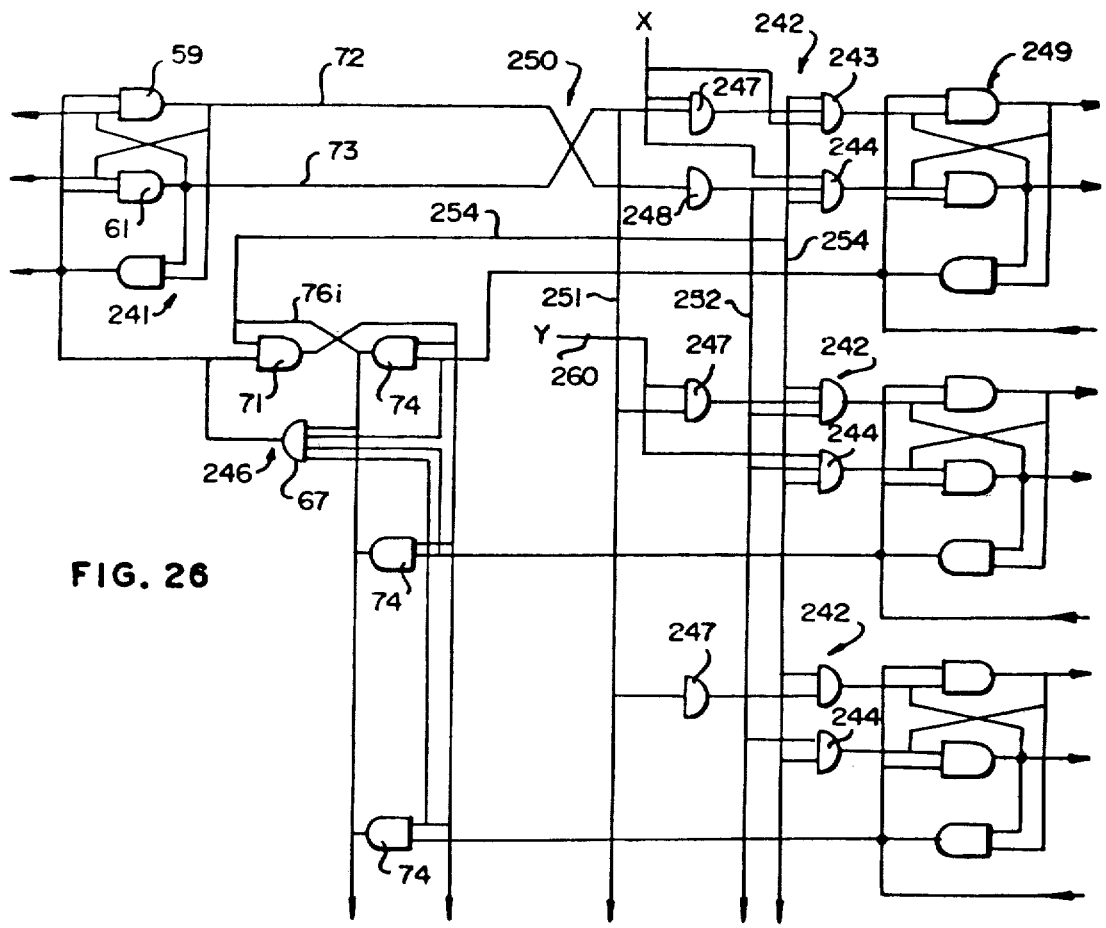
FIG. 26 is a circuit diagram of a chain having fan-out with multiplication.

Referring now specifically to FIG. 26 of the accompanying drawings, there is illustrated a circuit for producing fan-out of information from a single chain of nets into numerous chains (3 in the drawing) and incorporating 1-bit multipliers at the input to each of the chains at the fan-out location; thus providing the ability to fan-out into various stages and to multiply the information going into each of the separate channels by the same or a different multiplier bit. Referring specifically to the circuits of FIG. 26, the conventional stage is divided into two parts; an input section generally designated by reference numeral 241 consisting of gates 59, 61 and 64, an output section 242 comprising two gates 243 and 244 serving the same function as the gates 68 and 69 of the conventional stage and in addition serving as a part of a 1-bit multiplier. There is provided a control section 246 having the gate 71, three gates 74 and one gate 67 which now includes four inputs, one for each downstream net and a common output from the gates 74, there being one such gate for each downstream net. Disposed between the input section 241 and the output gates 242 are two additional gates 247 and 248 which include a part of the 1-bit multiplier for the upper net.

The gates 243 and 244 may be followed by a net of the present invention designated by the reference numeral 249 or by an output circuit. Leads 72 and 73 from the gates 59 and 61 cross over at location 250 so that lead 73 forms an input to gate 247 and the lead 72 forms one input to the gate 248.

In the example illustrated, the output section 242 is repeated two times below the uppermost section and the gate 247 is repeated for each of the additional two sections. The gate 248 is not repeated. The lead 73 is connected via an additional lead 251 to the additional gates 247 and the output of gate 248 in addition to being connected to the input of the uppermost gate 244 is connected via a lead 252 to the inputs to gates 244 of the additional output sections 242. To complete the uppermost string a lead 253 is connected to an input lead to gate 247 and also to gate 244, while the output of the gate 74 of the control section 246 is connected to an input lead 254 to all of the gates 243 and 244 of the output sections.

To understand the operation of the device some of the philosophy must first be presented. It will be noted that in any of the NAND gates employed, a reversal of signal takes place in going through the gate. Thus in a one-input NAND gate a 0 at the input produces a 1 at the output and a 1 at the input produces a 0 at the output. In order to effect multiplication by a signal on a single lead then, such as the lead 253, the single signal must produce opposite effects on the two output signals of the net. The signal on the lead 253 is applied to the gate 247 which is of the same rank as gate 248 but in order to use that same signal to produce the reverse effect on the other output, the signal on lead 253 must first be effectively reversed relative to the signal applied to gate 247. Thus the signal on the lead 253 is applied to gate 247 in the upper lead of the system whereas it is applied to the output gate 244 which is downstream of the gate 247 by one gate and signal reversal is affected. Assuming for the moment that a signal of 1 (1,0) is applied to the system under these circumstances, if a 1 is applied to the lead 253 the output of the gate 243 should be 1 and the output of the gate 244 should be a 0 to conform to the convention adopted for the systems of the present invention. If the signal on 253 were applied to gates of the same rank, such as gates 247 and 248, and the signal and the multiplier were 0's, then the output signal from 243 and 244 would both be 0's, a meaningless signal. However with the 0 multiplier applied to gates 247 and 244, a 1 is applied to the gate 243 producing a 0 output on its lead, and a 0 is applied to gate 244 to produce a 1 on its output lead and intelligent information, a 0, is generated.

Use is made of this phenomenon also in control of the output leads. It will be noted in FIG. 3 that the lead 66$i$ is connected as a control on the gates 68$i$ and 69$i$. In the circuit of FIG. 26 this control is eliminated and the control provided by the lead 76$i$ is the only control required; this being applied in FIG. 26 by the lead 254 to the output gates of the section 242. The reason here again is due to the phase reversal provided by the gates 247 and 248. Referring again to FIG. 3, if two 1's appeared on the leads 72, 73, all other things being equal, the signals appearing at terminal 56, 57 would be two 0's which is no information so far as the system is concerned and the system cannot tolerate such a condition. However with the phase reversal gates 247, 248, if two 1's appeared on leads 72, 73, then these would appear as simply gating signals or 0's at 243 and 244 and produce 1's at the output of the gates 243, 244 which are intelligible to the system. Thus, the additional control from the gate 67$i$ to prevent output through the gates 68, 69 at a time when leads 72, 73 might have 1's theron is not required in the system of FIG. 26.

Referring now to the operation of the system, suppose that a 0 is applied to the input to gate 59 and a 1 is applied to the input to gate 61 (a 0 representation) and concurrently a 1 is applied to the lead 253. Under these conditions 1, 0 appears on lead 72, 73, respectively, and are applied to gates 248 and 247, respectively, due to the cross-over at the point 250. The 0 applied to the input to 247 forces a 1 output regardless of what is on the lead 253 and the 1 output produces a 0 at the output gate 243 when the gate is opened due to proper operation of the control section 246. The 1 applied to the gate 248 appears as a 0 at the input to the gate 244 and forces a 1 output at that gate regardless of what appears on the lead 253. Thus the 0, 1 condition at the input to the gates 59 and 61 produces a 0, 1 condition at the output of the gates 243, 244 as it should since a 0 multiplied by anything will still produce a 0. If a 1, 0 couple is applied to the gates 59, 61 and a 1 is applied to the lead 253, then a 1 is applied to the gate 247 which with the 1 on 253 produces a 0 at the output of 247 and a 1 at the output of 243. The 0 on lead 72 produces a 1 at the output of gate 248 which together with the 1 signals applied to the other input leads 253 and 254 produces a 0 at the output of gate 244. Thus a 1, 0 condition ($1 \times 1 = 1$) has been transferred to net 249. If a 0 were applied to lead 253 the outputs of gate 247 and 244 would be both 1's, and this, together with the condition of a 1 on lead 254 from the control section 246, would generate a 0, 1 condition (anything times 0=0) at the inputs of net 249, regardless of the condition 0, 1 or 1, 0 present in net 241.

The same situation is true as to each of the stages arranged below the uppermost stage because each set of gates is identical. The gate 248 is not required in the lower gates because the output to those gates via the lead 252 is already reversed by the gate 248 in the upper string or chain. Multiplier bits may be applied to additional leads, such as 260 to the second set of gates, and so on down the line depending upon what multiplier is desired.

The control of the feed of information from the input tristable flip-flop 59, 61 and 64 is under control of the control section 246. In this arrangement there are three gates 74 each serving the same function as the individual gate 74 of a more conventional control section as illustrated in FIG. 3. The gate 67 now responds to the feedback signals from all of the chains and thus information transfer begins only when all of the sections 249 signal that they are in the neutral state. It is only when all of the stages downstream of the multiplier stages have received the information that all of the gates 74 receive an input signal of 1 and that the gate 67 produces the output of 0 to initiate the next transfer.

The 1-bit multiplier of FIG. 26 with fan-out can be employed in a parallel real-time multiplier as illustrated in FIG. 27 of the accompanying drawings. In this multiplier it is assumed for purposes of example only, that a four element number $a_0+a_1+a_2+a_3$ is to be multiplied by another four element number $b_0+b_1+b_2+b_3$. The $a_0$ through $a_3$ number is carried in a first register 265 with each element of the number being applied to a different 1-bit multiplier 261 through 264. The a-numbers are applied to the leads corresponding to the leads 253, 260, etc. of FIG. 26. The b-numbers are applied one at a time and in common to each of the 1-bit multipliers via a lead 270 (leads 251 and 252 of FIG. 26). The individual elements of the b-number are carried by a register 271 constituting four stages such as illustrated in FIG. 3 and comprising stages 266, 267, 268 and 269.

Initially the product of the 1-bit multipliers are applied to real-time full adders which may be of the type illustrated in FIG. 21 with three such real-time adders being employed to provide the products of the four element numbers. The output signals of the 1-bit multipliers are applied via lead 272 to real-time adder 273, lead 274 to real-time adder 276, lead 277 to real-time adder 278 and via two cascaded nets or stages 279 and 281 to the second input of the real-time adder 278. The stages 279, 281 provide a delay for purposes to be described subsequently. The output signal from the real-time adder 276 constitutes the second input signal to the adder 273. The output signal of the adder 278 constitutes the second input signal to adder 276.

In operation, the numbers $a_0$, $a_1$, $a_2$ and $a_3$ are applied to their respective 1-bit multipliers and remain there during the entire multiplication process. The numbers $b_0$, $b_1$, $b_2$ and $b_3$ are shifted through the circuit as required. Initially the number $b_0$ is applied to the lead 270 so that the product $a_0b_0$ is developed on the lead 272, the product $a_1b_0$ is developed on the lead 274, the product $a_2b_0$ is developed on the lead 277 and the product $a_3b_0$ is stored in the stage 279. For proper operation during the initial cycle 0's must appear at the second input to each real-time adder so that for instance $a_0b_0$ is added to 0 and the first segment of the product which appears on lead 282 is $a_0b_0$ as it should be. However under starting conditions the output signal of adder 276 would be N. The circuitry for forcing 0's at the lower inputs of adders 273, 276 and 278 on start-up will be described subsequently.

Concurrently, with development of output signal $a_0b_0$ the product $a_1b_0$ appears at the output of the adder 276 and thus now is ready for application to the real-time adder 273. The product $a_2b_0$ appears at the output of the adder 278 and may now be applied to the adder 276. As indicated above, the product $a_3b_0$ is available at the stage 279. Upon completion of the first cycle of operation as set forth above, the register 271 is shifted so that the number $b_1$ is now applied to the 1-bit multiplier stages. In consequence, product $a_0b_1$ is applied to the adder 273 concurrently with the product from the previous multiplication $a_1b_0$. There was no carry from the prior operation and thus the output signal appearing on the lead 282 is $a_1b_0+a_0b_1$ which is the proper second term of the product. The output signal from the adder 276 is now $a_2b_0$ (this being available from the adder 278) plus $a_1b_1$ the product of the second cycle of multiplication by the 1-bit multiplier 262. The output signal of the adder 278 is $a_2b_1$ the current product of the multiplier 263 plus $a_3b_0$ which is provided from the stage 281 it being the product of prior cycle of the 1-bit multiplier 264, which was stored in stage 279.

It can be seen from above that as each product is developed and applied to its real-time adder it is added to the sum developed by the adder associated with the multiplier of increasing rank with a 1 cycle delay which is the basic multiplication operation on a real-time basis. The outputs of the various real-time adders 273, 276 and 278, as a function of each cycle of the multiplier, is set forth in Table 2 below, with the output of the adder 273 ($\epsilon_0$) representing the actual multiplier output signal. The designations $c_1 - c_7$ represent the output at each of the adders 273, 276 and 278 at the end of each cycle with the subscripts designating the cycle.

TABLE 2

| | $\Sigma_0(273)$ | $\Sigma_1(276)$ | $\Sigma_2(278)$ |
|---|---|---|---|
| $c_1$ | $a_0b_0$ | $a_1b_0$ | $a_2b_0$ |
| $c_2$ | $a_1b_0+a_0b_1$ | $a_2b_0+a_1b_1$ | $a_3b_0+a_2b_1$ |
| $c_3$ | $a_2b_0+a_1b_1+a_0b_2$ | $a_3b_0+a_2b_1+a_1b_2$ | $a_3b_1+a_2b_2$ |
| $c_4$ | $a_3b_0+a_2b_1+a_1b_2+a_0b_3$ | $a_3b_1+a_2b_2+a_1b_3$ | $a_3b_2+a_2b_3$ |
| $c_5$ | $a_3b_1+a_2b_2+a_1b_3$ | $a_3b_2+a_2b_3$ | $a_3b_3$ |
| $c_6$ | $a_3b_2+a_2b_3$ | $a_3b_3$ | |
| $c_7$ | $a_3b_3$ | | |

Cycling of information through the stages 271 is controlled by the control sections of the input lines of the real-time adders as indicated in FIG. 26 where the stages 249 represent the input stages 173$i$ of the real-time adders of FIG. 21. The number of stages required in FIG. 27 is only one more than illustrated in FIG. 26 with the control section of the stage 279 (FIG. 27) providing the fourth control to the control section of the stage 266 of the register 271. So far as the register 265 is concerned, it may represent any suitable type of storage register in which the information is gated in and held until multiplication is finished at which time it may be retained to multiply a further number or it may be gated out to be replaced by a still other number as desired. For purposes of a more complete understanding of the circuit of FIG. 27 reference is made for the moment to FIG. 21. It will be noted that information is not gated into the adder until appropriate signals appear on the control terminals 58$i$ of nets 173$i$ and 174$i$ and information is not gated out until an appropriate signal appears on the terminal 78$i$ of net 176$i$. Assuming latter terminal 78$i$ is held for continuous read-out then as each cycle of addition is finished by each adder the appropriate signals appear on the terminals 58$i$ of 173$i$ and 174$i$. For instance, assume that the lead 58$i$ of net 173$i$ is connected to control gates 74 and 67 of stage 246 of FIG. 26 and the lead 58$i$ of net 174$i$ is connected to the control 78$i$ of net 176$i$ of the preceding real-time adder, no information will move in the register 271 until all adders have received the multiplier product and until the lower input of the adder has received a number from the prior real-time adder. The signal appearing on the lead 58$i$ of net 173$i$ may not be effective because any one of the other stages of addition may not have completed the addition function. Under these circumstances the information supplied by the previous adder if received simply remains in the lower ordered stage while the higher ordered stage waits for completion of the associated cycle in all of the adders.

The use of the two stages 279 and 281 at the lower input to the adder 278 is not required but actually improves the speed of operation of the apparatus. Only one stage such as 281 is required in order to store the information to provide the necessary one cycle delay. However, if only a single stage is employed then a full cycle of operation of all of the adders 273, 276 and 278 must be completed before the information can be accepted from the 1-bit multiplier 264 for storage. However if the additional stage 279 is employed, then the product from the stage 264 may be immediately stored in the stage 279 regardless of the condition of the adder 278 and when the adder 278 is available to receive information then the signaling through the gate 281 can accomplish the transfer. Thus the change of the numbers supplied to the lead 270 is independent of clearing of the stage 281 which otherwise would add a delay after the signaling by the adder 278 that it is available to receive a new munber.

If the stage 271 is to store a number permanently, that is, a multiplier that is to be used with all numbers applied to the register 265, then the register 271 may be closed on itself to provide a continuous feed around loop.

As previously indicated, the real-time adders employed in FIG. 27 must be preset to specific conditions upon initiation of a cycle of multiplication. Referring to FIG. 28, which is a duplicate of FIG. 21 with a few additional gates, the stages 173$i$, 176$i$ and 178$i$ are to be set to neutral and stages 174$i$ and 177$i$ are to be set to zero. The reason behind this is, 173$i$ must be ready to accept the next unit of information from the 1-bit multiplier. In the first cycle a 0 must be added to the product so stage 174$i$ is set to 0. The carry is a 0 so stage 177$i$ is set to 0. At the start of operation, the adder has no information to transmit so stage 176$i$ is set to neutral and stage 178$i$ must be available to accept the next carry so it is set to neutral.

Five NAND gates 283, 284, 286, 287 and 288 apply signals to stages 173$i$, 174$i$, 176$i$, 177$i$ and 178$i$ respectively. When initialization is required, a 1 signal is applied to terminal 291 which produces a 0 at the output of each of the aforesaid gates. In consequence, the gates 59 and 61 of stages 173$i$, 176$i$ and 178$i$ receive 0 inputs and both produce 1 outputs, the neutral condition. The 0 outputs of gates 284 and 287 are applied to the output of gates 61 and thus produce 0's in the stages 174$i$ and 177$i$.

Prior to initialization or more particularly as the first step thereof, clear gate 289 is actuated to clear the adder and the elements upstream of the adder. The controls illustrated in FIG. 28 are applied to each real-time adder employed in the real-time multiplier.

Referring now specifically to FIGS. 29 and 30 and initially to FIG. 29 only, there is disclosed a combined serial multiplier and adder employing the real-time adder of FIG. 21, designated in FIGS. 29 and 30 by the reference numeral 351. In FIG. 29 the 1-bit multiplier of FIG. 26, designated herein by the reference numeral 352, is employed to multiply numbers entered in B and Y registers. The circuits of FIGS. 29 and 30 employs three registers, A, B and Y which comprise chains of nets of the present invention. These chains however employ the ternary logic of FIG. 23 rather than the binary logic of FIG. 3 of the accompanying drawings. In this context reference is made initially to the input stage "$a_n$" of the A register of FIG. 30. There are provided three input gates 59, 61 and 60 and a neutral gate 64. Each of these gates supplies an output lead designated 73, 74, 75 and 66 respectively. The signals on these leads for various designations are as follows: For a marker signal, M, the lead 73 has a 0 and the other leads have 1's; for a "1" the lead 74 has a 0 and the other leads have 1's; for a 0 the lead 75 has a 0 and the remaining leads have a 1 and for a neutral state the lead 66 has a 0 and the remaining leads have a 1. The stage under consideration; that is, the $a_n$ stage, employs output gates, three in number, generally designated by reference numeral 363 and a conventional net control circuit generally designated by the reference numeral 364. Three inversion gates 366 are provided in the leads 73, 74 and 75, respectively. The gates 366 invert the signals at the output of the gates 59-61 so that the gates 68-70 may be two input rather than four input gates. Specifically, in FIG. 23, gate 68, for instance, produces a 0 output by looking at gate 60, 61 and 64 but not gate 59. If gates 60, 61 and 64 product 1 outputs then the stage is not neutral (gate 64) is not a 0 (gate 60) and is not a 1 (gate 61). Thus the stage must be in some other state ("marker" state in FIG. 30) and thus gate 68 must product a 0 output. In FIG. 30, the 0 output is produced directly. If gate 59 is 0, then the associated gate 366, produces a 1 and the gate 68 produces a 0 when information is to be transmitted; i.e. gate 74 produces a 1.

The particular net just discussed constituted the stage $a_n$ of the A register. Stages $(n-1)$ to $a_2$ are illustrated by a block and stages $a_1$ and $a_0$ are fully illustrated for purposes to become apparent subsequently. In the B register $b_n$ and $b_0$ only are illustrated and in the Y register $y_n$ and $y_0$ only are illustrated. The last net or stage of the register Y is designated by an "X" in FIG. 29 and carries a corresponding designation in FIG. 30. This stage holds the number or quantity by which the quantity in the B register is multiplied at any given time. The multiplication format is such that the Y register stores the multiplier and the B register stores the multiplicand. One of the bits in the Y register is shifted into the x stage and then all of the B numbers are run through the 1-bit multiplier 352 and concurrently recirculated back into the B register. When a complete cycle is finished, a new Y number is gated from Y into X for the next cycle of multiplication.

In FIG. 29 the input circuitry to the system comprises a plurality of switches generally designated by the reference numeral 367 which permit an addition or multiplication mode to be employed. Initially multiplication is considered. Under these circumstances a gate 368 is initially in the up-contact position, and a gate 369 is also in the up-contact position. Thus the first number to enter the system is directed to the B register. The number inserted into the B register comprises a marker signal followed by the actual B number. The B register must always be at least one digit longer than the longest number to be entered therein for purposes to become apparent subsequently,. Thus the least significant digit stored in the B register is a marker signal. If addition is desired the switches 367 will be set so that the next number entered goes into the A register preceded by a marker signal. However, multiplication is now being described and only a marker signal is stored in the A register. The switches 367 are now set so as to insert the next number into the Y register. Under these circumstances the switch 368 is in the down-position, a switch 371 is in the down-position, and a switch 372 in in the down-position. The Y register is now loaded and the last bit entered in the Y register is a marker signal. The Y register is of such a length that at all times at least the last stage; that is, $y_n$, is not occupied initially and a neutral condition is stored therein.

The switches 367 may now be set for multiplication. In this case leads 373 from the real-time adder 151 are connected to the input of the A register through a switch 374 which is now set in its up-contact position.

The switch 369 is moved to its down-contact position so that information in the B register recirculates. The switch 372 is set in its up-contact position so that when the $a_1$ stage of the A register is read-out it reads into the Y register. It should be noted that it is the content of the $a_1$ stage of the A register that is fed to the input of the Y register and not the content of the $a_0$ stage. The conditions now stored are $a_0$, $b_0$ and $n < y < 0$ are storing a marker signal and $y_n$ is storing a neutral.

When the above conditions are achieved, and reference is made to a control circuit generally designated in FIG. 30 by the reference numeral 400, the output of the gate 67 of circuit 400 is a 0. Specifically a lead 401 senses the condition of the $y_n$ stage, lead 402 sense the condition of the $a_0$ stage and lead 403 senses the condition of the $b_0$ stage. When $a_0$ and $b_0$ are storing markers, and $y_n$ is neutral, 1's appear on each of these leads and from the lead from the output of the gate 74 of cicuit 400 so that a 0 appears at the output of the gate 67 and is applied via lead 404 to force the X register to assume a neutral condition. The x stage assumes a neutral condition since the lead 404 applies a 0 to the input of the upper three gates of the x stage but not to the lower-most gate. Therefore the upper three gates produce 1 outputs and the lower-most stage produces a 0 output. With x neutral $y_0$ shifts into x and the entire Y register shifts. This action in conjunction with the action of other circuits to be described subsequently cause $a_1$ to shift into $y_n$, but in the initial condition which is now being treated the transfer is only of a neutral state into a neutral state.

The A to Y transfer is employed in the system of FIG. 29 to accommodate the larger product. Specifically the terms of the product of two numbers is equal to the sum of the terms of the two numbers. Specifically if y stores $a_1 + a_0$ and B stores $b_1 + b_0$ the product contains four terms. In the present circuit, the register A is approximately the same length as B and Y, while the terms of the product equals $B + Y$. In this system the terms of the product are stored during processing in A while final products are transferred from $a_1$ to $y_n$ as the Y numbers are shifted out into X and then discarded. The final number will be found with the least significant digit in $y_0$ and the most significant digit in $a_n$ if the actual product is that long.

As previously indicated the multiplier is stored in the Y register. Each time a number is shifted into the X register, the entire B register is passed through the 1-bit multiplier 352, which is also supplied via lead 408 from the 0 lead of the X register. At the end of the multiplication of the entire B register by the single y number stored in the X register, the X and Y registers shift to insert a new Y number in X.

The transfer from $y_0$ to x must be detected so that the system may commence a new multiplication cycle and more particularly to start again the cycling of the B register through the 1-bit multiplier. It is necessary to store the fact that a transfer has been made from $y_0$ to x, this being noted by flip-flop 406, because it may not be possible to start multiplication immediately upon the transfer from $y_0$ to X. It may be that information is being fed at the time of this transfer, from the output of the real-time adder to the input of the A register so that a delay must be permitted by the system. The flip-flop 406 is employed to note the transfer from $y_0$ to x so that when a transfer from the real-time adder 351 to the A register has been completed the next cycle of multiplication of the B register may take place.

Continuing with the start-up of the system, x is now storing a number to be multiplied. The transfer from $y_0$ to x has been noted in the flip-flop 406, (as will be described subsequently) a number is not being transferred from the real-time adder to the A register and operation of the system may commence. It is now necessary to remove the M's from the least significant digits of the A and B registers so that multiplication may proceed. As previously indicated, the control circuit 400 produces a negative pulse when $a_o$ is equal to M, $b_o$ is equal to M and $y_n$ is neutral. As further previously indicated, the output pulse from the control 400 sets the X register to neutral so as to permit the $y_o$ to transfer thereto. This same pulse, that is, the 0 pulse from the gate 67 of circuit 400, is applied to another control circuit 411 and concurrently to a gate 412. As a result of this action, gate 412 produces a positive pulse which is applied to two gates both bearing the numeral 103 and vertically arranged. The other inputs to the gates 103 are connected to the 1 and 0 logic lines of the $a_l$ stage. The positive pulse applied by the gate 412 to the gates 103 transfers the information in $a_l$ down to $y_n$ which in this instance, is a neutral.

The 0 pulse produced by the gate 67 of the control circuit 400 is also applied to the gate 67 of the control 411 which now produces a 1 at its output. When the 0 pulse from circuit 400 terminates due to the unstable nature of the 0 output of the control circuit (see FIG. 4) the gate 67 of circuit 411 produces a 0 pulse followed by a 1 pulse. The 0 pulse sets stage $a_l$ to neutral by pulling the neutral line down to 0 via lead 414. With $a_l$ now reset to a neutral state, the next unit of information, that is, the unit of information in $a_2$, is now transferable to $a_l$.

Returning now to the flip-flop 406, when information is transferred from $y_o$ to x, $y_o$ temporarily assumes a neutral condition to effect transfer of information from $y_l$ to $y_o$. When $y_o$ is neutral and both $a_o$ and $b_o$ have M's stored therein, the flip-flop 406 assumes a 1 condition since lead 416 is connected to lead 66 of $y_o$. Gate 417 of flip-flop 406 produces a 1 output to the gate 418 which receives another 1 from lead 419 connected to the M output lead of the X register. Since X is storing information the M lead, 419, is a 1. A third input to the gate 418 is derived from the gate 420 which has a single input via a lead 421 which detects the status of the $a_n$ and $b_n$ stages. Specifically, lead 421 has a 0 developed thereon unless both $a_n$ and $b_n$ stages have an M stored therein. At this time $a_n$ and $b_n$ have either a neutral or an information unit stored therein and therefore the lead 421 is a 0. The output of the gate 420 is a 1 and therefore the output of the gate 418 is a 0. The 0 appearing at the output of gate 418 is applied as an input signal to a gate 422 of an upper flip-flop 423. An upper gate 424 of the flip-flop receives the output of the gate 422, the output of the gate 420 and the coupled outputs of two gates 426 and 427. The gate 426 detects, via a lead 428, the condition of the $a_n$ stage and the gate 427, via a lead 429, detects the condition of the $b_n$ stage. If both of these stages are neutral as they now are, then 0's are applied to the leads 429 and 428 and a 1 is applied to the gate 424. The gate 424 now has three 1's applied thereto and produces a 0 at its output which is inverted in a gate 431 to apply a 1 via a lead 432, to gate 433 of the $b_o$ stage and the gate 433 of the $a_o$ stage. This signal opens the gates in the marker leads of the $a_o$ and $b_o$ stages and permits the transfer of the marker signal to the $a_n$ and $b_n$ stages.

Thus, the function of the circuit just described is to first determine whether a marker signal is stored in the $a_o$ and $b_o$ stages and if the $a_n$ and $b_n$ stages are in the neutral condition. If these conditions are detected then the marker is transferred to the $a_n$ and the $b_n$ stages and the least significant digit of the B number is shifted into the $b_o$ stage and a neutral is placed in the $a_o$ stage because $a_l$ has previously been forced to a neutral.

It has been stated previously that the lead 421 has a 0 thereon unless both $a_n$ and $b_n$ stages have an M stored therein. The determination of this condition is made by a circuit generally designated by the reference numeral 436. A gate 437 detects the M lead in the stage $a_n$ while a gate 438 detects the condition of the M lead of the stage $b_n$. Lead 421 has a 0 thereon unless both $b_n$ and $a_n$ are in the marker condition. In this case a 0 is applied to both of the two gates and a 1 appears at 421.

When the marker signals are applied to $a_n$ and $b_n$, a 1 appears at the output of both the gates 437 and 438 at least momentarily. This condition causes the control circuit 436 to cycle, initially producing a 0 at the output of the gate 67 and then producing a 1. The 0 signal is applied through two diodes, 439 and 441, to set the stages $a_o$ and $b_o$ to neutral respectively. Concurrently the flip-flops 406 and 423 are set via lead 421 to their initial states, that is, 0 conditions. Since $b_o$ has been set to neutral, information from $b_1$ is transferred thereto and the same is true of transfer $a_l$ to $a_o$. In this manner the marker signal is reinserted in $a_o$.

In the initial condition of operation, a first product of the 1-bit multiplier must be added to a 0 in the real-time adder. This is the same as was true in the parallel multiplier. However in the present circuit the A register has a marker stored in the $a_o$ location. The alpha input to the real-time adder 351 cannot interpret the marker but can only respond to 1's and o's.

As indicated immediately above, the information applied to the alpha input during the first cycle of operation must be a 0 and this is accomplished by means of a gate 451 in conjunction with a gate 452. If the gate 452 detects information in the $b_o$ register, it produces a 1 on its output lead 453, which is connected as one input to the gate 451. The second input to the gate 451 determines, via a lead 454, whether $a_o$ has a marker therein. If a marker signal is stored in $a_o$ a 1 is applied to lead 454 and both leads to gate 451 have 1's applied thereto and the output of the gate 451 is a 0. This 0 signal is applied to the alpha input of adder 351 and specifically to the gate 59.

All conditions have now been satisfied to start the multiplications operation. Both the X register and $b_o$ stage of the B register have information therein and a product is applied to the beta input of the real-time adder. A zero is applied to the alpha input and the carry inputs have been preset as described relative to the circuit of FIG. 28. The first product is added to 0 and from the sigma output 470 of the real-time adder and via a group of leads generally designated by the reference numeral 466, is applied to the input of the A register. The output signal from the control section of the beta input 471 of the real-time adder signals, via a lead 467, that it is neutral thereby accepting a new B number and stepping the B register so that the $b_l$ number is now applied to the multiplier 352 and a second input signal is applied to beta, while the number in x remains the same. In the meantime M is still situated in $a_o$ and the first product is situated in $a_l$ and can now be transferred to $y_n$. However the transfer cannot be made until M is situated at both $a_o$ and $b_o$. Therefore the next stage of multiplication takes place with $b_l$ now in the $b_o$ position and $y_o$ remaining in the x position. Successive multiplications occur with O being added to the alpha input to the real-time adder at each cycle during this initial step. This cycling continues until the B register is exhausted and the marker signal appears in the $b_o$ location with $b_l$ and successive numbers of increasing rank following back through the B register. The conditions for again effecting a transfer from $a_l$ to $y_n$ have been established, that is, a marker appears in $a_o$ and $b_o$, $y_n$ is neutral and now through operation of the various circuits previously described, $a_l$ is shifted to $y_n$ and x is forced to neutral so that the next unit of information from $y_o$ ($y_l$) is shifted to x. The markers in the $b_o$ and $a_o$ stages are shifted to the $a_n$ and $b_n$ stages cuasing a shift of the numbers in both of these registers. The number $b_o$ is now multiplied by the number $y_l$ and this product is added to $y_o$, $b_l$ which is now stored in the $a_0$ location. Specifically the product of $y_0$, $b_0$ has been transferred to the $y_n$ stage and the second product $y_0$, $b_1$ is located at the $a_0$ stage since the marker has been reinserted in the $a_n$ stage. Thus the first addition in the second cycle of the multiplication occurs. The operation of the system proceeds along this line until each number in register B has been multiplied by each number in the register Y. After all multiplications have been completed, a marker exists in X and in $a_0$ and $b_0$. This is a stop condition since the flip-flop 406 cannot flip due to the appearance of a 0 on the lead 419. The least significant digit of the product is stored in the $Y_0$ register and conventional techniques in accordance with the recent invention may be employed for removing the information from this register.

As previously indicated the circuit of FIGS. 29 and 30 may be employed as an adder as well as a multiplier. Specifically the input switches are set so that the first number is loaded in B preceded by the marker and the second number is loaded in A preceded by a marker. A "1" is inserted in the Y register so that each number in B is multiplied by a 1 effecting no change. The procedure is then the same as in multiplication. The markers are removed from $a_0$ and $b_0$ and put into $a_n$ and $b_n$. Since A is full the M signal does not proceed to the $a_0$ position and a 0 is not inserted in alpha. Thus after the first multiplication of the number if the B register by the 1 in the X register it, the product, is added to the $a_0$ number. This procedure continues and if the A register is made one unit longer, then the number which is to be added to the number in the B register, the sum can be stored in the A register so that upon completion of a single cycle the number of the A register is the sum of the two numbers preceded by an M. Also since an extra stage is provided for reinsertion of the sum, there is a stage provided for the carry number also in the A register. The number may then be read-out of the A register by conventional techniques. In addition, the switch 372 is set so that the transfer from $a_1$ to y is not effected. Also the B feedback may be left open if so desired. It may be closed if it is desired to add a series of numbers by the number in B.

It should be noted that if the number in the B register is longer than the number in the A register, M appears at $a_0$ before appearing at $b_0$. The gates 451 and 452 place a zero in alpha and $b_0 + 0 = b_0$. If the number in the A register is the larger, gates 456 and 457 perform the same function relative to the beta input to the adder and a zero is added to the number in $a_0$.

While I have described and illustrated several specific embodiments of my invention, it will be clear that variations of the details of construction which are specifically illustrated and described may be resorted to without departing from the true spirit and scope of the invention as defined in the appended claims.

What I claim is:

1. An asynchronous circuit comprising a storage section, an output gate section and a control section, said storage section having multistable gate means providing at least three stable states, at least two information states and a neutral state; said control section having a first stable state; a number of information output leads equal in number to the number of information states of said storage section; said gate section being disposed between said storage section and said output leads; said gate section being responsive to signals developed by said control section when in said first stable state to develop on said output leads, signals indicative of the state of said storage section; means for switching said control section to an unstable state; said gate section being responsive to signals developed by said control section when in said unstable state to cause said gate section to develop on said output leads signals indicative of the neutral state of said storage section; said storage section including means responsive to said unstable state of said control section to cause said storage section to assume its neutral state, means for causing said control section to assume a further stable state when said storage section assumes said neutral state, means for interfacing said circuit with an external circuit whereby said circuit may receive information in serial form, said means for interfacing comprising a gate section disposed between information leads of an external circuit and input leads to said storage section of said asynchronous circuit, and a control section corresponding to a control section of said asynchronous circuit, said control section having means responsive to a signal from the external circuit for generating a gate signal, said gate section being connected to be responsive to at least said gate signal to transfer information to said input leads of said asynchronous circuit.

2. An asynchronous circuit according to claim 1 further comprising means connected to said output leads for indicating when information is not being transferred to said circuit, said means for indicating including means for determining the time interval between transfers of information to said circuit and means for producing an indication when said time interval exceeds a predetermined maximum elapsed time.

3. An asynchronous circuit according to claim 1 wherein said means responsive to a signal is responsive only to said signal from the external circuit.

4. An asynchronous circuit according to claim 1 wherein said means responsive to a signal is further responsive to a signal from said control section of said asynchronous circuit and producing said gate signal only upon concurrence of both said signals.

5. An asynchronous circuit comprising a storage section, an output gate section and a control section, said storage section having multistable gate means providing at least three stable states, at least two information states and a neutral state; said control section having a first stable state; a number of information output leads equal in number to the number of information states of said storage section; said gate section being disposed between said storage section and said output leads; said gate section being responsive to signals developed by said control section when in said first stable state to develop on said output leads, signals indicative of the state of said storage section; means for switching said control section to an unstable state; said gate section being responsive to signals developed by said control section when in said unstable state to cause said gate section to develop on said output leads signals indicative of the neutral state of said storage section; said storage section including means responsive to said unstable state of said control section to cause said storage section to assume its neutral state, means for causing said control section to assume a further stable state when said storage section assumes said neutral state, means for interfacing said circuit with an external circuit whereby said circuit may transfer out information from said asynchronous circuit to an external circuit, said means for interfacing including a control section corresponding to a control section of said asynchronous circuit, said control section having an input lead responsive to a signal from an external circuit for generating a gate signal, said control circuit of said asynchronous circuit being responsive to said gate signal for opening said gate section of said asynchronous circuit and transferring information to the external circuit.

6. An asynchronous system for transmitting information in a forward direction comprising first and second asynchronous circuits each including a control section, a storage section, an output section, and an equal plurality of input leads and output leads, each said storage section having a plurality of gate means interconnected to provide a number of stable states equal to one more than said input leads, said stable states consisting of a neutral state and a plurality of information states, each said output section being disposed between said storage section and said output leads of its associated circuit, output leads of said first circuit being connected to input leads of said second circuit on a one-for-one basis; said control section of said first circuit developing a first stable state signal when said control section of said second circuit indicates said second circuit is in its neutral state, said gate section being responsive to said signal to develop on said output leads signals indicative of the state of said storage section, means responsive to transfer of an information state to said second circuit for switching said control section to an unstable state, said control section producing when in said unstable state a second signal, said output section developing signals on said output leads indicative of the neutral state of said storage section in response to receipt of said second signal, said storage section having means responsive to said second signal to switch said storage section to its neutral state, said control section being responsive to said storage section achieving the neutral state to switch said control section to a stable state, a circuit for applying information parallel concurrently to said storage sections of said circuits of said system, said circuit for applying information in parallel comprising for each asynchronous circuit, input gate means responsive to a first signal for generating a pair of output signals of first and second signal levels, and responsive to a second signal for generating a pair of output signals of second and first signal levels, respectively, said input gate means for each asynchronous circuit being responsive to a common gate signal to transfer said first and second signals to said storage sections of their respective asynchronous circuits.

7. An asynchronous system for transmitting information in a forward direction comprising first and second asynchronous circuits each including a control section, a storage section, an output section, and an equal plurality of input leads and output leads, each said storage section having a plurality of gate means interconnected to provide a number of stable states equal to one more than said input leads, said stable states consisting of a neutral state and a plurality of information states, each said output section being disposed between said storage section and said output leads of its associated circuit, output leads of said first circuit being connected to input leads of said second circuit on a one-for-one basis; said control section of said first circuit developing a first stable state signal when said control section of said section circuit indicates said second circuit is in its neutral state, said gate section being responsive to said signal to develop on said output leads signals indicative of the state of said storage section, means responsive to transfer of an information state to said second circuit for switching said control section to an unstable state, said control section producing when in said unstable state a second signal, said output section developing signals on said output leads indicative of the neutral state of said storage section in response to receipt of said second signal, said storage section having means responsive to said second signal to switch said storage section to its neutral state, said control section being responsive to said storage section achieving the neutral state to switch said control section to a stable state, means for extracting information in parallel concurrently from said asynchronous circuits, said means for extracting comprising means for sensing transfer of information between said asynchronous circuits, said means for sensing developing a gate signal when information is not transferred to one said asynchronous circuits for a predetermined length of time, output means connected to the output leads of each of said asynchronous circuits to sense the state of each said asynchronous circuit, and means responsive to said gate signal for causing said output means to transfer information to an external circuit in accordance with the state of each said asynchronous circuit.

8. An asynchronous circuit comprising a storage section, an output gate section and a control section, said storage section having multistable gate means providing at least three stable states, at least two information states and a neutral state; said control section having a first stable state; a number of information output leads equal in number to the number of information states of said storage section; said gate section being disposed between said storage section and said output leads; said gate section being responsive to signals developed by said control section when in said first stable state to develop on said output leads, signals indicative of the state of said storage section; means for switching said control section to an unstable state; said gate section being responsive to signals developed by said control section when in said unstable state to cause said gate section to develop on said output leads signals indicative of the neutral state of said storage section; said storage section including means responsive to said unstable state of said control section to cause said storage section to assume its neutral state, means for causing said control section to assume a further stable state when said storage section assumes said neutral state, means for interfacing said circuit with an external circuit whereby said circuit may receive information in serial form, said means for interfacing comprising a control section, means responsive to a gate signal for applying a signal to said control section, said control section generating a control signal in response to said gate signal and means responsive to said control signal for transferring information to said storage section.

9. An asynchonous circuit comprising a storage section, an output gate section and a control section, said storage section having multistable gate means providing at least three stable states, at least two information states and a neutral state; said control section having a first stable state; a number of information output leads equal in number to the number of information states of said storage section; said gate section being disposed between said storage section and said output leads; said gate section being responsive to signals developed by said control section when in said first stable state to develop on said output leads, signals indicative of the state of said storage section; means for switching said control section to an unstable state; said gate section being responsive to signals developed by said control section when in said unstable state to cause said gate section to develop on said output leads signals indicative of the neutral state of said storage section; said storage section including means responsive to said unstable state of said control section to cause said storage section to assume its neutral state, means for causing said control section to assume a further stable state when said storage section assumes said neutral state, means for sensing transfer of information to said asynchronous circuit, said means for sensing developing a signal upon occurrence of a predetermined event in transfer of information to said asynchronous circuit, and means responsive to said last mentioned signal to produce an indication of said predetermined event.

10. An asynchronous circuit according to claim 1 wherein said means for modifying is an autoasynchronous circuit including gate means, and wherein said gate means have a transmission delay time therethrough which together with delay times through said further circuit equals the information signal delay time through said asynchronous circuit.

11. An asynchronous circuit comprising a storage section, an output gate section and a control section, said storage section having multistable gate means providing at least three stable states, at least two information states and a neutral state; said control section having a first stable state; a number of information output leads equal in number to the number of information states of said storage section; said gate section being disposed between said storage section and said output leads; said gate section being responsive to signals developed by said control section when in said first stable state to develop on said output leads, signals indicative of the state of said storage section; means for switching said control section to an unstable state; said gate section being responsive to signals developed by said control section when in said unstable state to cause said gate section to develop on said output leads signals indicative of the neutral state of said storage section; said storage section including means responsive to said unstable state of said control section to cause said storage section to assume its neutral state, means for causing said control section to assume a further stable state when said storage section assumes said neutral state, a further circuit including a storage section and a control section both, means for modifying information in accordance with a predetermined function, means for applying modified information signals to said storage section of said further circuit for storage thereby, means for directly applying signals stored by said last mentioned storage section to said means for modifying, said means for modifying producing output signals indicative of the modified information signals, means responsive to said storage section of said asynchronous circuit being in said neutral state for transferring said output signals thereto, said storage section and said control section of said further circuit being inter-connected such that upon said storage section of said asynchronous circuit assuming an information state, said storage section of said further circuit is initially reset to its neutral state and thereafter may receive additional information signals.

12. An asynchronous circuit according to claim 11 wherein said means for modifying is an autosynchronous circuit.

* * * * *